(12) United States Patent
Tsukuda

(10) Patent No.: US 10,811,344 B2
(45) Date of Patent: Oct. 20, 2020

(54) ELECTRONIC DEVICE

(71) Applicant: RENESAS ELECTRONICS CORPORATION, Tokyo (JP)

(72) Inventor: Tatsuaki Tsukuda, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/378,197

(22) Filed: Apr. 8, 2019

(65) Prior Publication Data

US 2019/0333866 A1 Oct. 31, 2019

(30) Foreign Application Priority Data

Apr. 27, 2018 (JP) .................. 2018-086050

(51) Int. Cl.
| | |
|---|---|
| H01L 27/118 | (2006.01) |
| H01L 21/82 | (2006.01) |
| H01L 23/495 | (2006.01) |
| H01L 23/498 | (2006.01) |
| H01L 23/538 | (2006.01) |
| H01L 23/64 | (2006.01) |

(52) U.S. Cl.
CPC .... *H01L 23/49562* (2013.01); *H01L 23/4951* (2013.01); *H01L 23/4952* (2013.01); *H01L 23/49513* (2013.01); *H01L 23/49524* (2013.01); *H01L 23/49531* (2013.01); *H01L 23/49575* (2013.01); *H01L 23/49589* (2013.01); *H01L 23/49861* (2013.01); *H01L 23/5383* (2013.01); *H01L 23/642* (2013.01)

(58) Field of Classification Search
CPC ......... H01L 23/49589; H01L 23/49861; H01L 23/5383

USPC .......................................... 438/129; 257/206
See application file for complete search history.

(56) References Cited

U.S. PATENT DOCUMENTS

| | | | | |
|---|---|---|---|---|
| 7,692,285 B2* | 4/2010 | Sato | ...................... | H01L 23/485 |
| | | | | 257/691 |
| 8,062,932 B2* | 11/2011 | Hebert | .............. | H01L 23/49562 |
| | | | | 438/121 |
| 10,468,338 B2* | 11/2019 | Shimoyama | ........... | H05K 7/209 |

FOREIGN PATENT DOCUMENTS

| | | |
|---|---|---|
| JP | 2011-035222 A | 2/2011 |
| JP | 2015-153803 A | 8/2015 |

* cited by examiner

*Primary Examiner* — Calvin Lee
(74) *Attorney, Agent, or Firm* — McDermott & Will Emery LLP

(57) ABSTRACT

An electronic device includes a wiring board and a semiconductor device on the wiring board's main surface. The semiconductor device includes a semiconductor chip on a die pad sealed by a sealing body. A back surface of the die pad is directed to a main surface of the sealing body. A back surface of the sealing body faces the main surface of the wiring board. First and second electrodes are formed on the wiring board and in the sealing body, respectively. The second electrode is disposed in the back surface of the sealing body, and is bonded to a metal plate connecting a lead and a pad. A distance between the first and second electrodes is shorter than that between the metal plate and the first electrode. The first and second electrodes overlap each other in a plan view. A capacitor is composed of the first and second electrodes.

16 Claims, 27 Drawing Sheets

(1)

ELECTRONIC DEVICE

CROSS-REFERENCE TO RELATED APPLICATION

The present application claims priority from Japanese Patent Application No. 2018-086050 filed on Apr. 27, 2018, the content of which is hereby incorporated by reference into this application.

TECHNICAL FIELD OF THE INVENTION

The present invention relates to an electronic device (semiconductor module), and can be suitably used for, for example, an electronic device in which a semiconductor component is mounted on a wiring board.

BACKGROUND OF THE INVENTION

Heretofore, in an electronic device having, for example, an inverter circuit for driving a motor, noise is generated when a target electronic component operates. Moreover, the operation of the electronic component is sometimes affected by noise generated in the circuit located around the target electronic component and on the outside of the electronic device. Therefore, countermeasures against such noise have been proposed.

For example, Japanese Unexamined Patent Publication No. 2015-153803 (Patent Document 1) describes a semiconductor device in which a floating conductor is coupled through a capacitor to a ground conductor in order to suppress spreading of noise to other peripheral circuits.

Moreover, for example, Japanese Unexamined Patent Publication No. 2011-35222 (Patent Document 2) describes a printed wiring board (wiring board) in which an open stab wiring is connected to a power supply wiring in order to attenuate high-frequency noise of a resonance frequency at a high frequency.

SUMMARY OF THE INVENTION

In the electronic device having, for example, the inverter circuit for driving the motor, the inventor of the present invention has examined the suppression of unnecessary electromagnetic wave noise generated inside the electronic device and external noise that propagates from an outside and enters an inside of the electronic device. It is desired that reliability of the electronic device is enhanced by devising a configuration of the electronic device.

Other objects and novel features will be apparent from the description in the specification and the accompanying drawings.

An electronic device according to one embodiment includes a wiring board and a semiconductor device mounted on a main surface of the wiring board. In the semiconductor device, a first semiconductor chip mounted on a first chip mounting portion is sealed by a sealing body. A back surface of the first chip mounting portion is directed to a main surface of the sealing body, and a back surface of the sealing body faces the main surface of the wiring board. A conductor pattern is formed on the wiring board, and a first conductor member is formed inside the sealing body of the semiconductor device. The first conductor member is bonded to a first conductive connection member that connects a first pad of the first semiconductor chip and a first lead to each other. A distance between the first conductor member and the conductor pattern is shorter than a distance between the first conductive connection member and the conductor pattern. The first conductor member and the conductor pattern overlap each other in plan view, and a first capacitor is composed of the first conductor member and the conductor pattern.

According to one embodiment, the reliability of the electronic device can be enhanced.

BRIEF DESCRIPTIONS OF THE DRAWINGS

DESCRIPTIONS OF THE PREFERRED EMBODIMENTS

Figure 1:
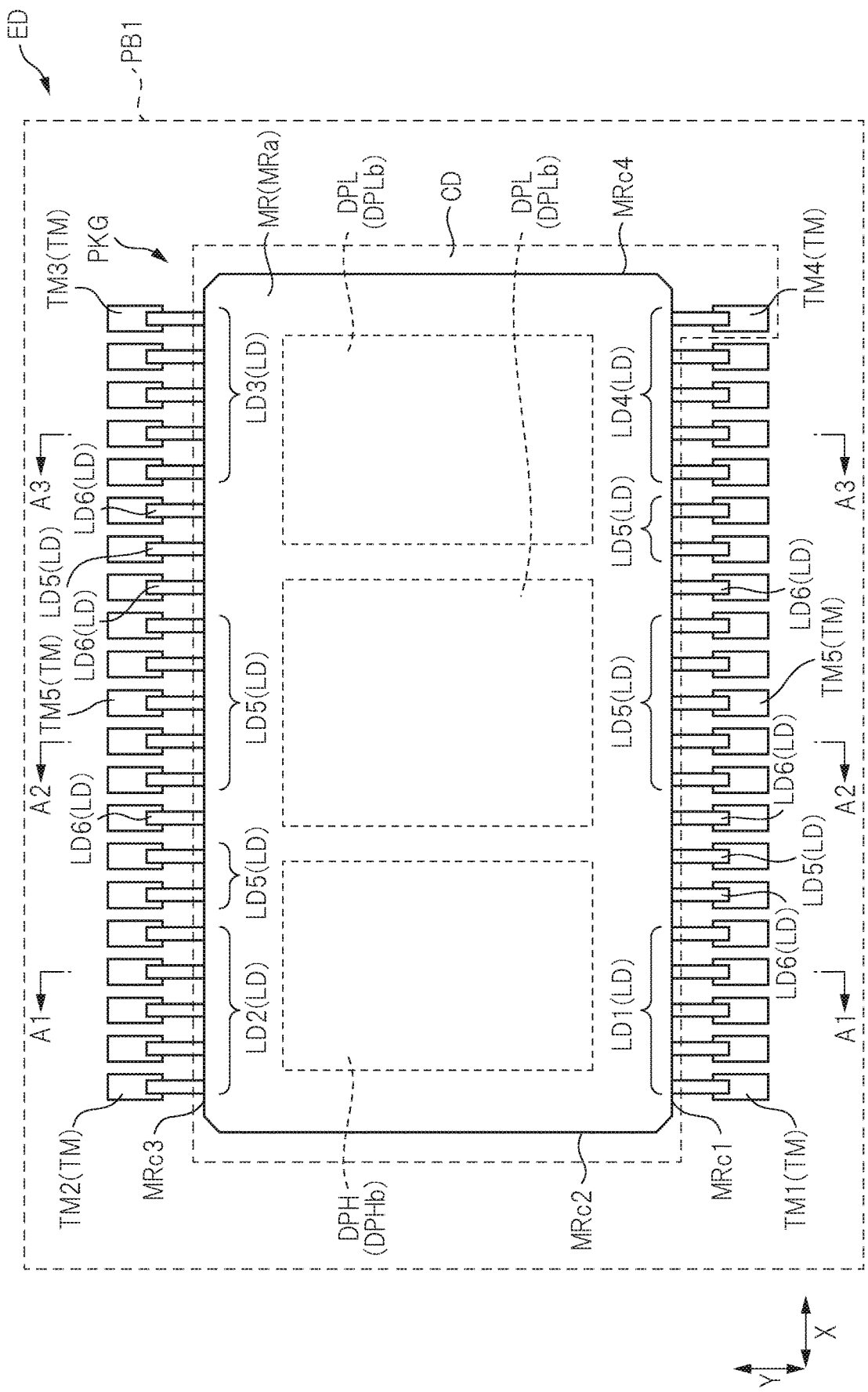
FIG. 1 is a plan view of an electronic device according to one embodiment.

In the following, the present invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see, and hatching is used even in a plan view so as to make the drawings easy to see.

Moreover, in the present application, a field effect transistor will be described as a MOSFET (Metal Oxide Semiconductor Field Effect Transistor) or simply as a MOS; however, a non-oxide film is not eliminated as a gate insulating film. Namely, when the MOSFET is mentioned in the present application, the MOSFET includes not only a MISFET (Metal Insulator Semiconductor Field Effect Transistor) using an oxide film (silicon oxide film) as the gate insulating film but also a MISFET using an insulating film other than the oxide film (silicon oxide film) as the gate insulating film.

First Embodiment

<Regarding Outline of Electronic Device>

Figure 2:
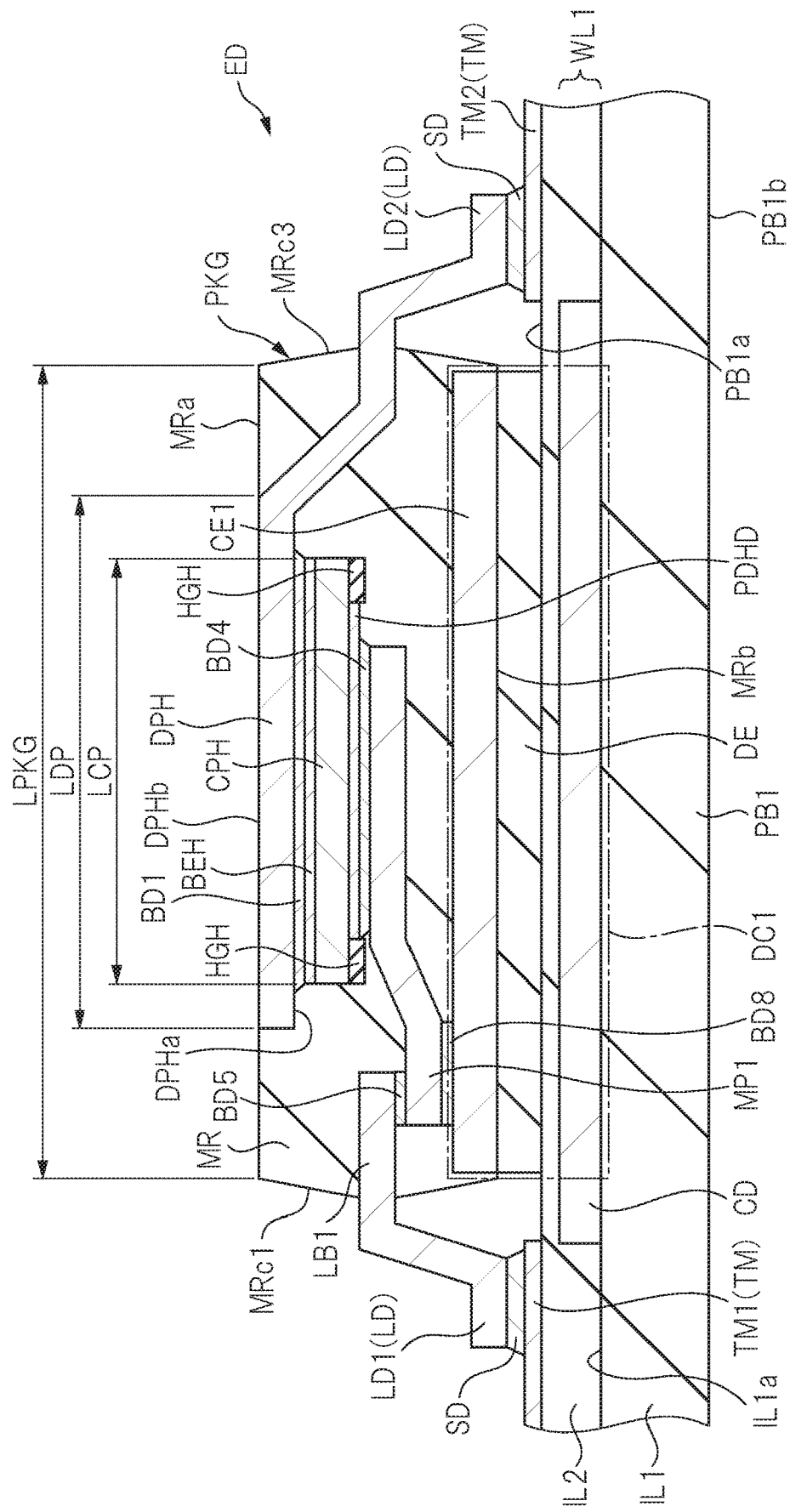
FIG. 2 is a cross-sectional view in which the electronic device according to the embodiment is cut at a position corresponding to a line A1-A1 of FIG. 1.
Figure 3:
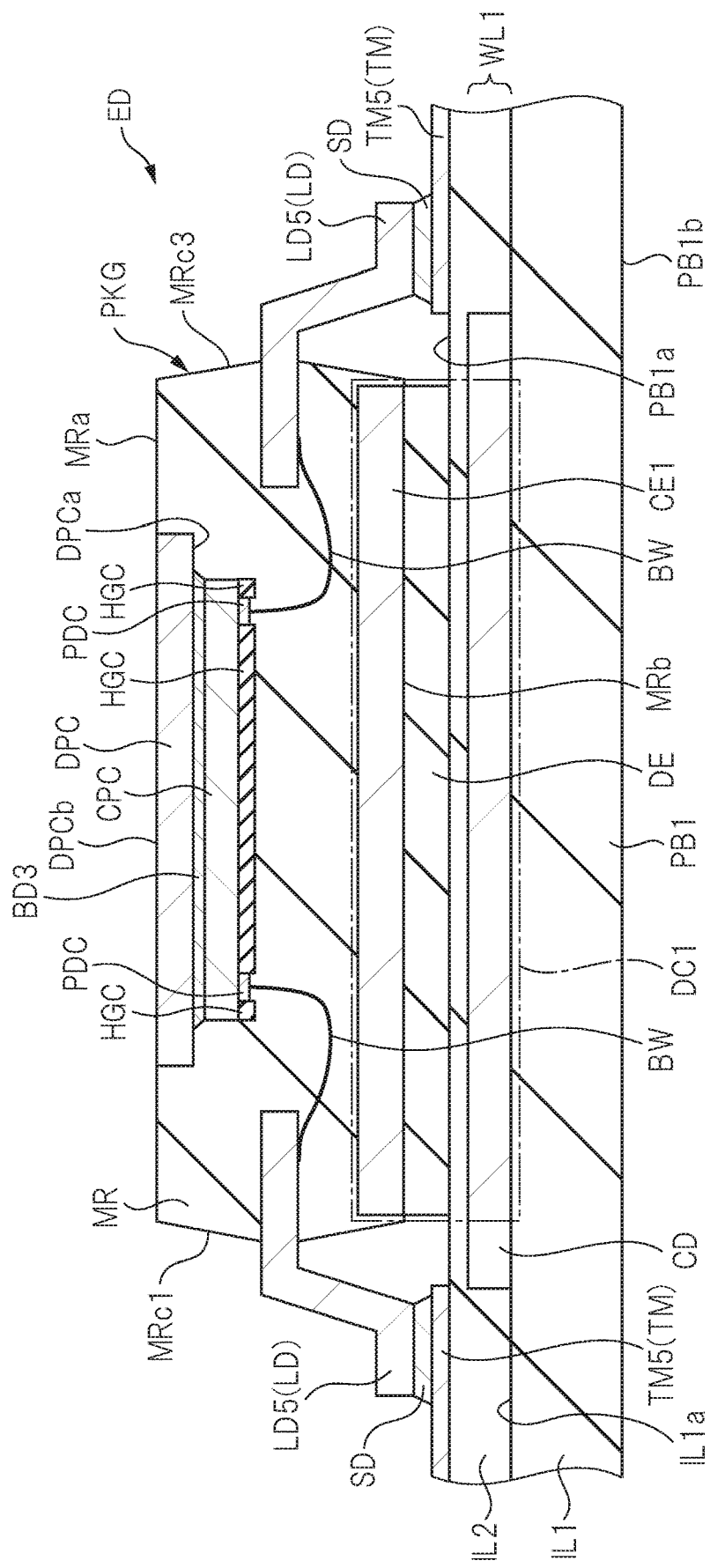
FIG. 3 is a cross-sectional view in which the electronic device according to the embodiment is cut at a position corresponding to a line A2-A2 of FIG. 1.
Figure 4:
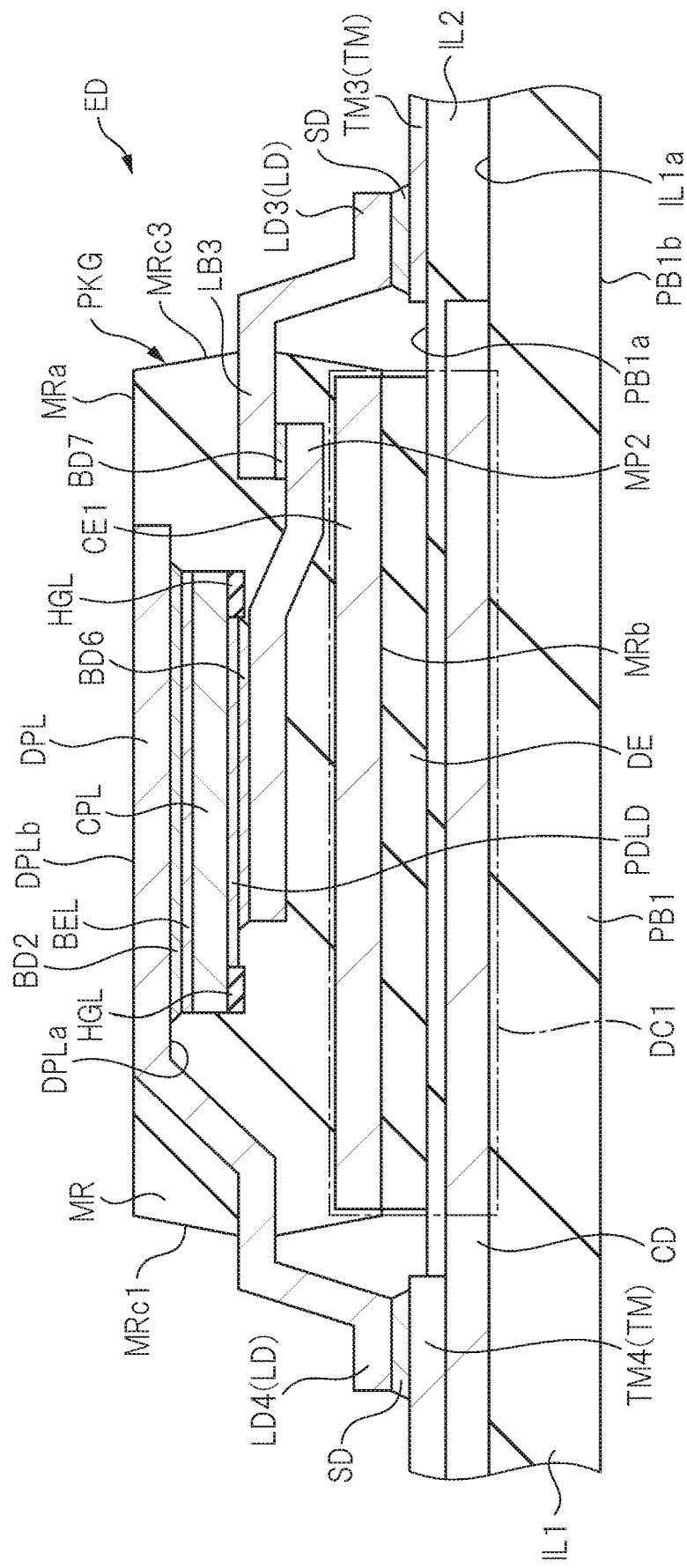
FIG. 4 is a cross-sectional view in which the electronic device according to the embodiment is cut at a position corresponding to a line A3-A3 of FIG. 1.
Figure 5:
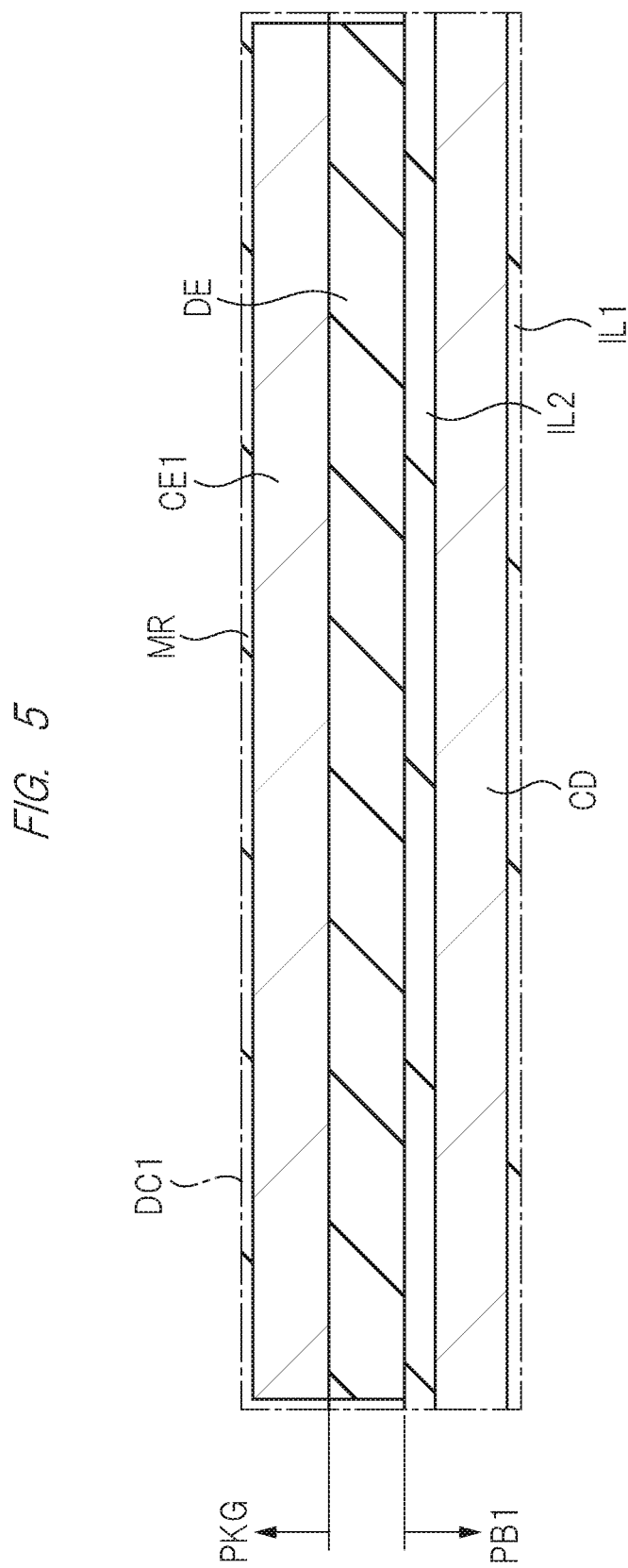
FIG. 5 is an enlarged cross-sectional view of a principal part of a capacitor according to the embodiment shown in FIG. 2 to FIG. 4.
Figure 6:
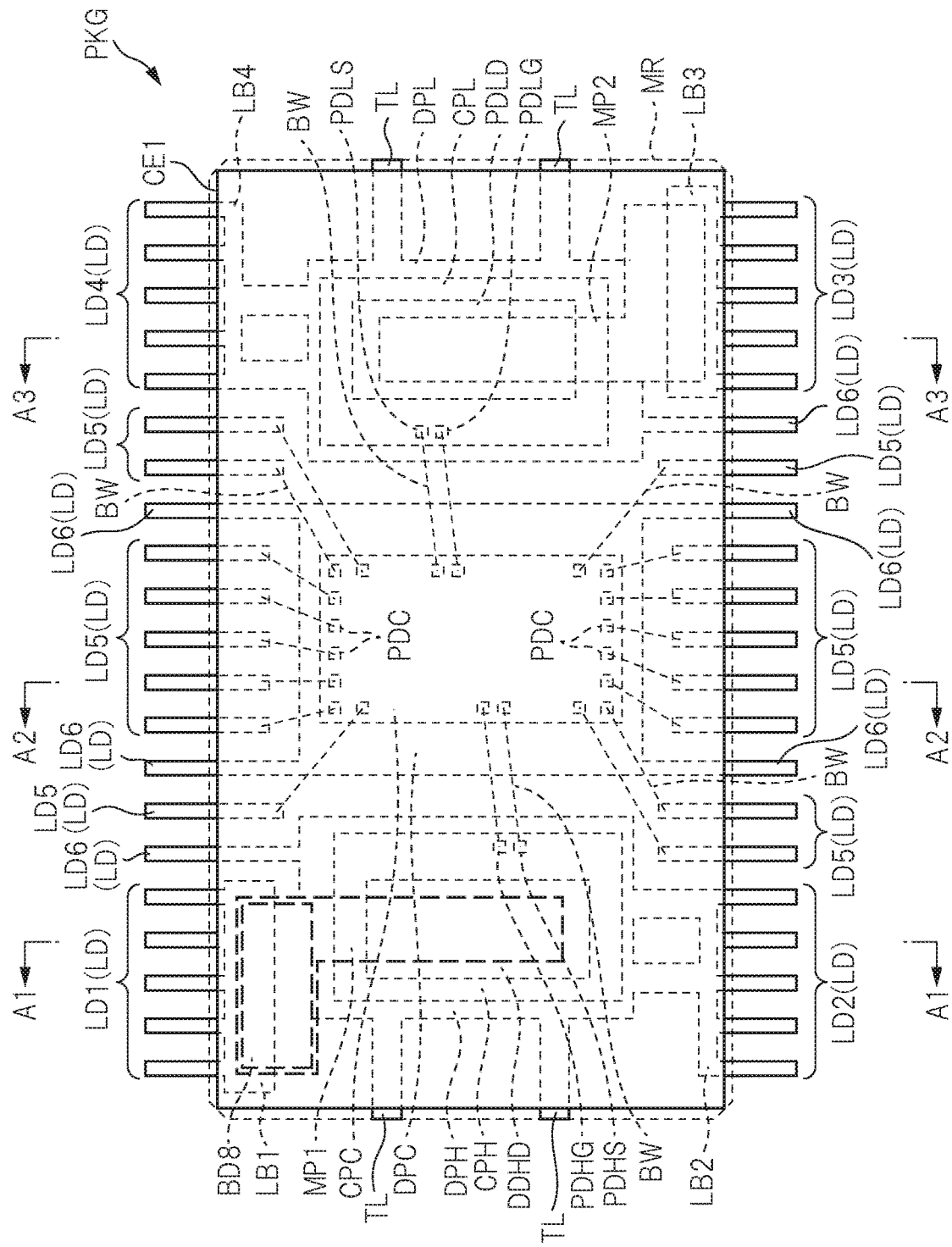
FIG. 6 is a plan perspective view in which a semiconductor device mounted on the electronic device according to the embodiment is viewed from a lower surface thereof.

FIG. 1 is a plan view showing an example of an electronic device ED in which a semiconductor device PKG according to a first embodiment is mounted on a wiring board PB1. FIG. 2 is a cross-sectional view in which the electronic device ED shown in FIG. 1 is cut at a position corresponding to a line A1-A1 of FIG. 1. FIG. 3 is a cross-sectional view in which the electronic device ED shown in FIG. 1 is cut at a position corresponding to a line A2-A2 of FIG. 1. FIG. 4 is a cross-sectional view in which the electronic device ED shown in FIG. 1 is cut at a position corresponding to a line A3-A3 of FIG. 1. FIG. 5 is an enlarged cross-sectional view of a principal part of a capacitor DC1 shown in FIG. 2 to FIG. 4. FIG. 6 is a plan perspective view in which the semiconductor device PKG is viewed from a lower surface thereof through a sealing body MR. Note that a character X shown in FIG. 1 indicates a first direction (hereinafter, referred to as an X direction) and a character Y indicates a second direction (hereinafter, referred to as a Y direction) perpendicular to the first direction. Namely, the X direction and the Y direction are directions perpendicular to each other.

As shown in FIG. 1, the electronic device ED according to the first embodiment is composed of a wiring board (mounting board, printed circuit board (PCB)) PB1 and a semiconductor device (semiconductor package) PKG mounted on the wiring board PB1. The electronic device ED in the first embodiment is used for, for example, a drive circuit of a three-phase brushless DC (BLDC) motor for use in an automobile and the like. An inverter circuit is included in this drive circuit.

Specifically, each phase of the three-phase BLDC motor (motor MOT shown in FIG. 7) is controlled by a SiP (System in Package) including a semiconductor chip that includes a power MOSFET that is a field effect transistor for a high-side switch, a semiconductor chip that includes a power MOSFET that is a field effect transistor for a low-side switch, and a semiconductor chip that controls these chips. This SiP corresponds to the semiconductor device PKG.

An inverter circuit (inverter circuit INV shown in FIG. 7) is formed of this semiconductor device PKG, and AC power supplied from the inverter circuit is supplied to a coil (coil CL shown in FIG. 7) of each phase of the three-phase BLDC motor. Therefore, the electronic device ED that controls the three-phase BLDC motor mounts the semiconductor device PKG on the wiring board PB1.

For example, in a case of controlling the three-phase BLDC motor, three inverter circuits INV are required. In this case, three semiconductor devices PKG which compose the inverter circuit INV are required, and the three semiconductor devices PKG are mounted on the common wiring board PB1. Moreover, in a case of controlling a six-phase BLDC motor, six semiconductor devices PKG are similarly mounted on the wiring board PB1. Hereinafter, for simplification, one semiconductor device PKG will be described as a representative example of a plurality of the semiconductor devices mounted on the wiring board PB1.

<Regarding Configuration of Semiconductor Device>

The semiconductor device PKG included in the electronic device ED according to the first embodiment shown in FIG. 1 will be described with reference to FIG. 1 to FIG. 4. The semiconductor device PKG is a semiconductor device of a resin-sealed semiconductor package type, and is a SOP (Small Outline Package) semiconductor device whose plane shape is substantially rectangular. Note that, as the semiconductor device PKG, a QFP (Quad Flat Package) whose plane shape is substantially square may be adopted.

The semiconductor device PKG shown in FIG. 1 to FIG. 4 includes die pads (chip mounting portions) DPC, DPH and DPL, semiconductor chips CPC, CPH and CPL mounted respectively on main surfaces of the die pads DPC, DPH and DPL, an electrode (first conductor member) CE1, metal plates MP1 and MP2, a plurality of wires (bonding wires) BW, a plurality of leads LD, and a sealing body MR that seals these.

The sealing body MR as a resin sealing body (resin sealing portion) is made of a resin material such as a thermosetting resin material, and may contain filler and the like. For example, the sealing body MR can be formed of an epoxy resin containing filler.

The sealing body MR has a main surface (upper surface) MRa, a back surface (lower surface, bottom surface) MRb opposite to the main surface MRa, and side surfaces MRc1, MRc2, MRc3 and MRc4 intersecting the main surface MRa and the back surface MRb. Specifically, an exterior appearance of the sealing body MR is a thin plate shape surrounded by the main surface MRa, the back surface MRb and the side surfaces MRc1, MRc2, MRc3 and MRc4. The side surfaces MRc1 and MRc3 are substantially parallel to the X direction, and the side surfaces MRc2 and MRc4 are substantially parallel to the Y direction. Moreover, each of the main surface MRa and the back surface MRb is a surface parallel to both of the X direction and the Y direction. For example, a plane shape of the sealing body MR, that is, plane shapes of the main surface MRa and back surface MRb of the sealing body MR are rectangular.

In each of the plurality of leads LD, a part thereof is sealed in the sealing body MR, and the other part thereof protrudes from the side surface of the sealing body MR to an outside of the sealing body MR. Hereinafter, a portion of the lead LD located inside the sealing body MR will be referred to as an inner lead portion, and a portion of the lead LD located outside the sealing body MR will be referred to as an outer lead portion.

Note that the semiconductor device PKG according to the first embodiment has a structure in which a part (outer lead portion) of each lead LD protrudes from the side surface of the sealing body MR, and a following description will be given on the basis of this structure. However, the structure of the semiconductor device PKG according to the first embodiment is not limited to this structure.

The plurality of leads LD are respectively provided on the side surface MRc1 and the side surface MRc3 of the sealing body MR. The outer lead portion of each lead LD is subjected to a bending process so that a lower surface near an end portion of the outer lead portion is substantially flush with the back surface MRb of the sealing body MR. The outer lead portion of each lead LD functions as a terminal portion for external connection (external terminal) of the semiconductor device PKG.

The die pad DPC is a chip mounting portion that mounts the semiconductor chip CPC thereon, the die pad DPH is a chip mounting portion that mounts the semiconductor chip CPH thereon, and the die pad DPL is a chip mounting portion that mounts the semiconductor chip CPL thereon. For example, a plane shape of each of the die pads DPC, DPH and DPL is a rectangle having sides parallel to the X direction and sides parallel to the Y direction.

The die pads DPC, DPH and DPL and the plurality of leads LD are composed of a conductor, and are preferably made of a metal material such as copper (Cu) or a copper alloy.

The die pad DPC has a main surface DPCa on which the semiconductor chip CPC is mounted and a back surface DPCb opposite thereto. Moreover, the die pad DPH has a main surface DPHa on which the semiconductor chip CPH is mounted and a back surface DPHb opposite thereto. Furthermore, the die pad DPL has a main surface DPLa on which the semiconductor chip CPL is mounted and a back surface DPLb opposite thereto. Note that, in the semiconductor device PKG, the back surfaces DPCb, DPHb and DPLb of the die pads DPC, DPH and DPL are exposed from the main surface MRa of the sealing body MR. Namely, the main surfaces DPCa, DPHa and DPLa of the die pads DPC, DPH and DPL are disposed so as to be directed to the back surface MRb of the sealing body MR.

Each of the semiconductor chips CPC, CPH and CPL has a front surface (front surface of the semiconductor chip) and a back surface (back surface of the semiconductor chip) which are main surfaces located opposite to each other. Namely, each of the semiconductor chips CPC, CPH and CPL has the front surface (front surface of the semiconductor chip) that is one main surface and the back surface (back surface of the semiconductor chip) that is the other main surface opposite thereto.

In the semiconductor chips CPC, CPH and CPL, uppermost layer protective films HGC, HGH and HGL are composed of insulating films, and are formed on uppermost layers (outermost layers) of the semiconductor chips. In the semiconductor chips CPC, CPH and CPL, the uppermost layer protective films HGC, HGH and HGL have openings which expose bonding pads, and the bonding pads are exposed from the openings of the uppermost layer protective films HGC, HGH and HGL.

On the main surface DPHa of the die pad DPH, the semiconductor chip CPH is mounted in a state of directing the back surface thereof to the die pad DPH. The semiconductor chip CPH is mounted on the main surface DPHa of the die pad DPH with a conductive adhesive layer BD1 interposed therebetween. A back electrode (electrode) BEH is formed on the back surface (entire back surface) of the semiconductor chip CPH, and this back electrode BEH is bonded and electrically connected to the die pad DPH with the conductive adhesive layer BD1 interposed therebetween.

Moreover, on the main surface DPLa of the die pad DPL, the semiconductor chip CPL is mounted in a state of directing the back surface thereof to the die pad DPL. The semiconductor chip CPL is mounted on the main surface DPLa of the die pad DPL with a conductive adhesive layer BD2 interposed therebetween. A back electrode (electrode) BEL is formed on the back surface (entire back surface) of the semiconductor chip CPL, and this back electrode BEL is bonded and electrically connected to the die pad DPL with the conductive adhesive layer BD2 interposed therebetween.

The adhesive layers BD1 and BD2 are made of a conductive bonding material (adhesive), and for example, a paste-type conductive adhesive material such as silver paste, solder or the like can be used.

Moreover, on the main surface DPCa of the die pad DPC, the semiconductor chip CPC is mounted in a state of directing the back surface thereof to the die pad DPC. The semiconductor chip CPC is mounted on the main surface DPCa of the die pad DPC with an adhesive layer BD3 interposed therebetween, and this adhesive layer BD3 may be conductive or insulative.

Note that, as mentioned above, the main surfaces DPCa, DPHa and DPLa of the die pads DPC, DPH and DPL are disposed so as to be directed to the back surface MRb of the sealing body MR. Therefore, the front surfaces of the semiconductor chips CPC, CPH and CPL are disposed so as to be directed to the back surface MRb of the sealing body MR.

For example, a plane shape of each of the semiconductor chips CPC, CPH and CPL is rectangular. A plane dimension (plane area) of the die pad DPH is larger than a plane dimension of the semiconductor chip CPH, a plane dimension of the die pad DPL is larger than a plane dimension of the semiconductor chip CPL, and a plane dimension of the die pad DPC is larger than a plane dimension of the semiconductor chip CPC. The semiconductor chips CPC, CPH and CPL are sealed inside the sealing body MR, and are not exposed from the sealing body MR.

The back electrode BEH of the semiconductor chip CPH is electrically connected to a source S1 (see FIG. 7) of a power MOSFET 1 formed inside the semiconductor chip CPH. Namely, the back electrode BEH of the semiconductor chip CPH corresponds to a source electrode of the power MOSFET 1. Moreover, the back electrode BEL of the semiconductor chip CPL is electrically connected to a source S2 (see FIG. 7) of a power MOSFET 2 formed inside the semiconductor chip CPL. Namely, the back electrode BEL of the semiconductor chip CPL corresponds to a source electrode of the power MOSFET 2.

On the front surface (main surface opposite to the surface on which the back electrode BEH is formed) of the semiconductor chip CPH, a gate bonding pad PDHG, a drain bonding pad PDHD and other bonding pad PDHS are exposed from the uppermost layer protective film HGH that composes the semiconductor chip CPH. Moreover, on the front surface (main surface opposite to the surface on which the back electrode BEL is formed) of the semiconductor chip CPL, a gate bonding pad PDLG, a drain bonding pad PDLD and other bonding pad PDLS are exposed from the uppermost layer protective film HGL that composes the semiconductor chip CPL. Furthermore, on the front surface (main surface opposite to the back surface) of the semiconductor chip CPC, a plurality of bonding pads PDC are exposed from the uppermost layer protective film HGC that composes the semiconductor chip CPC. Note that, hereinafter, "bonding pad", "bonding pad electrode", "pad electrode" and "electrode" will be simply referred to as "pad."

The pads PDC of the semiconductor chip CPC are electrically connected to the above-described control circuit CLC, which is formed inside the semiconductor chip CPC, through internal wirings of the semiconductor chip CPC.

The gate pad PDHG of the semiconductor chip CPH is electrically connected to a gate electrode (see FIG. 7) of the power MOSFET 1 formed inside the semiconductor chip CPH. Moreover, the drain pad PDHD of the semiconductor chip CPH is electrically connected to a drain D1 (see FIG. 7) of the power MOSFET 1 formed inside the semiconductor chip CPH.

Note that the pad PDHS of the semiconductor chip CPH is a pad other than the gate pad of the semiconductor chip CPH described above, and can be used as, for example, a source pad of a sense MOSFET for current sensing or an anode or cathode pad of a diode for temperature sensing.

In the semiconductor chip CPH, a plane dimension (area) of the drain pad PDHD is larger than a plane dimension of each of the other pads PDHG and PDHS.

Moreover, the gate pad PDLG of the semiconductor chip CPL is electrically connected to a gate electrode (see FIG. 7) of the power MOSFET 2 formed inside the semiconductor chip CPL. Furthermore, the drain pad PDLD of the semiconductor chip CPL is electrically connected to a drain D2 (see FIG. 7) of the power MOSFET 2 formed inside the semiconductor chip CPL.

Note that the pad PDLS of the semiconductor chip CPL is a pad other than the gate pad of the semiconductor chip CPL described above, and can be used as, for example, a source pad of a sense MOSFET for current sensing or an anode or cathode pad of a diode for temperature sensing.

In the semiconductor chip CPL, a plane dimension (area) of the drain pad PDLD is larger than a plane dimension of each of the other pads PDLG and PDLS.

Note that, on a semiconductor substrate that composes the semiconductor chip CPH, a plurality of unit transistor cells which compose the power MOSFET 1 are formed, and the power MOSFET 1 is formed in such a manner that the plurality of unit transistor cells are connected in parallel. Moreover, on a semiconductor substrate that composes the semiconductor chip CPL, a plurality of unit transistor cells which compose the power MOSFET 2 are formed, and the power MOSFET 2 is formed in such a manner that the plurality of unit transistor cells are connected in parallel. Each of the unit transistor cells is composed of, for example, a LDMOSFET (Laterally Diffused Metal-Oxide-Semiconductor Field Effect Transistor or LDMOSFET).

Namely, drain regions of the plurality of unit transistor cells for the power MOSFET 1, which are formed on the front surface of the semiconductor substrate that composes the semiconductor chip CPH, are electrically connected to a common drain electrode that composes the semiconductor chip CPH and is formed on an interlayer insulating film on the semiconductor substrate. Further, the drain electrode is exposed from the opening of the uppermost layer protective film HGH that composes the semiconductor chip CPH, whereby the drain pad PDHD is formed. The semiconductor chip CPL is similar to the semiconductor chip CPH. Namely, drain regions of a plurality of unit transistor cells for the power MOSFET 2 are electrically connected to a common drain electrode that composes the semiconductor chip CPL, and the drain electrode is exposed from the opening of the uppermost layer protective film HGL that composes the semiconductor chip CPL, whereby the drain pad PDLD is formed.

Moreover, source regions of the plurality of unit transistor cells for the power MOSFET 1, which are formed on the front surface of the semiconductor substrate that composes the semiconductor chip CPH, are electrically connected to the back electrode BEH formed on the entire back surface of the semiconductor substrate. The semiconductor chip CPL is similar to the semiconductor chip CPH. Namely, source regions of the plurality of unit transistor cells for the power MOSFET 2 are electrically connected to the back electrode BEL formed on the entire back surface of the semiconductor substrate. Although a case where each unit transistor cell is composed of the LDMOS has been described as an example, the unit transistor cell is not limited to this and may be a trench gate-type MISFET or the like.

Then, each of the pads PDHG and PDHS of the semiconductor chip CPH other than the drain pad PDHD is electrically connected to the pad PDC of the semiconductor chip CPC through the wire BW. Each of the pads PDHG and PDHS of the semiconductor chip CPH is electrically connected to the pad PDC of the semiconductor chip CPC through the wire BW, and is further electrically connected to the above-described control circuit CLC in the semiconductor chip CPC through the internal wiring of the semiconductor chip CPC.

Moreover, on the front surface of the semiconductor chip CPL, the pads (here, pads PDLG and PDLS) other than the drain pad PDLD are disposed (arrayed) along a side L1 facing the semiconductor chip CPC. Further, each of the pads PDLG and PDLS of the semiconductor chip CPL other than the drain pad PDLD is electrically connected to the pad PDC of the semiconductor chip CPC through the wire BW. Namely, one end of the wire BW is connected to each of the pads PDLG and PDLS, and the other end of the wire BW is connected to the pad PDC of the semiconductor chip CPC. Each of the pads PDLG and PDLS of the semiconductor chip CPL is electrically connected to the pad PDC of the semiconductor chip CPC through the wire BW, and is further electrically connected to the above-described control circuit CLC in the semiconductor chip CPC through the internal wiring of the semiconductor chip CPC.

Each of the wires (bonding wires) BW is a conductive connection member, and more specifically, is a conductive wire. Since the wire BW is made of metal, the wire BW can be regarded also as a metal wire (thin metal wire). As the wire BW, a gold (Au) wire, a copper (Cu) wire, an aluminum (Al) wire or the like can be suitably used. The wire BW is sealed in the sealing body MR, and is not exposed from the sealing body MR. In each of the leads LD, a connection portion for the wire BW is the inner lead portion located inside the sealing body MR.

The drain pad PDHD (that is, drain of the power MOSFET 1) of the semiconductor chip CPH is electrically connected to a lead coupling portion (lead wiring portion) LB1 through a metal plate MP1. Namely, the metal plate MP1 is bonded to the drain pad PDHD of the semiconductor chip CPH with a conductive adhesive layer (bonding material) BD4 interposed therebetween, and is further bonded to the lead coupling portion LB1 with a conductive adhesive layer (bonding material) BD5 interposed therebetween.

The drain pad PDLD (that is, drain of the power MOSFET 2) of the semiconductor chip CPL is electrically connected to a lead coupling portion (lead wiring portion) LB3 through a metal plate MP2. Namely, the metal plate MP2 is bonded to the drain pad PDLD of the semiconductor chip CPL with a conductive adhesive layer (bonding material) BD6 interposed therebetween, and is further bonded to the lead coupling portion LB3 with a conductive adhesive layer (bonding material) BD7 interposed therebetween.

Since the metal plate MP1 instead of wire is used for electrically connecting the drain pad PDHD of the semiconductor chip CPH and the lead LD1 to each other, an on-resistance of the power MOSFET 1 can be reduced. Moreover, since the metal plate MP2 instead of wire is used for electrically connecting the drain pad PDLD of the semiconductor chip CPL and the lead LD3 to each other, an on-resistance of the power MOSFET 2 can be reduced. In this way, a package resistance can be reduced, and a conduction loss can be reduced.

Moreover, an electrode CE1 that composes a capacitor DC1 to be described later is disposed inside the sealing body MR of the semiconductor device PKG, and is connected to the metal plate MP1 with an adhesive layer BD8 interposed therebetween. The electrode CE1 is a conductor plate made of a conductor, and is preferably formed of highly conductive metal (metal material) such as copper (Cu), a copper (Cu) alloy, aluminum (Al) and an aluminum (Al) alloy.

A plane shape of the electrode CE1 is, for example, rectangular. In plan view, an area of the electrode CE1 is larger than an area of the metal plate MP1, but preferably is substantially equal to an area of the sealing body MR, and is, for example, 85 mm$^2$. Moreover, a thickness of the electrode CE1 is, for example, 50 µm. When the thickness of each of the electrode CE1 and the electrode CD is increased too much, a parasitic resistance and a parasitic inductance which are derived from the electrode CE1 and the electrode CD are increased in the capacitor DC1. Therefore, the thickness of each of the electrode CE1 and the electrode CD is preferably 100 µm or less, more preferably 50 µm or less.

Note that, in a state where the semiconductor device PKG is mounted on the wiring board PB1, a distance between the electrode CE1 and the electrode CD is shorter than a distance between the metal plate MP1 and the electrode CD (the electrode CE1 is closer to the electrode CD than the metal plate MP1 is). Namely, the electrode CE1 is disposed inside the sealing body MR of the semiconductor device PKG, and the electrode CE1 is preferably located close to the back surface MRb of the sealing body MR, and the distance thereof to the electrode CD of the wiring board PB1 is set as short as possible. Note that the electrode CE1 may have a portion that protrudes to the outside of the sealing body MR of the semiconductor device PKG. Particularly, the electrode CE1 may be exposed from the back surface MRb of the sealing body MR.

The adhesive layers BD4, BD5, BD6 and BD7 are made of a conductive bonding material (adhesive), and for example, a paste-type conductive adhesive material such as silver paste, solder or the like can be used. Moreover, the metal plates MP1 and MP2 may be directly bonded (connected) by press bonding or the like to the drain pads PDHD and PDLD of the semiconductor chips CPH and CPL and to the lead coupling portions LB1 and LB3 without using the conductive adhesive layers (bonding materials) BD4, BD5, BD6 and BD7.

The metal plates MP1 and MP2 are conductor plates made of a conductor, and are preferably formed of highly conductive metal (metal material) such as copper (Cu), a copper (Cu) alloy, aluminum (Al) and an aluminum (Al) alloy. Dimensions (widths) of each of the metal plates MP1 and MP2 in the X direction and the Y direction are respectively larger than a width of the leads LD and a diameter of the wires BW.

Among the plurality of pads PDC of the semiconductor chip CPC, the pads PDC which are not connected to the pad of the semiconductor chip CPH or the pad of the semiconductor chip CPL are electrically connected through the wires BW to leads LD5 among the plurality of leads LD of the semiconductor device PKG. The leads LD5 can function as signal transmission paths between the semiconductor chip CPC in the semiconductor device PKG and a control circuit CT (see FIG. 7) provided outside the semiconductor device PKG.

A plurality of the leads LD1 among the plurality of leads LD in the semiconductor device PKG are integrally connected (coupled) to the lead coupling portion LB1. Namely, the lead coupling portion LB1 and the plurality of leads LD1 are formed integrally with each other. The plurality of leads LD1 and the lead coupling portion LB1 are electrically connected through the metal plate MP1 and the like to the drain of the power MOSFET 1 formed inside the semiconductor chip CPH. Therefore, the plurality of leads LD1 are leads for the drain of the high-side power MOSFET 1, and correspond to a terminal TE1 shown in FIG. 7.

Moreover, a plurality of the leads LD3 among the plurality of leads LD in the semiconductor device PKG are integrally connected (coupled) to the lead coupling portion LB3. Namely, the lead coupling portion LB3 and the plurality of leads LD3 are formed integrally with each other. The plurality of leads LD3 and the lead coupling portion LB3 are electrically connected through the metal plate MP2 and the like to the drain of the power MOSFET 2 formed inside the semiconductor chip CPL. Therefore, the plurality of leads LD3 are leads for the drain of the low-side power MOSFET 2, and correspond to a terminal TE3 shown in FIG. 7.

A plurality of leads LD2 among the plurality of leads LD in the semiconductor device PKG are formed integrally with the die pad DPH. Therefore, the plurality of leads LD2 are electrically connected to the die pad DPH, and are electrically connected through the die pad DPH and the conductive adhesive layer BD1 to the back electrode BEH of the semiconductor chip CPH. Therefore, the plurality of leads LD2 are leads for the source of the high-side power MOSFET 1, and correspond to a terminal TE2 shown in FIG. 7.

Moreover, a plurality of leads LD4 among the plurality of leads LD in the semiconductor device PKG are formed integrally with the die pad DPL. Therefore, the plurality of leads LD4 are electrically connected to the die pad DPL, and are electrically connected through the die pad DPL and the conductive adhesive layer BD2 to the back electrode BEL of the semiconductor chip CPL.

Moreover, a plurality of leads LD6 are integrally coupled to the die pads DPH, DPC and DPL. Further, suspension leads TL are integrally coupled to the die pads DPH and DPL. The leads LD6 and the suspension leads TL are used for supporting the die pads DPH, DPC and DPL on a framework of a lead frame at the time of manufacturing the semiconductor device PKG.

<Regarding Configuration of Wiring Board>

The wiring board PB1 included in the electronic device ED according to the first embodiment shown in FIG. 1 will be described with reference to FIG. 2 to FIG. 4. As shown in FIG. 2 to FIG. 4, the wiring board PB1 according to the first embodiment has a main surface (upper surface) PB1*a*, a back surface PB1*b* opposite to the main surface PB1*a*, and a wiring layer WL1 disposed between the main surface PB1*a* and the back surface PB1*b*. Note that, as shown in FIG. 2 to FIG. 4, the semiconductor device PKG and other elements (not shown) are mounted on the main surface PB1*a* of the wiring board PB1.

The wiring board PB1 includes an insulating layer IL1. The wiring layer WL1 is formed on an upper surface IL1*a* of the insulating layer IL1. An electrode (conductive film, conductor pattern) CD that composes the capacitor DC1 to be described later is formed in the wiring layer WL1. The electrode CD is made of a conductor, and is preferably formed of highly conductive metal (metal material) such as copper (Cu), a copper (Cu) alloy, aluminum (Al) and an aluminum (Al) alloy. For example, a plane shape of the electrode CD is rectangular. In plan view, an area of the electrode CD is preferably larger than an area of the electrode CE1.

Here, a ground potential GND is supplied to the electrode CD. Note that the electrode CD itself may be a ground pattern for supplying the ground potential. Alternatively, though not shown, a conductor pattern for supplying the ground potential to the semiconductor device PKG may be provided in a wiring layer other than the wiring layer WL1 so that the ground potential may be supplied to the electrode CD through a via and the like.

Moreover, though not shown, a power supply pattern for supplying a power supply potential to the semiconductor device PKG is formed in a region that does not overlap the electrode CD in plan view. Note that, though not shown, this power supply pattern may be provided in a wiring layer other than the wiring layer WL1.

A thickness of the wiring board PB1 is, for example, 1.6 mm. A film thickness of the electrode CD is, for example, 50 μm. Moreover, it is preferable that the area of the electrode CD is larger than the area of the electrode CE1 in the semiconductor device PKG to be described later in plan view, and is, for example, 100 mm².

Moreover, on the upper surface IL1*a* of the insulating layer IL1, an insulating layer (resist layer) IL2 is formed so as to cover the electrode CD. The insulating layer IL2 is solder resist made of epoxy-based or polyimide-based thermosetting resin. A film thickness of the insulating layer IL2 is, for example, 20 μm.

Moreover, a plurality of terminals TM are formed on the main surface PB1*a* of the wiring board PB1. The plurality of terminals TM include a terminal TM1 to which the above-described potential (power supply potential) VIN is supplied through a wiring and the like of the wiring board PB1 and a terminal TM4 to which the ground potential GND is supplied through the wiring and the like of the wiring board PB1. Moreover, the plurality of terminals TM in the wiring board PB1 also include a terminal TM5 electrically connected to the control circuit CT (see FIG. 7) through the wiring and the like of the wiring board PB1 and terminals TM2 and TM3 connected to the motor MOT (coils CL) (see FIG. 7) through the wiring and the like of the wiring board PB1. The respective terminals TM of the wiring board PB1 are electrically connected to the wiring of the wiring board PB1. Moreover, the terminal TM2 and terminal TM3 of the wiring board PB1 are electrically connected to each other through the wiring and the like of the wiring board PB1. The terminal TM4 of the wiring board PB1 is electrically connected to the electrode CD. It is preferable that the electrode CD and the terminal TM4 are formed integrally with each other, or are formed separately from each other and are in contact with each other.

Note that the respective terminals TM (terminals TM1, TM2, TM3, TM4 and TM5) may be formed in the wiring layer WL1 having the electrode CD formed therein. In this case, the respective terminals TM are formed on the upper surface IL1*a* of the insulating layer IL1, and the insulating layer IL2 is not formed on the respective terminals TM or the insulating layer IL2 on the respective terminals TM is removed, whereby the respective terminals TM are exposed from the main surface PB1*a* of the wiring board PB1.

Moreover, the case where the wiring board PB1 has the wiring layer WL1 has been described as an example; however, the wiring board PB1 is not limited to this. Namely, for example, a wiring board in which wiring layers (wirings) are formed on both main surfaces of a wiring substrate opposite to each other or a wiring board (so-called multilayer wiring board) in which wiring layers (wirings) are formed on both main surfaces of a wiring substrate and inside the wiring substrate may be used as the wiring board.

<Regarding Configuration of Electronic Device>

The electronic device ED according to the first embodiment shown in FIG. 1 will be described with reference to FIG. 2 to FIG. 4. As shown in FIG. 1 to FIG. 4, the semiconductor device PKG is mounted on the main surface (upper surface) PB1a of the wiring board PB1 so that the back surface MRb of the sealing body MR faces the main surface PB1a of the wiring board PB1.

Then, the plurality of leads LD of the semiconductor device PKG are bonded and fixed to the plurality of terminals (electrodes) TM, which are formed on the main surface PB1a of the wiring board PB1, with a conductive bonding material SD such as solder interposed therebetween. Namely, the plurality of leads LD of the semiconductor device PKG are electrically connected to the plurality of terminals TM, which are formed on the main surface PB1a of the wiring board PB1, via the conductive bonding material SD.

In this way, the power supply potential VIN is supplied to the leads LD1 (terminal TE1 in FIG. 7) of the semiconductor device PKG from the terminal TM1 of the wiring board PB1 through the wiring and the like of the wiring board PB1, and further, the potential VIN is supplied to the drain pad PDHD of the semiconductor chip CPH from the leads LD1 (lead coupling portion LB1) through the metal plate MP1. Moreover, the ground potential GND is supplied to the leads LD4 of the semiconductor device PKG from the terminal TM4 of the wiring board PB1 through the wiring and the like of the wiring board PB1, and further, the ground potential GND is supplied to the back electrode BEL of the semiconductor chip CPL in the semiconductor device PKG from the leads LD4 (terminal TE4 in FIG. 7) through the die pad DPL in the semiconductor device PKG.

The terminal TM2 and the terminal TM3 of the wiring board PB1 are electrically connected to each other through the wiring and the like of the wiring board PB1. Therefore, in a state where the semiconductor device PKG is mounted on the wiring board PB1, the lead LD2 and the lead LD3 of the semiconductor device PKG are electrically connected to each other through the terminals TM2 and TM3 and the wiring of the wiring board PB1, and are further electrically connected to, for example, the motor MOT (coil CL) (see FIG. 7) through the wiring and the like of the wiring board PB1.

Therefore, a current flowing in the semiconductor chip CPH flows from the drain D1 of the power MOSFET 1 to the source S1 thereof. Then, through the leads LD2, the wiring and the like of the wiring board PB1 and the leads LD3, this current flows from the drain D2 of the power MOSFET 2 formed in the semiconductor chip CPL to the source S2 thereof.

Moreover, the above-described control circuit CLC formed inside the semiconductor chip CPC in the semiconductor device PKG is configured to be able to exchange signals with the above-described control circuit CT through the pad PDC of the semiconductor chip CPC in the semiconductor device PKG, the wire BW in the semiconductor device PKG, the lead LD5 of the semiconductor device PKG, the terminal TM5 of the wiring board PB1, the wiring of the wiring board PB1, and the like.

Also, as shown in FIG. 2 to FIG. 4, by mounting the semiconductor device PKG on the wiring board PB1, the electrode CE1 in the semiconductor device PKG and the electrode CD in the wiring board PB1 face each other, so that the capacitor DC1 is configured.

Note that an insulating material (dielectric) DE is disposed between the electrode CE1 and the electrode CD, that is, between the main surface PB1a of the wiring board PB1 and the back surface MRb of the sealing body MR of the semiconductor device PKG. It is preferable that a material that composes the insulating material DE has a higher relative dielectric constant than a material that composes the insulating layer IL2 of the wiring board PB1. In a case where the insulating layer IL2 is made of epoxy-based resin, a relative dielectric constant of the epoxy-based resin is approximately 4.4. Therefore, it is preferable that the material that composes the insulating material DE is, for example, urethane-based resin whose relative dielectric constant is approximately 7.

Here, a method for forming the insulating material DE will be described. First, as shown in FIG. 1 to FIG. 4, the semiconductor device PKG is mounted on the main surface PB1a of the wiring board PB1 so that the back surface MRb of the sealing body MR faces the main surface PB1a of the wiring board PB1. At this time, the plurality of leads LD of the semiconductor device PKG are bonded and fixed to the plurality of terminals (electrodes) TM, which are formed on the main surface PB1a of the wiring board PB1, with the conductive bonding material SD such as solder interposed therebetween.

Next, as shown in FIG. 2 to FIG. 4, the material that composes the insulating material DE is injected between the back surface MRb of the sealing body MR and the main surface PB1a of the wiring board PB1, and is then cured. In this way, the insulating material DE can be formed between the main surface PB1a of the wiring board PB1 and the back surface MRb of the sealing body MR of the semiconductor device PKG.

Note that it is not always necessary to provide the insulating material DE between the main surface PB1a of the wiring board PB1 and the back surface MRb of the sealing body MR of the semiconductor device PKG. In a case where the insulating material DE is not provided, air is present between the main surface PB1a of the wiring board PB1 and the back surface MRb of the sealing body MR of the semiconductor device PKG, but since air is also a kind of the insulating material, it can be regarded that an air layer is present in place of the insulating material DE. The case where the insulating material DE is not provided is more advantageous than the case where the insulating material DE is provided from the viewpoint of the reduction in manufacturing cost. Meanwhile, in the case where the insulating material DE is provided, a capacitance of the capacitor DC1 composed of the electrode CE1 and the electrode CD can be increased. From this viewpoint, the case where the insulating material DE is provided is more advantageous than the case where the insulating material DE is not provided.

<Regarding Circuit Configuration>

Figure 7:
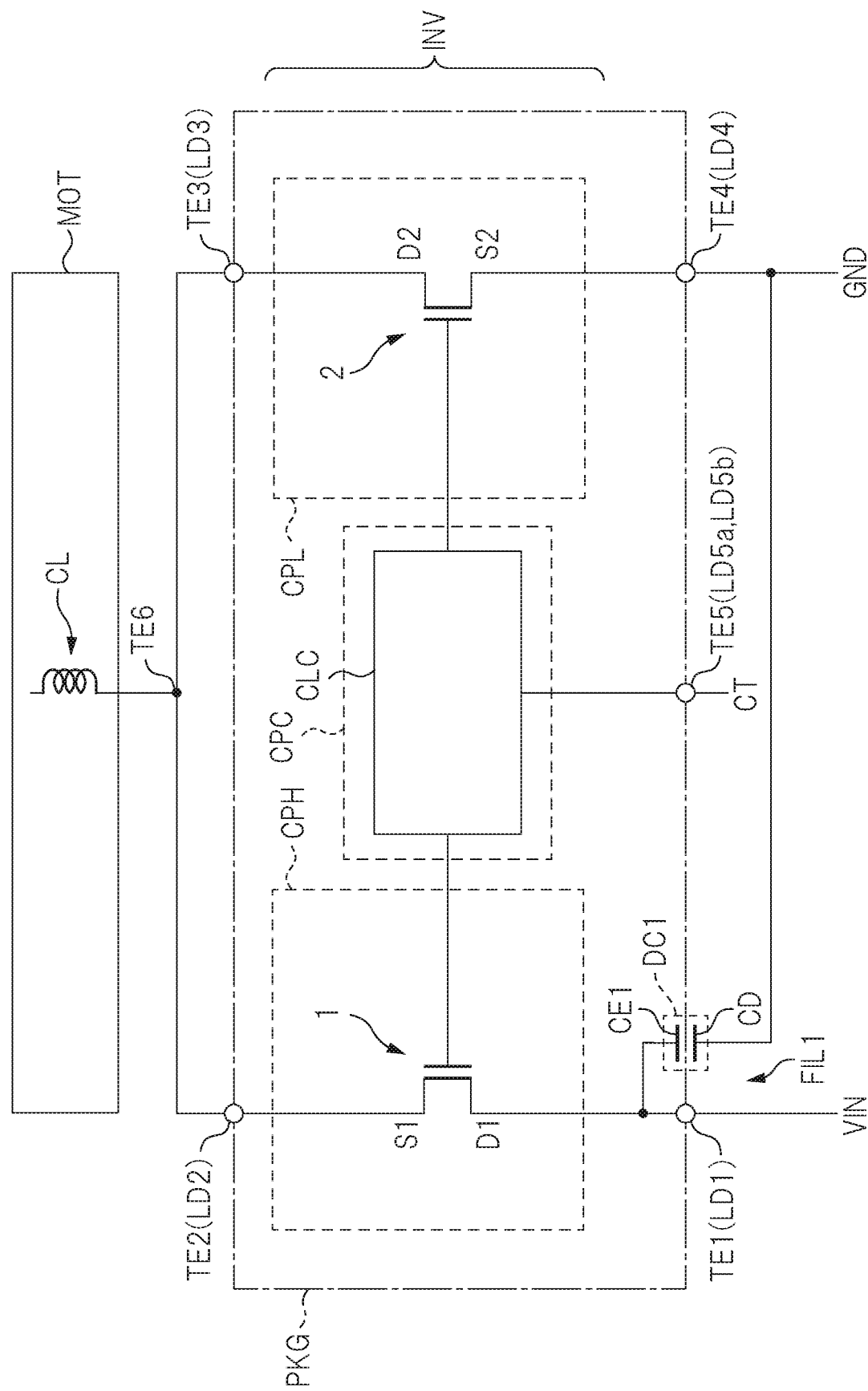
FIG. 7 is a circuit diagram showing an inverter circuit included in the electronic device according to the embodiment.
Figure 8:
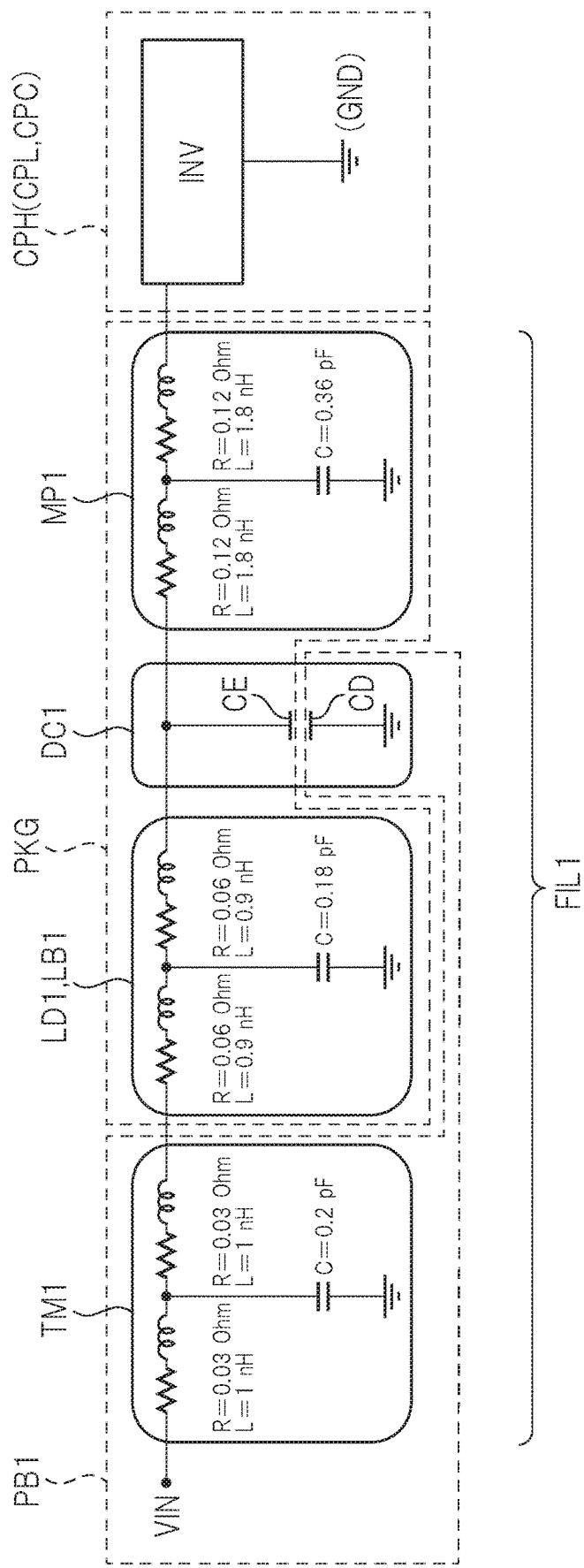
FIG. 8 is a circuit diagram showing a noise filter included in the electronic device according to the embodiment.

FIG. 7 is a circuit diagram showing an inverter circuit included in the electronic device according to the first embodiment. FIG. 8 is a circuit diagram showing a noise filter included in the electronic device according to the first embodiment. Note that, in FIG. 7, a portion surrounded by a dotted line assigned with a reference character CPH is formed in the semiconductor chip CPH, a portion surrounded by a dotted line assigned with a reference character CPL is formed in the semiconductor chip CPL, a portion surrounded by a dotted line assigned with a reference character CPC is formed in the semiconductor chip CPC, and a portion surrounded by a dot and dash line assigned with a reference character PKG is formed in the semiconductor device PKG.

FIG. 7 is a circuit diagram schematically showing a circuit (motor drive system) that controls the three-phase BLDC motor. The motor MOT that is the three-phase BLDC motor includes three coils CL, and each of the coils CL is connected to the inverter circuit INV. FIG. 7 shows a circuit composed of one coil CL and one inverter circuit INV connected to the coil CL as an example. The inverter circuit INV (more specifically, the control circuit CLC in the inverter circuit INV) is connected to the control circuit CT, and is controlled by the control circuit CT. The AC power from the inverter circuit INV is supplied to each coil CL connected to the inverter circuit INV, and the motor MOT is driven.

Moreover, a noise filter (low-pass filter) FIL1 is connected to the inverter circuit INV according to the first embodiment. The noise filter FIL1 includes the capacitor DC1. The capacitor DC1 is composed of the electrode CE1 and the electrode CD. Details of the noise filter FIL1 will be described later.

The semiconductor device PKG used for the inverter circuit INV shown in FIG. 7 includes the power MOSFETs 1 and 2 and the control circuit CLC. The control circuit CLC is formed in the semiconductor chip (controlling semiconductor chip) CPC, the power MOSFET 1 is formed in the semiconductor chip (high-side semiconductor chip, power chip) CPH, and the power MOSFET 2 is formed in the semiconductor chip (low-side semiconductor chip, power chip) CPL. Also, these three semiconductor chips CPC, CPH and CPL are sealed as the same single package, so that the semiconductor device PKG is formed.

Note that, though not shown, a sense MOSFET for sensing a current flowing through the power MOSFET 1 may be formed in the semiconductor chip CPH, and a sense MOSFET for sensing a current flowing through the power MOSFET 2 may be formed in the semiconductor chip CPL.

The control circuit CLC includes a high-side driver circuit that controls a potential of the gate of the power MOSFET 1 and a low-side driver circuit that controls a potential of the gate of the power MOSFET 2. The control circuit CLC is a circuit that controls operations of the power MOSFETs 1 and 2 by controlling the potentials of the gates of the power MOSFETs 1 and 2 in response to a signal and the like supplied to the control circuit CLC from the control circuit CT provided outside the semiconductor device PKG.

The gate of the power MOSFET 1 is connected to the high-side driver circuit of the control circuit CLC, and the gate of the power MOSFET 2 is connected to the low-side driver circuit of the control circuit CLC. The drain of the power MOSFET 1 is connected to the terminal TE1, the source of the power MOSFET 1 is connected to the terminal TE2, the drain of the power MOSFET 2 is connected to the terminal TE3, and the source of the power MOSFET 2 is connected to the terminal TE4. Namely, a source/drain path of the power MOSFET 1 is connected in series between the terminal TE1 and the terminal TE2, and a source/drain path of the power MOSFET 2 is connected in series between the terminal TE3 and the terminal TE4. In FIG. 7, a reference character D1 denotes the drain of the power MOSFET 1, a reference character S1 denotes the source of the power MOSFET 1, a reference character D2 denotes the drain of the power MOSFET 2, and a reference character S2 denotes the source of the power MOSFET 2. The control circuit CLC is connected to a terminal TE5, and this terminal TE5 is connected to the above-described control circuit CT provided outside the semiconductor device PKG.

The source of the power MOSFET 1 and the drain of the power MOSFET 2 are electrically connected to each other through a conduction path provided outside the semiconductor device PKG (for example, the conduction path provided in the wiring board PB1). Therefore, the power MOSFET 1 and the power MOSFET 2 are connected in series between the terminal TE1 for supplying power supply potential and the terminal TE4 for supplying reference potential. The power MOSFET 1 corresponds to a high-side MOSFET, and the power MOSFET 2 corresponds to a low-side MOSFET. Namely, the power MOSFET 1 is a field effect transistor for a high-side switch (high-potential-side switch), and the power MOSFET 2 is a field effect transistor for a low-side switch (low-potential-side switch). Each of the power MOSFETs 1 and 2 can be regarded as a switching power transistor.

However, a conduction path that electrically connects the terminal TE2 and the terminal TE3 to each other is not provided inside the semiconductor device PKG but is provided outside the semiconductor device PKG (that is, in the wiring board PB1). Therefore, in the state where the semiconductor device PKG is mounted on the wiring board PB1 (that is, in a state where the inverter circuit is configured), the terminal TE2 (lead LD2) and the terminal TE3 (lead LD3) of the semiconductor device PKG are electrically connected to each other. Hence, a connection point TE6 between (the source of) the power MOSFET 1 and (the drain of) the power MOSFET 2 is provided outside the semiconductor device PKG (that is, in the wiring board PB1), and this connection point TE6 is connected to, for example, the coil (load) CL of the motor MOT.

The DC power supplied to the inverter circuit INV using the semiconductor device PKG is converted into the AC power by the inverter circuit INV, and is supplied to the load (here, the coil CL of the motor MOT). The motor MOT is driven by the AC power supplied from the inverter circuit INV.

Moreover, the control circuit CLC is connected to the terminal TE5 (lead LD5), and this terminal TE5 (lead LD5) is connected to the control circuit CT provided outside the semiconductor device PKG. Therefore, the control circuit CLC in the semiconductor device PKG is connected to the control circuit CT, which is provided outside the semiconductor device PKG, through the terminal TE5 (lead LD5) and the wiring and the like of the wiring board PB1 that mounts the semiconductor device PKG thereon. In this way, the signal is exchanged between the control circuit CT outside the semiconductor device PKG and the control circuit CLC in the semiconductor device PKG, and the control circuit CLC in the semiconductor device PKG is controlled by the control circuit CT provided outside the semiconductor device PKG. <Regarding Configuration of Noise Filter and Capacitor>

Next, the noise filter FIL1 according to the first embodiment will be described in detail. FIG. 8 is a circuit diagram showing the noise filter FIL1 according to the first embodiment.

As shown in FIG. 8, the noise filter FIL1 includes the terminal TM1, the lead LD1 (see FIG. 2) connected to the terminal TM1 with the bonding material SD interposed therebetween, the lead coupling portion LB1 (see FIG. 2) coupled to the lead LD1, the metal plate MP1 connected to the lead coupling portion LB1 with the adhesive layer BD5 interposed therebetween, and the capacitor DC1.

As shown in FIG. 2 and FIG. 5, the capacitor DC1 is composed of the electrode CE1, the electrode CD disposed to face the electrode CE1, and the insulating layer IL2 and the insulating material DE disposed between the electrode CE1 and the electrode CD. The electrode CE1 is disposed inside the sealing body MR of the semiconductor device PKG, and is connected to the metal plate MP1 with the adhesive layer BD8 interposed therebetween. The electrode CD is disposed inside the insulating layer IL2 of the wiring board PB1, and is connected to the terminal TM4 of the wiring board PB1. Moreover, the potential (power supply potential) VIN is supplied to the terminal TM1 through the wiring and the like of the wiring board PB1. The ground potential GND is supplied to the terminal TM4 through the wiring and the like of the wiring board PB1. Moreover, the metal plate MP1 is connected to the drain pad PDHD of the semiconductor chip CPH with the adhesive layer BD4 interposed therebetween.

As described above, the terminal TM1 that composes the noise filter FIL1 is located inside the wiring board PB1, and the lead LD1, the lead coupling portion LB1 and the metal plate MP1 are located inside the semiconductor device PKG.

Here, the respective members which compose the noise filter FIL1 will be described in detail. FIG. 8 shows a resistance, an inductance and a capacitance in a case where the respective members which compose the noise filter FIL1 are considered as an equivalent circuit, that is, a single RLC filter circuit (more specifically, a three-terminal filter circuit as a T-type circuit in which two inductors and one capacitor are combined with one another). In the terminal TM1, a resistance is 0.06 Ω, an inductance is 2 nH, and a capacitance is 0.2 pF. In the lead coupling portion LB1 and the lead LD1 formed integrally with each other, a resistance is 0.12 Ω, an inductance is 1.8 nH, and a capacitance is 0.18 pF. In the metal plate MP1, a resistance is 0.24 Ω, an inductance is 3.6 nH, and a capacitance is 0.36 pF. As seen from these values, the terminal TM1, the lead LD1, the lead coupling portion LB1 and the metal plate MP1 which compose the noise filter FIL1 act as a resistor and an inductor.

Meanwhile, in the capacitor DC1, a capacitance is 1 nF. Moreover, as will be described later, in the capacitor DC1, a parasitic resistance is 0.01 Ω and a parasitic inductance is 0.09 nH.

Here, the capacitance of the capacitor DC1 that composes the noise filter FIL1 according to the first embodiment will be described. As mentioned above, a capacitance C of the capacitor DC1 can be changed by the area of each of the electrode CE1 and the electrode CD or the presence or absence of the insulating material DE.

As shown in FIG. 2, in the wiring board PB1, the electrode CD is covered with the insulating layer IL2. The insulating material DE is disposed between the main surface PB1a of the wiring board PB1 and the back surface MRb of the sealing body MR of the semiconductor device PKG. Therefore, in a case where the electrode CE1 is exposed from the back surface MRb of the sealing body MR, (a part of) the insulating layer IL2 and the insulating material DE are present between the electrode CD and the electrode CE1. Moreover, in a case where the electrode CE1 is covered with the sealing body MR, (a part of) the insulating layer IL2, the insulating material DE and (a part of) the sealing body MR are present between the electrode CD and the electrode CE1.

Note that, in a case where the insulating material DE is not disposed, an air layer is present between the main surface PB1a of the wiring board PB1 and the back surface MRb of the sealing body MR of the semiconductor device PKG. Therefore, in a case where the electrode CE1 is exposed from the back surface MRb of the sealing body MR, (a part of) the insulating layer IL2 and the air layer are present between the electrode CD and the electrode CE1. Moreover, in a case where the electrode CE1 is covered with the sealing body MR, (a part of) the insulating layer IL2, the air layer and (a part of) the sealing body MR are present between the electrode CD and the electrode CE1.

Here, a case (1) where the electrode CE1 is exposed from the back surface MRb of the sealing body MR and the insulating layer IL2 and the insulating material DE are present between the electrode CD and the electrode CE1 and a case (2) where the electrode CE1 is exposed from the back surface MRb of the sealing body MR and the insulating layer IL2 and the air layer are present between the electrode CD and the electrode CE1 will be described as examples.

It is assumed that an area S of a portion where the electrode CE1 and the electrode CD overlap each other in plan view is 85 mm$^2$. Also, it is assumed that a distance between the main surface PB1a of the wiring board PB1 and the back surface MRb of the sealing body MR of the semiconductor device PKG, that is, a thickness of the insulating material DE (or the air layer) is 80 μm. Moreover, it is assumed that a thickness of the insulating layer IL2 present on the electrode CD in the wiring board PB1 is 20 μm. Further, it is assumed that a relative dielectric constant of the insulating material DE is 7, a relative dielectric constant of the air layer is 1, and a relative dielectric constant of the insulating layer IL2 is 4.4. From the above, in the case (1) where the electrode CE1 is exposed from the back surface MRb of the sealing body MR and the insulating layer IL2 and the insulating material DE are present between the electrode CD and the electrode CE1, the capacitance C of the capacitor DC1 is 47 pF. Also, in the case (2) where the electrode CE1 is exposed from the back surface MRb of the sealing body MR and the insulating layer IL2 and the air layer are present between the electrode CD and the electrode CE1, the capacitance C of the capacitor DC1 is 9 pF.

Here, a method for forming the electrode CE1 will be described. First, a manufacturing process of the semiconductor device PKG will be briefly described in advance. The manufacturing process includes a die bonding step, a wire bonding step, a molding step (resin molding step) and the like. The die bonding step is, for example, a step of dieboding the semiconductor chips CPC, CPH and CPL to a lead frame LF. Moreover, the wire bonding step is a step of individually connecting the semiconductor chips CPC, CPH and CPL and the leads LD to each other by the metal plates MP1 and MP2 and the wires BW. Furthermore, the molding step is a step of performing resin sealing so that the semiconductor chips CPC, CPH and CPL and the plurality of wires BW and the metal plates MP1 and MP2 connected thereto are sealed by the sealing body MR.

As the method for forming the electrode CE1, first, a method of forming a printing pattern on the back surface MRb of the sealing body MR after the molding step is known. As a printing method, for example, screen printing, roll printing, gravure printing or the like is known. A material that is curable at a relatively low temperature (200° C. or less) is preferable as a material of the electrode CE1.

Moreover, as the method for forming the electrode CE1, second, a method in which a conductor pattern formed on an insulating substrate by etching or a so-called flexible substrate in which copper foil is sandwiched by polyimide is temporarily put in a molding die before the molding step and then in-mold insert molding is performed thereto together with other members in the molding step is known. In this case, after the molding step, the electrode CE1 and the metal plate MP1 can be electrically connected to each other by forming an opening by laser or the like in a portion where the electrode CE1 and the metal plate MP1 are connected to each other and filling this opening with a conductor. A connection member such as another metal plate may be provided so as not to interfere with other electrodes, wires or the like, or the conductor that fills the opening may be patterned for preventing the interference.

Note that, in a case where one electrode is to be formed in the semiconductor device PKG like the electrode CE1 according to the first embodiment, the method of forming the electrode by a printing pattern is more advantageous than the method of embedding a conductor or a substrate from the viewpoint that the thickness of the electrode is easily controllable. Meanwhile, in a case where the electrode is formed into a multilayered electrode as in a third embodiment to be described later, the method of embedding a conductor or a substrate is more advantageous than the method of forming the electrode by a printing pattern from the viewpoint that it is easy to form the multilayered electrode in advance.

<Regarding History of Examination>

Figure 9:
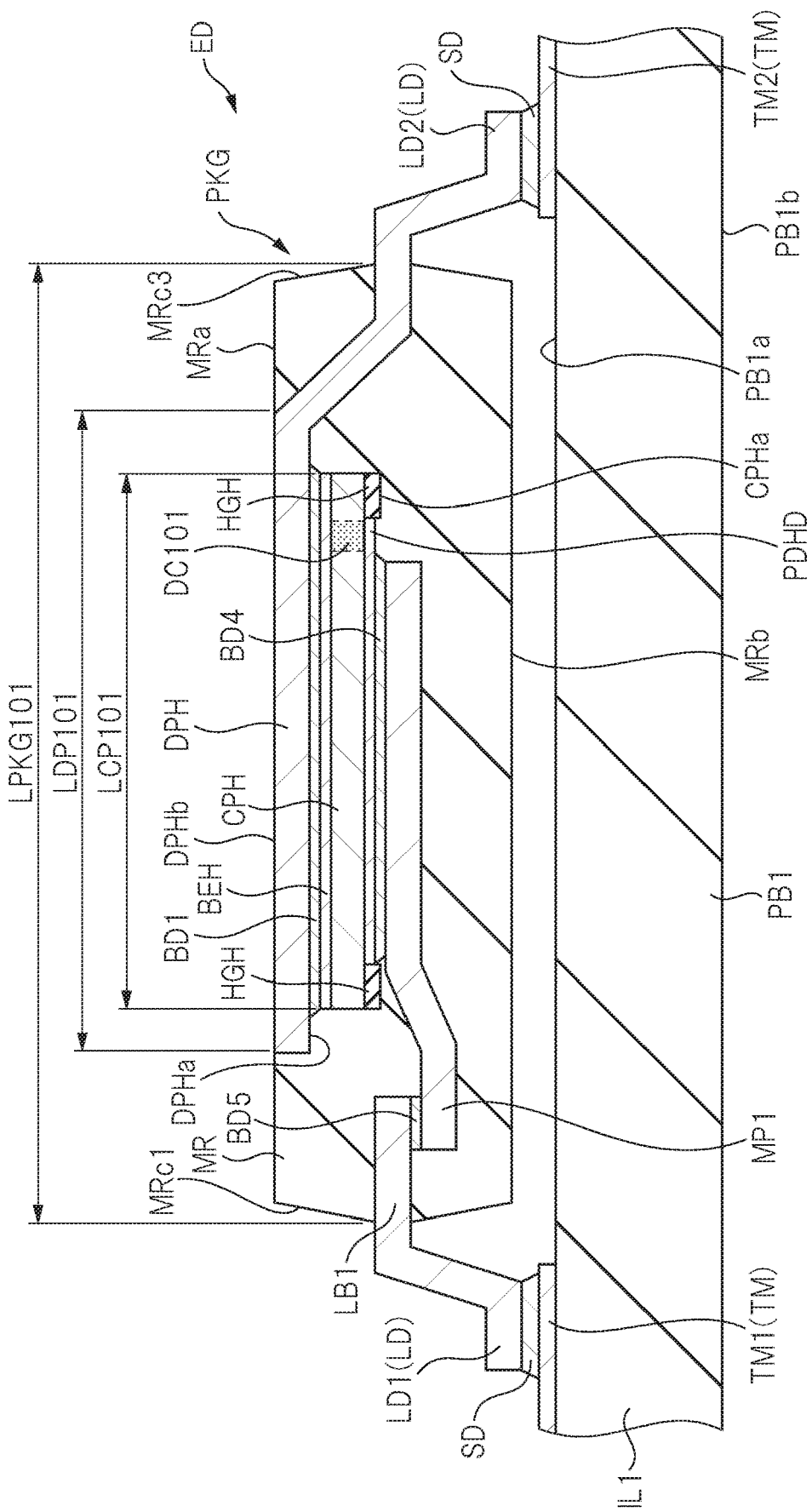
FIG. 9 is a cross-sectional view in which an electronic device according to a first examination example is cut at a position corresponding to the line A1-A1 of FIG. 1.
Figure 10:
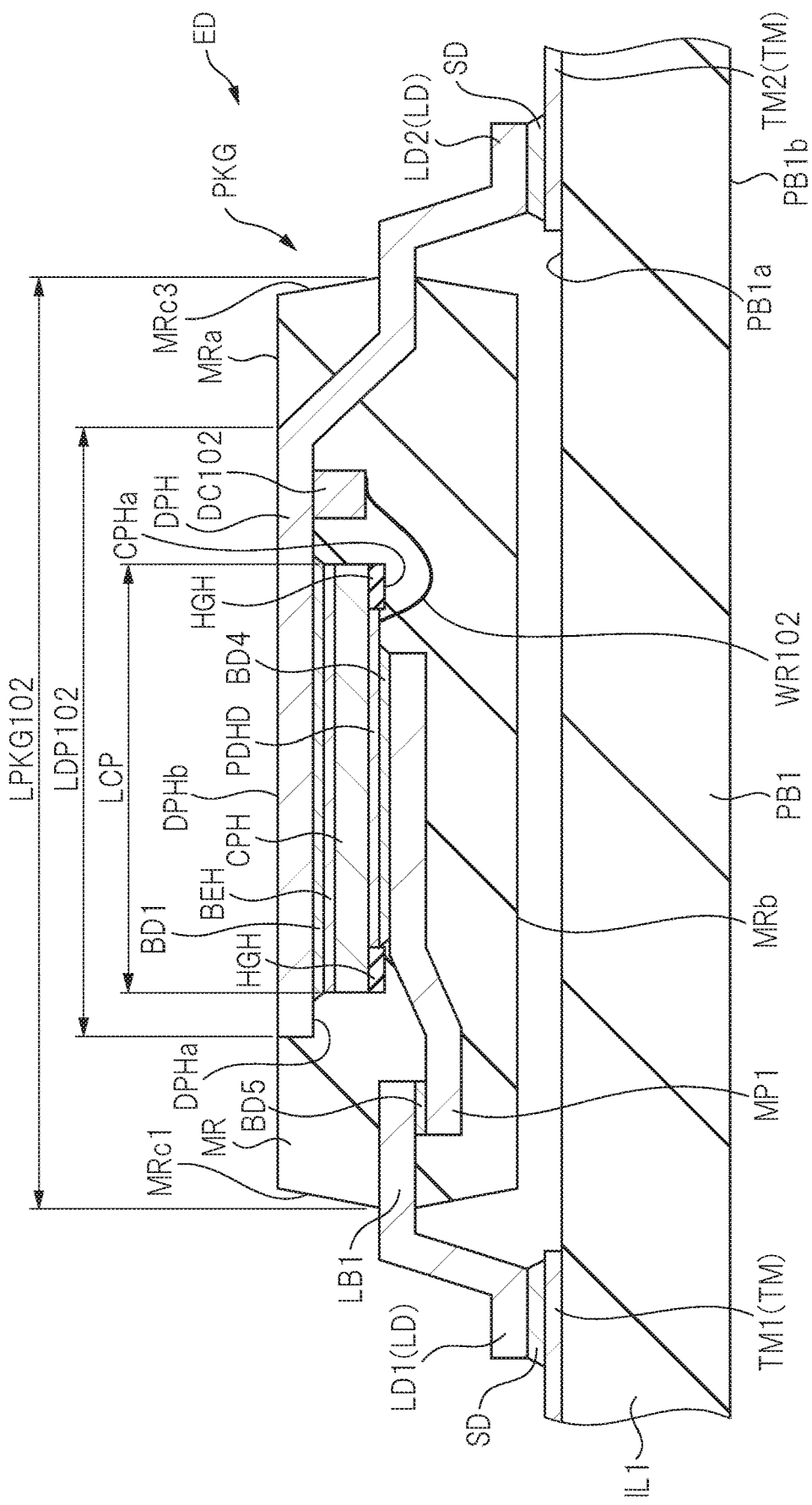
FIG. 10 is a cross-sectional view in which an electronic device according to a second examination example is cut at a position corresponding to the line A1-A1 of FIG. 1.
Figure 11:
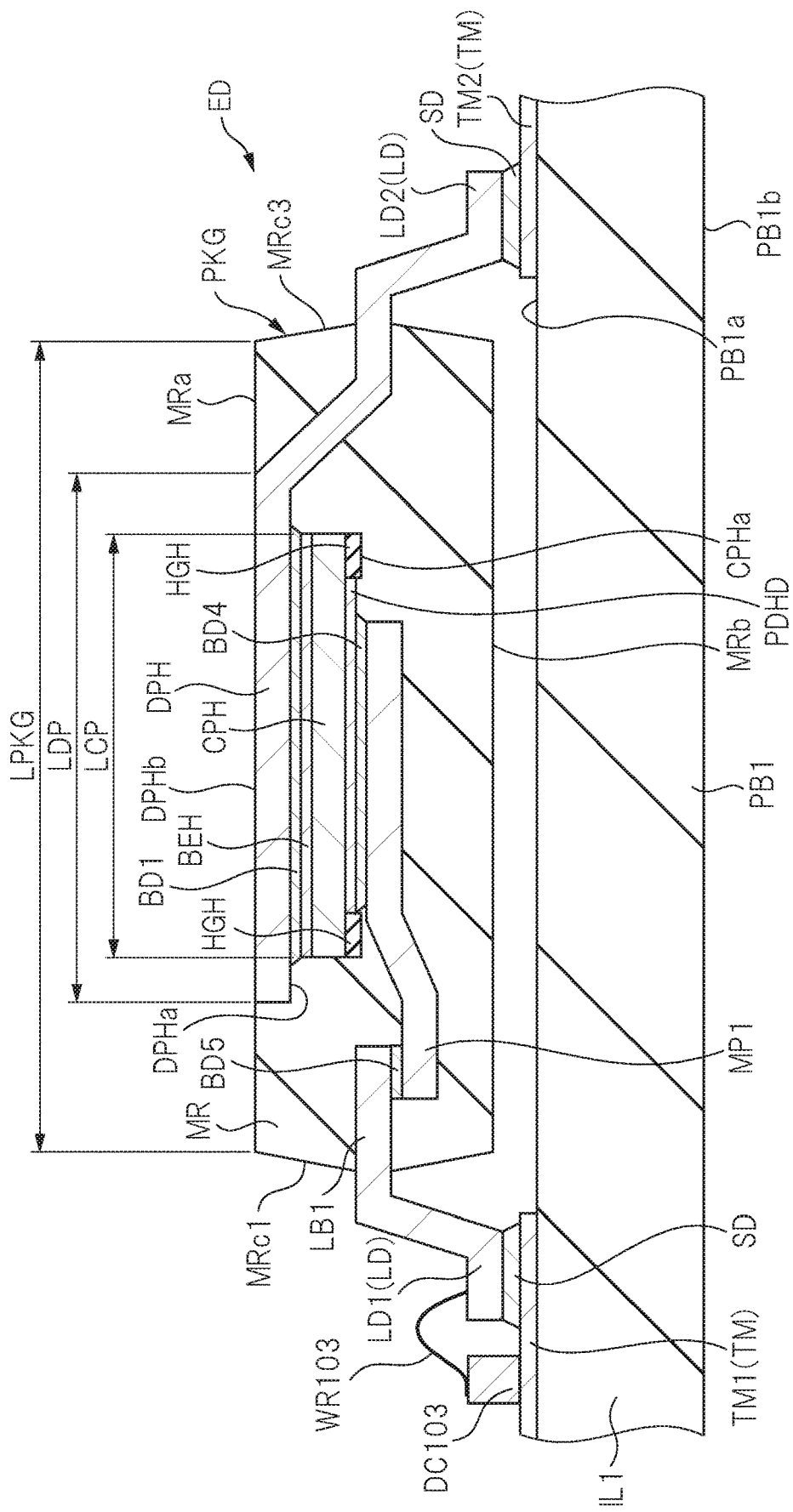
FIG. 11 is a cross-sectional view in which an electronic device according to a third examination example is cut at a position corresponding to the line A1-A1 of FIG. 1.

Hereinafter, examination examples examined by the inventor of the present invention will be described. FIG. 9 is a cross-sectional view in which an electronic device ED of a first examination example is cut at a position corresponding to a line A1-A1 of FIG. 1. FIG. 10 is a cross-sectional view in which an electronic device ED of a second examination example is cut at a position corresponding to the line A1-A1 of FIG. 1. FIG. 11 is a cross-sectional view in which an electronic device ED of a third examination example is cut at a position corresponding to the line A1-A1 of FIG. 1.

The inventor of the present invention has examined anti-noise countermeasures of an electronic device including an inverter circuit for driving a motor. The anti-noise countermeasures of the electronic device can be broadly divided into the following two. One is to reduce an extent that an operation of a target electronic component interferes with an operation of another circuit. Such an interference is called an electromagnetic interference (EMI). The other is to reduce an extent that the operation of the target electronic component is affected by an electromagnetic wave generated in a circuit present around the electronic component or on the outside of the electronic device. Such an interference is called an electromagnetic susceptibility (EMS). As countermeasures against the EMI/EMS described above, a design to enhance an electromagnetic compatibility (EMC) performance is important.

For the EMI/EMS, countermeasures in accordance with a frequency band of an electromagnetic wave to be used are required, and the scope of regulations of the EMI/EMS is a frequency band of 150 kHz to 1 GHz at present. However, the scope of regulations of the EMI/EMS is scheduled to be expanded to 1 GHz to 6 GHz in the future. With respect to the wavelength of an electromagnetic wave of 6 GHz, $\lambda/2$ is 12.5 mm and $\lambda/4$ is 6.25 mm, and the wavelength belongs to the same order as those of a board size and a wiring length. Therefore, it is necessary to consider a resonance between the noise and the board and wiring, which have not attracted attention heretofore.

Accordingly, in order to enhance the EMC performance, the inventor of the present invention has examined the configuration in which a noise filter circuit is disposed in a power source path for supplying power from a basic power supply to electronic components. For a first example of the noise filter circuit, a case where only a capacitor is connected in parallel to a load of a main circuit will be considered. At this time, an impedance $Z_C$ of the capacitor is represented as $Z_C = 1/j2\pi fC$, where j is an imaginary unit, f is a frequency, and C is a capacitance. In a case where the impedance $Z_C$ of the capacitor becomes smaller than the load of the main circuit with respect to the frequency f of the noise, the noise bypasses the capacitor, and this capacitor acts as a noise filter. The capacitor like this is referred to as a decoupling capacitor (bypass capacitor). Moreover, theoretically, as the frequency f of the noise is higher, the impedance $Z_C$ of the capacitor becomes smaller. Therefore, this noise filter circuit bypasses a component with a high frequency f and passes only a component with a low frequency f, and is thus referred to also as a low-pass filter.

Moreover, for a second example of the noise filter circuit, a case where only an inductor (coil) is connected in series to a load of a main circuit will be considered. At this time, an impedance $Z_L$ of the inductor (coil) is represented as $Z_L = j2\pi fL$, where j is an imaginary unit, f is a frequency, and L is an inductance. When the impedance $Z_L$ of the inductor becomes large with respect to the frequency f of the noise, a current value of the noise becomes small. Theoretically, as the frequency f of the noise is higher, the impedance $Z_L$ of the inductor becomes larger, and only a component with a low frequency f is allowed to pass. Accordingly, this noise filter circuit is also referred to as a low-pass filter.

As described above, the noise filter circuit can be composed of the capacitor, the inductor, a combination of the capacitor and the inductor or the like. Here, the inductor can be replaced by members such as wirings provided in the semiconductor device and the wiring board. Namely, by adjusting lengths and widths of the terminal TM1, the lead coupling portion LB1, the lead LD1 and the metal plate MP1 described above, a function of the inductor can be imparted to these members. Meanwhile, since a function of the capacitor affects an area of an electrode disposed to face with a dielectric interposed therebetween, it is difficult to impart the function of the capacitor to these members. Hence, the inventor of the present invention has examined the noise filter circuit by devising a configuration and disposition of the capacitor.

First, in the first examination example shown in FIG. 9, the inventor of the present invention has examined the configuration in which a decoupling capacitor is disposed at an entrance of the main circuit. Specifically, a capacitor DC101 is formed inside the semiconductor chip CPH. This capacitor DC101 is composed of an electrode layer and a dielectric layer formed on the semiconductor substrate that composes the semiconductor chip CPH by using a technique such as a vacuum deposition method, a sputtering deposition method, and a chemical vapor deposition (CVD) method.

Next, in the second examination example shown in FIG. 10, the inventor of the present invention has examined the configuration in which a decoupling capacitor is disposed between the semiconductor chip and the wiring in the semiconductor device. Specifically, a capacitor DC102 is disposed on the die pad DPH and the capacitor DC102 is connected to the pad PDHD of the semiconductor chip CPH and a terminal (for example, the terminal TM4 in FIG. 4) to which the ground potential is supplied. Note that the capacitor DC102 and the pad PDHD of the semiconductor chip CPH are connected to each other by a wiring WR102 having a narrower wiring width than the metal plate MP1. Moreover, the capacitor DC102 and the terminal TM4 are connected to each other by a wiring (not shown) having the same wiring width as that of the wiring WR102.

Next, as shown in the third examination example shown in FIG. 11, the inventor of the present invention has examined the configuration in which a decoupling capacitor is disposed between the semiconductor device and the wiring board. Specifically, a capacitor DC103 is disposed on the wiring board PB1 and the capacitor DC103 is connected to the terminal TM1 to which the power supply potential is supplied and to the terminal (for example, the terminal TM4 in FIG. 4) to which the ground potential is supplied. Note that the capacitor DC103 is connected to the terminal TM1 through the lead LD1 and the capacitor DC103 and the lead LD1 are connected to each other by a wiring WR103 having a narrower wiring width than the metal plate MP1. Moreover, the capacitor DC103 and the terminal TM4 are connected to each other by a wiring (not shown) having the same wiring width as that of the wiring WR103.

Here, when the configuration and the disposition of the capacitor are to be examined in each of the first to third examination examples, it is necessary to consider a parasitic resistance and a parasitic inductance of the capacitor. The parasitic resistance means a resistance present in the capacitor and the wiring located nearby. Moreover, the parasitic inductance means an inductance present in the capacitor and the wiring located nearby. Hereinafter, influences of the parasitic resistance and the parasitic inductance will be described.

The parasitic resistance can be regarded as a resistor connected in series to the above-mentioned capacitor. Likewise, the parasitic inductance can be regarded as an inductor connected in series to the above-mentioned capacitor. Therefore, an impedance Z of the capacitor in which a parasitic resistance $R_P$ and a parasitic inductance $L_P$ are taken into account is represented as: $Z=1/j2\pi fC+R_P+j2\pi fL_P$. First, the parasitic resistance $R_P$ is not changed with respect to the frequency f of the noise, and thus a minimum value of the impedance of the capacitor is defined. Next, when the frequency f of the noise is raised, an impedance component of the capacitor becomes small, and thus the same action as mentioned above is exerted while being smaller than the load of the main circuit. However, when the frequency f of the noise becomes equal to or larger than a certain value, the impedance component of the parasitic inductance becomes larger. Then, when the impedance component becomes larger than the load of the main circuit, the noise does not bypass the capacitor, and this capacitor does not act as the noise filter.

Figure 12:
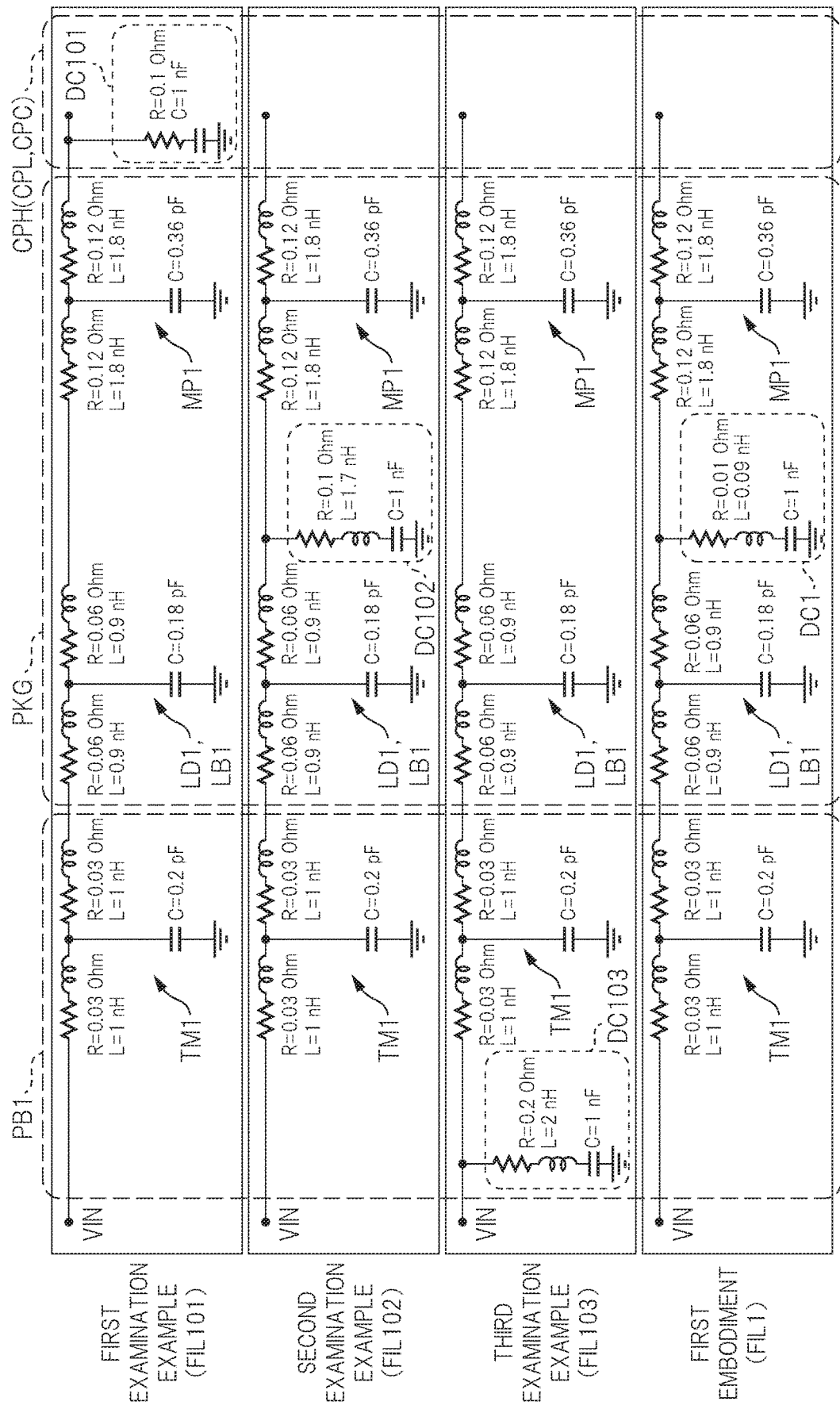
FIG. 12 is a circuit diagram showing noise filters included in the electronic devices according to the first to third examination examples.

Here, influences of the parasitic inductances in the first to the third examination examples will be described. FIG. 12 is a circuit diagram showing the noise filters of the first to third examination examples. As in FIG. 8 mentioned above, FIG. 12 shows a resistance, an inductance and a capacitance in a case where the respective members which compose each of the noise filters are considered as an equivalent circuit, that is, a single RLC filter circuit (more specifically, a three-terminal filter circuit as a T-type circuit in which two inductors and one capacitor are combined with one another). Since the resistance, the inductance and the capacitance in each of the terminal TM1, the lead coupling portion LB1, the lead LD1 and the metal plate MP1 are similar to those in FIG. 8, the description thereof will be omitted. Note that, though FIG. 12 also illustrates the configuration of the first embodiment, the description thereof will be given later.

First, in the capacitor DC101 of the first examination example, a capacitance is 1 nF, a parasitic resistance is 0.1 Ω, and a parasitic inductance is 0 nH. In the capacitor DC102 of the second examination example, a capacitance is 1 nF, a parasitic resistance is 0.1 Ω, and a parasitic inductance is 1.7 nH. In the capacitor DC103 of the third examination example, a capacitance is 1 nF, a parasitic resistance is 0.2 Ω, and a parasitic inductance is 2 nH.

Meanwhile, as will be described later, in the capacitor DC1 according to the first embodiment, a capacitance is 1 nF (or 0.1 nF or 15 pF), a parasitic resistance is 0.01 Ω, and a parasitic inductance is 0.09 nH.

Figure 13:
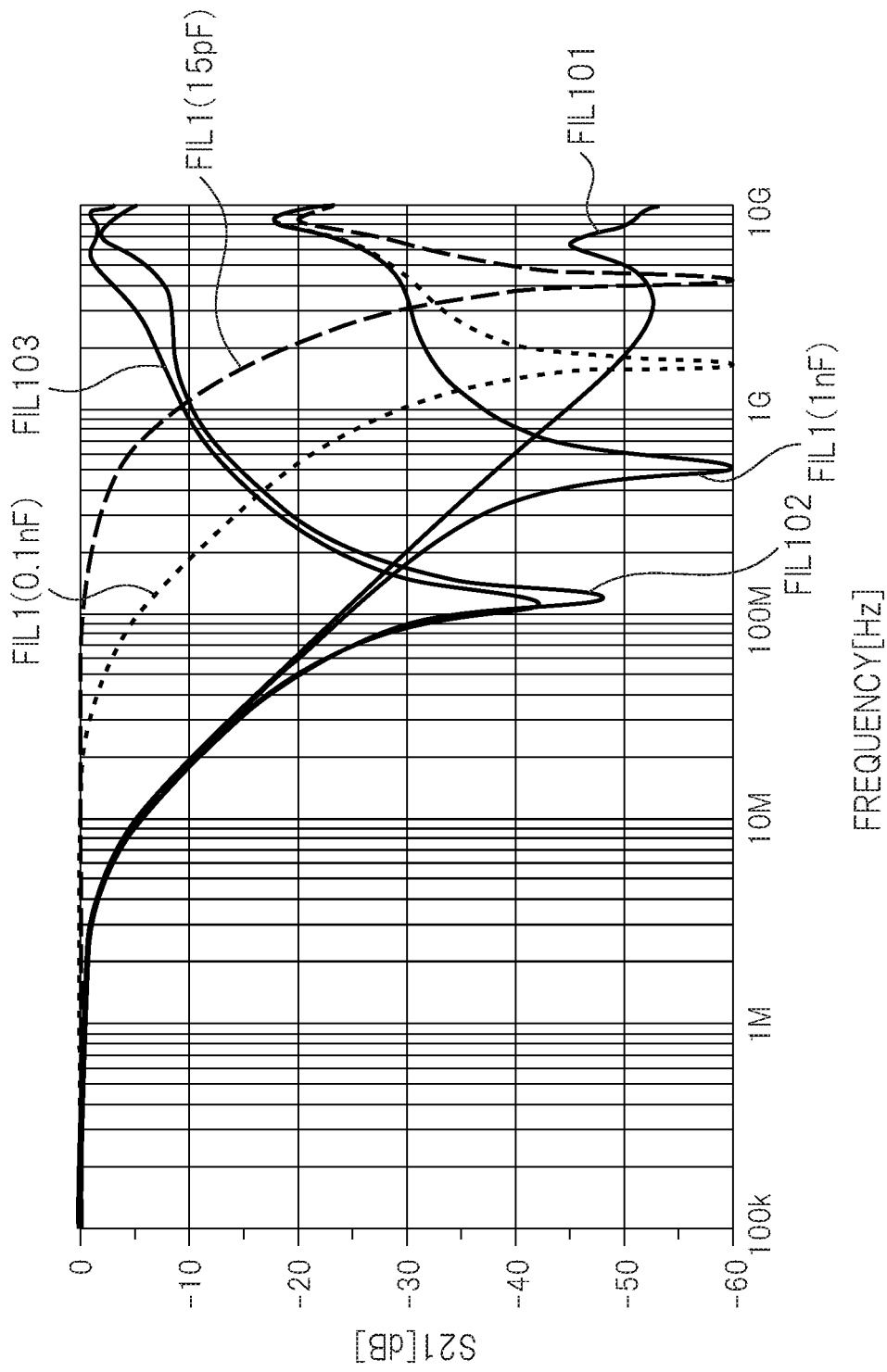
FIG. 13 is a graph showing attenuation factors with respect to input frequencies in the noise filters included in the electronic devices of the first to third examination examples.

On the basis of the above, input frequency dependences as to how an output from the noise filter was attenuated with respect to an input to the noise filter were obtained by simulation in a range of 100 kHz to 10 GHz. FIG. 13 is a graph showing attenuation factors with respect to input frequencies in the noise filters of the first to third examination examples.

A horizontal axis in FIG. 13 represents input frequency and a vertical axis in FIG. 13 represents how outputs from the noise filters FIL101, FIL102 and FIL103 are attenuated with respect to inputs to the noise filters FIL101, FIL102 and FIL103. Note that, though FIG. 13 also shows results of the first embodiment, the description thereof will be given later.

Moreover, the vertical axis in FIG. 13 represents the attenuation by S21 that is one of scattering parameters (S parameters). The S parameters are those which represent the characteristics of a circuit by a reflection and a transmission degree of a wave when an AC signal is regarded as a wave. Particularly, S21 which is the S parameter representing the transmission degree as to how a wave passing through a target circuit is attenuated while being transmitted can be obtained as |S21|=output from noise filter/input to noise filter. Moreover, the S parameter is generally represented by the unit of dB while taking a common logarithm. Therefore, the vertical axis in FIG. 13 is represented by 20 log|S21|. For example, when |S21|=1/√2, 20 log|S21|≈-3 dB is established, when |S21|=1/√10, 20 log|21|=-10 dB is established, and when |S21|=1/10, 20 log|S21|=-20 dB is established. Hereinafter, in a case where S21 is represented by the unit of dB, a value obtained by 20 log|S21| is assumed to be represented, and S21 is expressed like that S21 is approximately -3 dB (or S21≈-3 dB) for simplification. Note that, when S21=-3 dB, output power is halved in comparison with a case of no attenuation, and thus the frequency at this time is referred to as a cut-off frequency.

As shown in FIG. 13, in the first examination example, when the input frequency becomes higher than 1 MHz, S21 becomes smaller, that is, an attenuation factor becomes larger. In a range where the input frequency is 1 MHz to 3 GHz, S21 decreases monotonously, that is, the attenuation factor increases monotonously. Then, in a range where the input frequency is 3 GHz to 10 GHz, S21 maintains to be -30 dB or less.

In the second examination example, similarly to the first examination example, when the input frequency becomes higher than 1 MHz, S21 becomes smaller, that is, an attenuation factor becomes larger. However, at a point where the input frequency is approximately 100 MHz, S21 takes a minimum value, and when the input frequency becomes higher than 100 MHz, S21 becomes larger, that is, the attenuation factor becomes smaller. Particularly, in a range where the input frequency is 1 GHz to 10 GHz, S21 becomes larger than -10 dB.

In the third examination example, in a range where the input frequency is 100 kHz to 10 GHz, S21 exhibits substantially the same behavior as that in the second examination example.

Hereinafter, a relationship between the attenuation factor and the input frequency in the noise filter of each of the first to third examination examples will be examined. As shown in FIG. 12, in the noise filter FIL101 of the first examination example, the capacitor DC101 is formed inside the semiconductor chip CPH. In the noise filter FIL102 of the second examination example, the capacitor DC102 is disposed on the die pad DPH and the capacitor DC102 is connected to the pad PDHD of the semiconductor chip CPH and the terminal (not shown) to which the ground potential is supplied. In the noise filter FIL103 of the third examination example, the capacitor DC103 is disposed on the wiring board PB1 and the capacitor DC103 is connected to the lead LD1 and the terminal (not shown) to which the ground potential is supplied.

Here, the examination by the inventor of the present invention has revealed that the parasitic inductance of the capacitor largely depends on a connection distance (length of wiring) between the main circuit and one electrode that composes the capacitor. Namely, in the noise filter FIL101 of the first examination example, there is nothing between the capacitor DC101 and the semiconductor chip CPH, and thus the parasitic inductance in the capacitor DC101 is negligibly small. Meanwhile, in the noise filter FIL102 of the second examination example, the wiring WR102 having a narrower wiring width than other components and having a certain length is present between the capacitor DC102 and the semiconductor chip CPH. Therefore, the parasitic resistance (0.1 Ω) and the parasitic inductance (1.7 nH) which are derived from the wiring WR102 are present in the capacitor 102.

Moreover, in the noise filter FIL103 of the third examination example, between the capacitor DC103 and the semiconductor chip CPH, the wiring WR103 having a narrower wiring width than other components and having a certain length is present, and the terminal TM1, the lead LD1, the lead coupling portion LB1 and the metal plate MP1 are present in addition to the wiring WR103. Therefore, the parasitic resistance (0.2 Ω) and the parasitic inductance (2 nH) which are derived from the wiring WR103, the terminal TM1, the lead LD1, the lead coupling portion LB1 and the metal plate MP1 are present in the capacitor DC103. The detailed examination by the inventor has revealed that the wiring WR103, the lead LD1 and the lead coupling portion LB1 having a narrower wiring width and longer wiring length than the metal plate MP1 largely contribute to the parasitic inductance in the third examination example.

As mentioned above, the impedance Z of the capacitor in which the parasitic resistance $R_P$ and the parasitic inductance $L_P$ are taken into account is represented as $Z=1/j2\pi fC + R_P + j2\pi fL_P$. When the frequency f of the noise is raised, the component $1/j2\pi fC$ of the impedance which is derived from the capacitor becomes smaller, and thus the noise bypasses the capacitor, and the attenuation factor of the noise becomes large. However, in a case where the parasitic inductance $L_P$ of the capacitor is not negligible, when the frequency f of the noise becomes equal to or more than a certain value, the component $j2\pi fL_P$ of the impedance which is derived from the parasitic impedance becomes larger, so that the noise stops bypassing the capacitor and the attenuation factor of the noise becomes small.

Here, since the capacitance C of the capacitor DC101 in the first examination example is 1 nF, the cut-off frequency is approximately 10 MHz. Also, since the parasitic inductance of the capacitor DC101 is 0 nH, the component $j2\pi fL_P$ of the impedance which is derived from the parasitic inductance is 0 irrespective of the frequency f of the noise. As a result, in a frequency band where the input frequency is 60 MHz to 10 GHz, S21 is smaller than −20 dB, that is, the attenuation factor is larger than 1/10. Hence, when the above-described expansion of the scope of regulation of the EMI/EMS to the frequency band of 1 GHz to 6 GHz in the future is taken into account, the noise filter FIL101 of the first examination example can meet the above-described regulation.

In the first examination example, for example, the capacitance C of the capacitor DC101 is set to 1 nF in order to set the cut-off frequency equal to or less than approximately 10 MHz. In order to set the capacitance C of the capacitor DC101 to such a large value, it is necessary to increase the area of the electrode layer which composes the capacitor DC101 in the semiconductor chip. Therefore, there occurs a problem that a size of the semiconductor chip (a length LCP101 of the semiconductor chip CPH shown in FIG. 9) becomes large and a size of the die pad (a length LDP101 of the die pad DPH shown in FIG. 9), a size of the semiconductor device (a length LPKG101 of the semiconductor device PKG shown in FIG. 9) and a size of the wiring board also become large. The increase of the sizes of the semiconductor chip, the semiconductor device and the wiring board leads to enormous increases of designing cost and manufacturing cost. Particularly, in the first examination example, it is necessary to newly design the semiconductor substrate that composes the semiconductor chip CPH, and thus the designing cost and the manufacturing cost are increased enormously. As a result, it can be said that the first examination example is not a realistic solution.

Meanwhile, in the second examination example shown in FIG. 10, the decoupling capacitor is disposed between the semiconductor chip and the wiring in the semiconductor device. Accordingly, unlike the first examination example, the size of the semiconductor chip does not become large. Moreover, since the capacitance C of the capacitor DC102 in the second examination example is 1 nF similarly to the first examination example, the cut-off frequency is approximately 10 MHz.

However, the parasitic inductance of the capacitor DC102 of the second examination example is 1.7 nH. Therefore, as shown in FIG. 13, in the second examination example, when the input frequency becomes higher than 100 MHz, the impedance component of the parasitic inductance becomes larger, and the attenuation factor becomes smaller. Particularly, in the second examination example, in the range where the input frequency is 1 GHz to 10 GHz, S21 becomes larger than −10 dB. When the above-described expansion of the scope of regulation of the EMI/EMS to the frequency band of 1 GHz to 6 GHz in the future is taken into account, the noise filter FIL102 of the second examination example cannot meet this regulation.

In addition, in the second examination example, since the capacitor is disposed inside the semiconductor device, a size of the die pad (a length LDP102 of the die pad DPH shown in FIG. 10) becomes large, and as a result, there occurs a problem that a size of the semiconductor device (a length LPKG102 of the semiconductor device PKG shown in FIG. 10) and a size of the wiring board become large. As in the case mentioned above, the increase of the sizes of the semiconductor device and the wiring board leads to the increases of the designing cost and the manufacturing cost.

Moreover, in the third examination example shown in FIG. 11, the decoupling capacitor is disposed between the semiconductor device and the wiring board. Accordingly, unlike the first examination example or the second examination example, the size of the semiconductor chip and the size of the semiconductor device do not become large. Moreover, since the capacitance C of the capacitor DC103 in the third examination example is 1 nF similarly to the first examination example and the second examination example, the cut-off frequency is approximately 10 MHz.

However, the parasitic inductance of the capacitor DC103 of the third examination example is 2 nH. Therefore, as shown in FIG. 13, in the third examination example, when the input frequency becomes higher than 100 MHz, the impedance component of the parasitic inductance becomes larger, and the attenuation factor becomes smaller. Particularly, in the third examination example, in the range where the input frequency is 1 GHz to 10 GHz, S21 becomes larger than −10 dB. When the above-described expansion of the scope of regulation of the EMI/EMS to the frequency band of 1 GHz to 6 GHz in the future is taken into account, the noise filter FIL103 of the third examination example cannot meet this regulation.

In addition, in the third examination example, since the capacitor is disposed in a region of the wiring board where the semiconductor device is not mounted, there occurs a problem that the size of the wiring board becomes large. As in the case mentioned above, the increase of the size of the wiring board leads to the increases of the designing cost and the manufacturing cost.

From the first to third examination examples described above, in a case of adopting the capacitor as the noise filter, it is desirable that the parasitic resistance and the parasitic inductance of the capacitor are reduced as much as possible and the attenuation factor of the noise is enhanced. Particularly, it is desirable that the parasitic inductance is reduced as much as possible and the attenuation factor of the noise in the frequency domain of 1 GHz to 6 GHz is enhanced.

Further, it is desirable that the capacitance of the capacitor is increased as much as possible and the cut-off frequency of the noise filter is reduced. Here, the capacitance C of the capacitor composed of a pair of the electrodes facing each other is represented as $C=\varepsilon_0\varepsilon_r S/d$, where $\varepsilon_0$ is a relative dielectric constant of vacuum, $\varepsilon_r$ is a relative dielectric constant of a substance present between the electrodes, S is an area of the electrodes, and d is a distance between the electrodes. Therefore, in order to increase the capacitance C of the capacitor, it is necessary to (1) increase the area S of the electrodes, (2) reduce the distance d between the electrodes, and (3) increase the relative dielectric constant $\varepsilon_r$ of the substance present between the electrodes.

<Regarding Main Features and Effects>

As shown in FIG. 8, one of main features of the first embodiment is that the noise filter FIL1 includes the terminal TM1, the lead LD1 and the lead coupling portion LB1 (see FIG. 2) which are connected to the terminal TM1, the metal plate MP1 connected to the lead coupling portion LB1 with the adhesive layer BD5 interposed therebetween, and the capacitor DC1 connected between the lead coupling portion LB1 and the metal plate MP1.

Moreover, the capacitor DC1 is composed of the electrode CE1, the electrode CD disposed to face the electrode CE1, and the insulating material DE disposed between the electrode CE1 and the electrode CD. The electrode CE1 is disposed inside the sealing body MR of the semiconductor device PKG, and is connected to the metal plate MP1 with the adhesive layer BD8 interposed therebetween. The distance between the electrode CE1 and the electrode CD is shorter than the distance between the metal plate MP1 and the electrode CD (the electrode CE1 is closer to the electrode CD than the metal plate MP1 is).

Moreover, the electrode CD is disposed inside the insulating layer IL2 of the wiring board PB1, and is connected to the terminal TM4 of the wiring board PB1. Also, the potential (power supply potential) VIN is supplied to the terminal TM1 through the wiring and the like of the wiring board PB1. The ground potential GND is supplied to the terminal TM4 through the wiring and the like of the wiring board PB1. In addition, the metal plate MP1 is connected to the drain pad PDHD of the semiconductor chip CPH with the adhesive layer BD4 interposed therebetween.

In the first embodiment, the reliability of the electronic device can be enhanced by adopting the configuration like this. Hereinafter, reasons therefor will be specifically described.

In the second examination example and the third examination example described above, the decoupling capacitor is disposed, and is connected to the drain pad PDHD of the semiconductor chip CPH through the wiring WR102 or WR103. In contrast, in the first embodiment, the electrode CE1 that composes the capacitor DC1 is connected to the drain pad PDHD of the semiconductor chip CPH with only the metal plate MP1 interposed therebetween, the metal plate MP1 having a wider wiring width and shorter wiring length than the lead LD1 and the lead coupling portion LB1.

Namely, in the first embodiment, at least one electrode (electrode CE1) of a pair of electrodes which compose the capacitor DC1 and face each other is disposed inside the sealing body MR of the semiconductor device PKG, so that the connection distance (length of wiring) between the one electrode that composes the capacitor and the main circuit can be reduced.

Moreover, as shown in FIG. 2 to FIG. 4, in the first embodiment, the main surfaces DPCa, DPHa and DPLa of the die pads DPC, DPH and DPL are disposed so as to be directed to the back surface MRb of the sealing body MR. Namely, the front surfaces of the semiconductor chips CPC, CPH and CPL are disposed so as to be directed to the back surface MRb of the sealing body MR. Further, the semiconductor device PKG is mounted on the main surface (upper surface) PB1a of the wiring board PB1 so that the back surface MRb of the sealing body MR faces the main surface PB1a of the wiring board PB1. As described above, in the first embodiment, a package with a so-called reverse bending structure is adopted, and thus the electrode CE1 can be disposed in an empty space, in which no member other than the sealing body MR is present, near the back surface MRb of the sealing body MR of the semiconductor device PKG. Moreover, the electrode CE1 having a larger area than the area of the metal plate MP1, more preferably, having an area equal to or larger than the area of the sealing body MR in plan view can be disposed. Further, since the back surface MRb of the sealing body MR and the main surface PB1a of the wiring board PB1 face each other, the distance between the electrode CE1 disposed on a side of the back surface MRb of the sealing body MR of the semiconductor device PKG and the electrode CD disposed inside the insulating layer IL2 of the wiring board PB1 can be minimized.

Note that, since the metal plate MP1 also faces the electrode CD, it is also conceivable to configure the capacitor for the noise filter by the metal plate MP1 and the electrode CD without providing the electrode CE1. However, when a plane dimension (plane area) of the metal plate MP1 is made larger than a present dimension in order to increase the capacitance, the area of the metal plate MP1 becomes larger than the area of the pad PDHD, so that it becomes impossible to appropriately connect the pad PDHD and the lead LD1 to each other. Therefore, the plane dimension of the metal plate MP1 cannot be increased.

Moreover, for example, if a thickness of a portion of the sealing body MR on a side of the back surface MRb is reduced in order to shorten the distance between the metal plate MP1 and the electrode CD for the purpose of increasing the capacitance, it is apprehended that there occurs a problem that the wire BW is exposed (see FIG. 3). Therefore, the distance between the metal plate MP1 and the electrode CD cannot be shortened.

Hence, in a case where the capacitor for the noise filter is composed of the electrode CD and the metal plate MP1 that is a member for connecting the pad PDHD of the semiconductor chip CPH and the lead LD1 (lead coupling portion LB1) to each other, it becomes difficult to increase the capacitance of the capacitor.

Meanwhile, by providing the electrode CE1 separately from the metal plate MP1 and connecting the electrode CE1 to the metal plate MP1 as in the first embodiment, the area of the electrode CE1 can be made larger than the area of the metal plate MP1, more preferably, equal to or larger than the area of the sealing body MR in plan view. Then, by disposing the electrode CE1 on a side of the back surface MRb of the sealing body MR facing the main surface PB1a of the wiring board PB1, the distance between the electrode CE1 and the electrode CD can be made smaller than the distance between the metal plate MP1 and the electrode CD. As a result, by composing the capacitor for the noise filter from the electrode CE1 and the electrode CD, the capacitance of the capacitor can be increased.

Moreover, the metal plate MP1 has the wiring length shorter than those of the wirings WR102 and WR103 of the above-described second and third examination examples and the wiring width wider than those of the wirings WR102 and WR103 of the above-described second and third examination examples. Therefore, the parasitic resistance and the parasitic inductance which are derived from the metal plate MP1 are smaller than the parasitic resistance and the parasitic inductance which are derived from the wirings WR102 and WR103.

As a result, in the first embodiment, the parasitic resistance and parasitic inductance of the capacitor can be reduced in comparison with the second examination example and the third examination example.

Moreover, a portion between the electrode CE1 and the electrode CD corresponds to a gap (air gap) between the wiring board PB1 and the semiconductor device PKG mounted on the wiring board PB1. Therefore, the insulating material (dielectric) DE having a higher relative dielectric constant than the material that composes the sealing body MR can be freely selected and disposed later between the electrode CE1 and the electrode CD, that is, between the main surface PB1a of the wiring board PB1 and the back surface MRb of the sealing body MR of the semiconductor device PKG.

From the above, in the first embodiment, three conditions such as (1) the increase of the area S of the electrodes, (2) the reduction of the distance d between the electrodes, and (3) the increase of the relative dielectric constant $\varepsilon_r$ of the substance present between the electrodes can be satisfied, and as a result, the capacitance C of the capacitor DC1 can be increased.

Also, in the first embodiment, the electrode CE1 is disposed in the empty space, in which no member other than the sealing body MR is present, near the back surface MRb of the sealing body MR of the semiconductor device PKG, and thus the size of the semiconductor device as well as the size of the semiconductor chip is not increased. In addition, in the wiring board PB1, the electrode CD is disposed in a region that overlaps the semiconductor device PKG in plan view. Therefore, the size of the wiring board does not become large, either. As a result, it is possible to prevent the increase of the designing cost and the manufacturing cost of the semiconductor device and the wiring board.

Hereinafter, a relationship between the attenuation factor and the input frequency in the noise filter FIL according to the first embodiment will be examined. As shown in FIG. 12, in the first embodiment, the electrode CE1 that composes the capacitor DC1 is connected to the metal plate MP1, and the electrode CD that composes the capacitor DC1 is connected to the terminal to which the ground potential is supplied. In the first embodiment, the metal plate MP1 is present between the capacitor DC1 and the semiconductor chip CPH. Here, the metal plate MP1 has the wiring width wider than those of the wirings WR102 and WR103 of the above-described second and third examination examples. Therefore, the parasitic resistance and the parasitic inductance which are derived from the metal plate MP1 are smaller than the parasitic resistance and the parasitic inductance which are derived from the wirings WR102 and WR103. Specifically, in the capacitor DC102 of the second examination example, the parasitic resistance is 0.1 Ω and the parasitic inductance is 1.7 nH, and in the capacitor DC103 of the third examination example, the parasitic resistance is 0.2 Ω and the parasitic inductance is 2 nH. Meanwhile, in the capacitor DC1 according to the first embodiment, the parasitic resistance is 0.01 Ω and the parasitic inductance is 0.09 nH.

Moreover, as the capacitance in the capacitor DC1 according to the first embodiment, three cases of (1) 1 nF, (2) 0.1 nF and (3) 15 pF have been examined. In the case where (1) the capacitance of the capacitor DC1 is 1 nF, the capacitance of 1 nF is the same value as the capacitances of the capacitors DC101, DC102 and DC103 of the first to third examination examples, and the capacitor DC1 is different from the capacitors DC101, DC102 and DC103 in terms of only the parasitic resistance and the parasitic inductance.

As shown in FIG. 13, in the case where the capacitance of the capacitor DC1 according to the first embodiment is 1 nF, when the input frequency becomes higher than 1 MHz, S21 becomes smaller, that is, the attenuation factor becomes larger. At a point where the input frequency is approximately 500 MHz, S21 takes a minimum value. Further, when the input frequency becomes higher than 500 MHz, S21 becomes larger, that is, the attenuation factor becomes smaller. However, in a range where the input frequency is 500 MHz to 10 GHz, S21 maintains to be substantially −20 dB or less.

Next, in the case where the capacitance of the capacitor DC1 according to the first embodiment is 0.1 nF, when the input frequency becomes higher than 10 MHz, S21 becomes smaller, that is, the attenuation factor becomes larger. At a point where the input frequency is approximately 2 GHz, S21 takes a minimum value. Further, when the input frequency becomes higher than 2 GHz, S21 becomes larger, that is, the attenuation factor becomes smaller. However, in the range where the input frequency is 1 GHz to 10 GHz, S21 is smaller than −10 dB.

Next, in the case where the capacitance of the capacitor DC1 according to the first embodiment is 15 pF, when the input frequency becomes higher than 100 MHz, S21 becomes smaller, that is, the attenuation factor becomes larger. At a point where the input frequency is approximately 4 GHz, S21 takes a minimum value. Further, when the input frequency becomes higher than 4 GHz, S21 becomes larger, that is, the attenuation factor becomes smaller. However, in the range where the input frequency is 1 GHz to 10 GHz, S21 is smaller than −10 dB.

Hereinafter, a relationship between the attenuation factor and the input frequency in the noise filter FIL1 according to the first embodiment will be examined. In the first embodiment, the parasitic resistance (0.01 Ω) and the parasitic inductance (0.09 nH) which are derived from the metal plate MP1 are present between the capacitor DC1 and the semiconductor chip CPH. Values of the parasitic resistance and the parasitic inductance in the first embodiment are smaller than values of the parasitic resistance and the parasitic inductance in the second examination example and the third examination example. Therefore, as shown in FIG. 13, in the first embodiment, even if the input frequency becomes higher than 100 MHz, the impedance component of the parasitic inductance does not become large, and the attenuation factor does not become small unlike the second examination example and the third examination example. Particularly, in the first embodiment, in the range where the input frequency is 1 GHz to 10 GHz, S21 is smaller than −10 dB. In this way, as mentioned above, even if the scope of regulation of the EMI/EMS is expanded to the frequency band of 1 GHz to 6 GHz in the future, the noise filter FIL1 according to the first embodiment can meet this regulation.

Note that, though the case where the noise filter circuit is disposed in the power source path for supplying power from the basic power supply to the electronic components has been described as an example in the first embodiment, the first embodiment is not limited to this. For example, by changing the connecting method of the semiconductor chip in the semiconductor device, the noise filter circuit can be disposed in a signal transmission path from the control circuit in the semiconductor device to the control circuit provided outside the semiconductor device. Moreover, it is also possible to dispose the noise filter circuit in a power supply path for supplying AC power from the inverter circuit to the motor and the like connected to the inverter circuit.

Specifically, though the case where the electrode CE1 that composes the capacitor DC1 is connected to the power supply VIN and the electrode CD that composes the capacitor DC1 is connected to the ground GND has been described as an example in the first embodiment, the first embodiment is not limited to this. Meanwhile, the electrode CE1 may be connected to the power supply VIN and the electrode CD may be connected to a signal. Moreover, the electrode CE1 maybe connected to the signal and the electrode CD may be connected to the power supply VIN or the ground GND, or alternatively, the electrode CE1 maybe connected to the ground GND and the electrode CD may be connected to the power supply VIN or the signal.

Here, the thicknesses of the electrode CE1 and the electrode CD which compose the capacitor DC1 will be described. The thicknesses of the electrode CE1 and the electrode CD can be determined on the basis of skin depth (skin thickness) from a viewpoint of electromagnetic wave shielding. First, the skin depth is represented by a distance in which an electromagnetic wave incident onto a conductor is attenuated to 1/e (e is a natural logarithm). A relationship between the skin depth d and the frequency f (angular frequency ω) can be obtained by $d=(\rho/\pi f \mu)^{1/2}=(2\rho/\omega\mu)^{1/2}$. Here, $\rho$ is an electrical resistivity of the conductor and $\mu$ is an absolute permeability. In a case where copper is used for the conductor, the skin depth d becomes 20 μm when the frequency f is set to 10 MHz, and the skin depth d becomes 2 μm when the frequency f is set to 1 GHz. Since the electromagnetic wave to be shielded cannot enter more deeply than the skin depth of the conductor, a shield effect is the same even if the conductor is thickened to the skin depth or more. Hence, it is seen that a thickness substantially equivalent to the skin depth is enough to obtain a high shielding effect. Therefore, as mentioned above, when a frequency band of 1 GHz is taken as a target, the thicknesses of the electrode CE1 and the electrode CD are preferably 2 μm or more. Note that a design thickness of the electrode CE1 is preferably 3 μm or more in consideration of variations when the electrode CE1 is formed.

Meanwhile, as mentioned above, when the thickness of each of the electrode CE1 and the electrode CD is increased too much, the parasitic resistance and the parasitic inductance which are derived from the electrode CE1 and the electrode CD are increased in the capacitor DC1. Therefore, the thickness of each of the electrode CE1 and the electrode CD is preferably 100 μm or less, more preferably 50 μm or less.

<Modified Example of First Embodiment>

Figure 14:
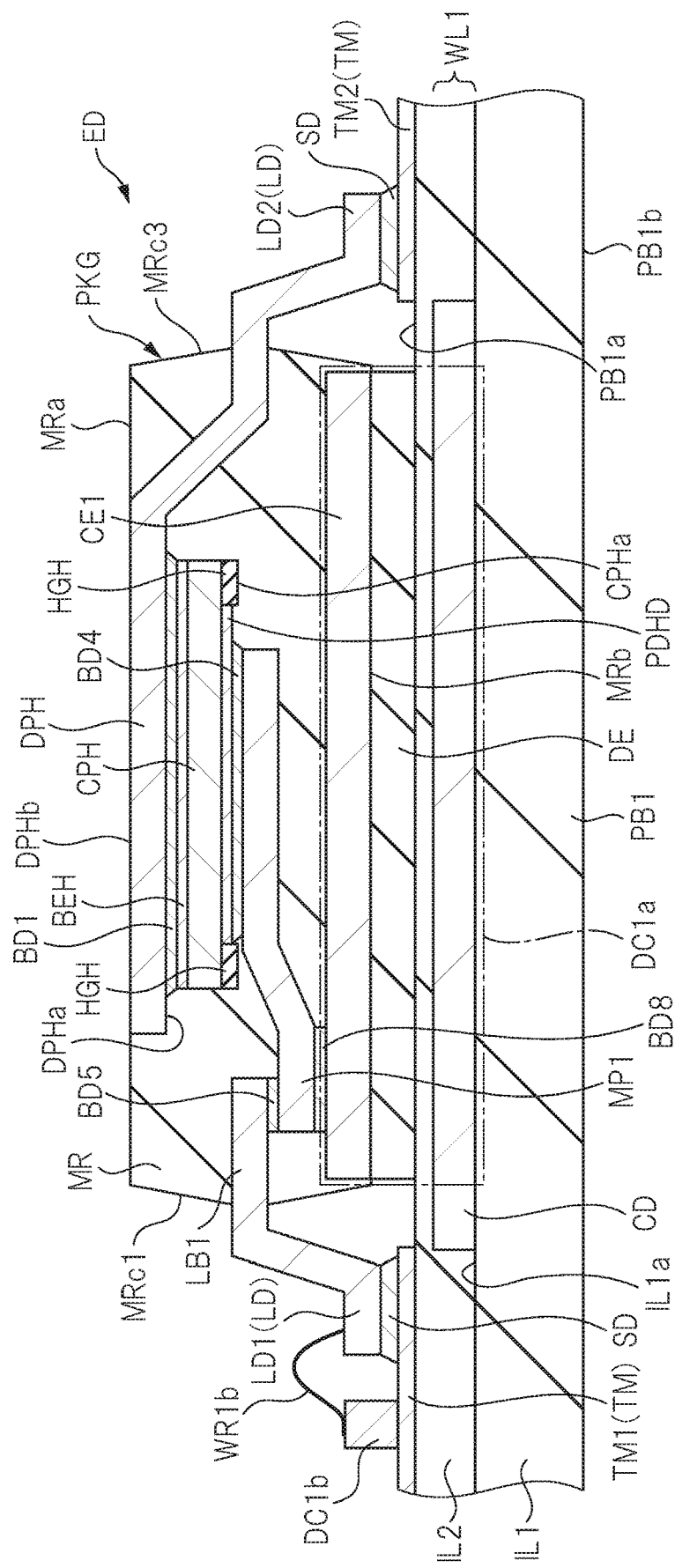
FIG. 14 is a cross-sectional view in which an electronic device according to a first modified example is cut at a position corresponding to the line A1-A1 of FIG. 1.
Figure 15:
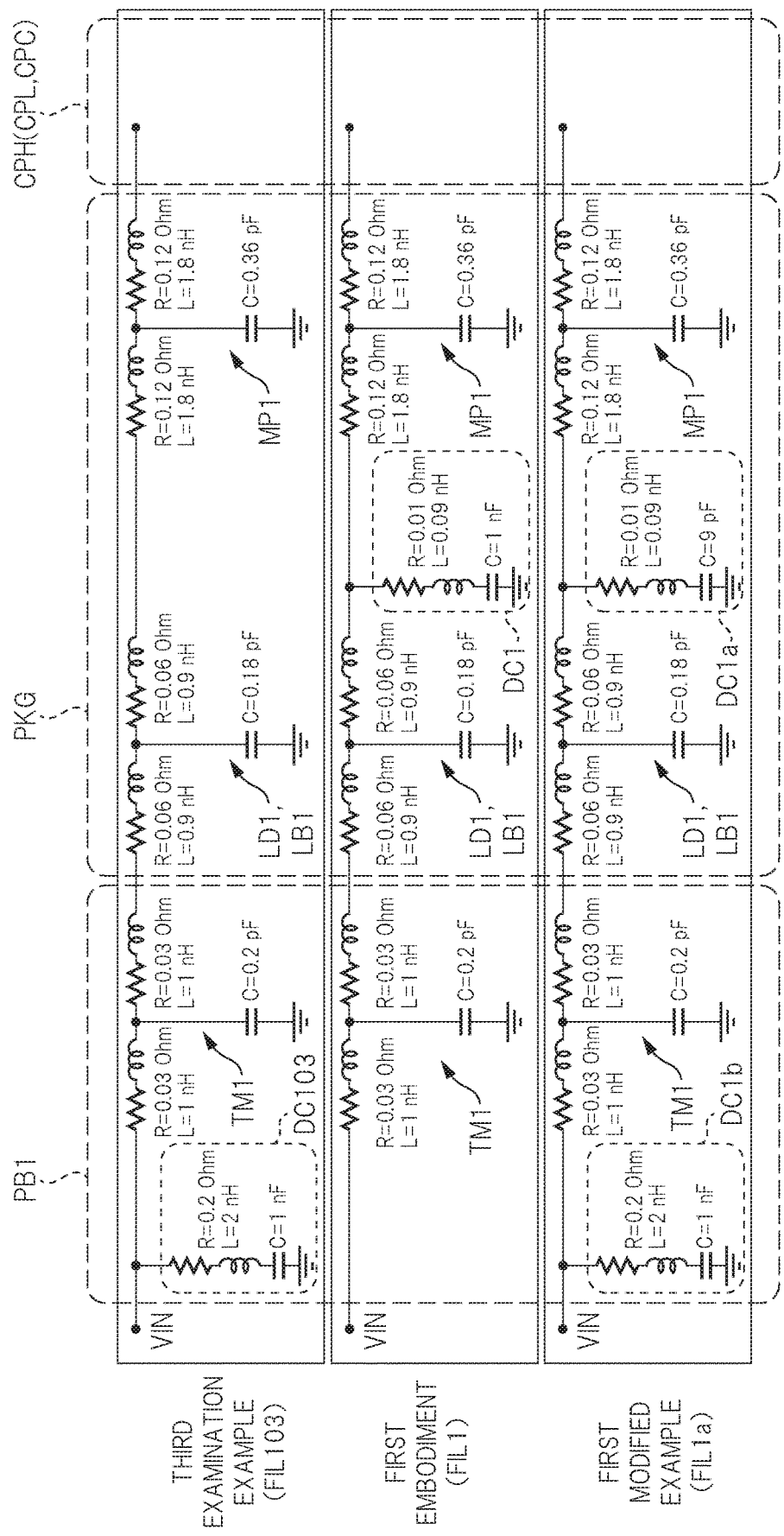
FIG. 15 is a circuit diagram showing noise filters included in the electronic devices according to the third examination example, the embodiment and the first modified example.

Hereinafter, a configuration of an electronic device according to a modified example (hereinafter, a first modified example) of the above-described first embodiment will be described with reference to FIG. 14 and FIG. 15. FIG. 14 is a cross-sectional view in which the electronic device according to the first modified example is cut at a position corresponding to the line A1-A1 of FIG. 1. FIG. 15 is a circuit diagram showing noise filters according to the third examination example, the above-described first embodiment and the first modified example.

As shown in FIG. 14, in the first modified example, similarly to the above-described first embodiment, a noise filter FIL1a is connected between the semiconductor chip CPH and the power supply (input power supply) provided outside the semiconductor device PKG. The noise filter FIL1a includes capacitors DC1a and DC1b. The capacitor DC1a has a similar configuration to that of the capacitor DC1 according to the above-described first embodiment. Namely, the capacitor DC1a is composed of the electrode CE1, the electrode CD disposed to face the electrode CE1, and the insulating layer IL2 and the insulating material DE which are disposed between the electrode CE1 and the electrode CD.

Moreover, for example, the capacitor DC1b is a decoupling capacitor, and has a similar configuration to that of the capacitor DC103 of the above-described third examination example. Namely, the capacitor DC1b is disposed on the wiring board PB1, and is connected to the terminal TM1 to which the power supply potential is supplied and the terminal (for example, the terminal TM4 (see FIG. 4)) to which the ground potential is supplied. Note that the capacitor DC1b is connected to the terminal TM1 through the lead LD1, and the capacitor DC1b and the lead LD1 are connected to each other by a wiring WR1b having a narrower wiring width than the metal plate MP1. Moreover, the capacitor DC1b and the terminal TM4 are connected to each other by a wiring (not shown) having the same wiring width as that of the wiring WR1b.

This is a difference between the noise filter FIL1a according to the first modified example and the noise filter FIL1 according to the above-described first embodiment. Other configurations of the noise filter FIL1a according to the first modified example are similar to those of the noise filter FIL1 according to the above-described first embodiment, and the repetitive description thereof will be omitted.

Note that, as shown in FIG. 15, in the capacitor DC1a, a parasitic resistance is 0.01 Ω and a parasitic inductance is 0.09 nH (see the capacitor DC1 according to the first embodiment). Moreover, a capacitance of the capacitor DC1a is 9 pF. Also, in the capacitor DC1b, a parasitic resistance is 0.2 Ω and a parasitic inductance is 2 nH (see the capacitor DC103 of the third examination example). Moreover, a capacitance of the capacitor DC1b is 1 nF.

Figure 16:
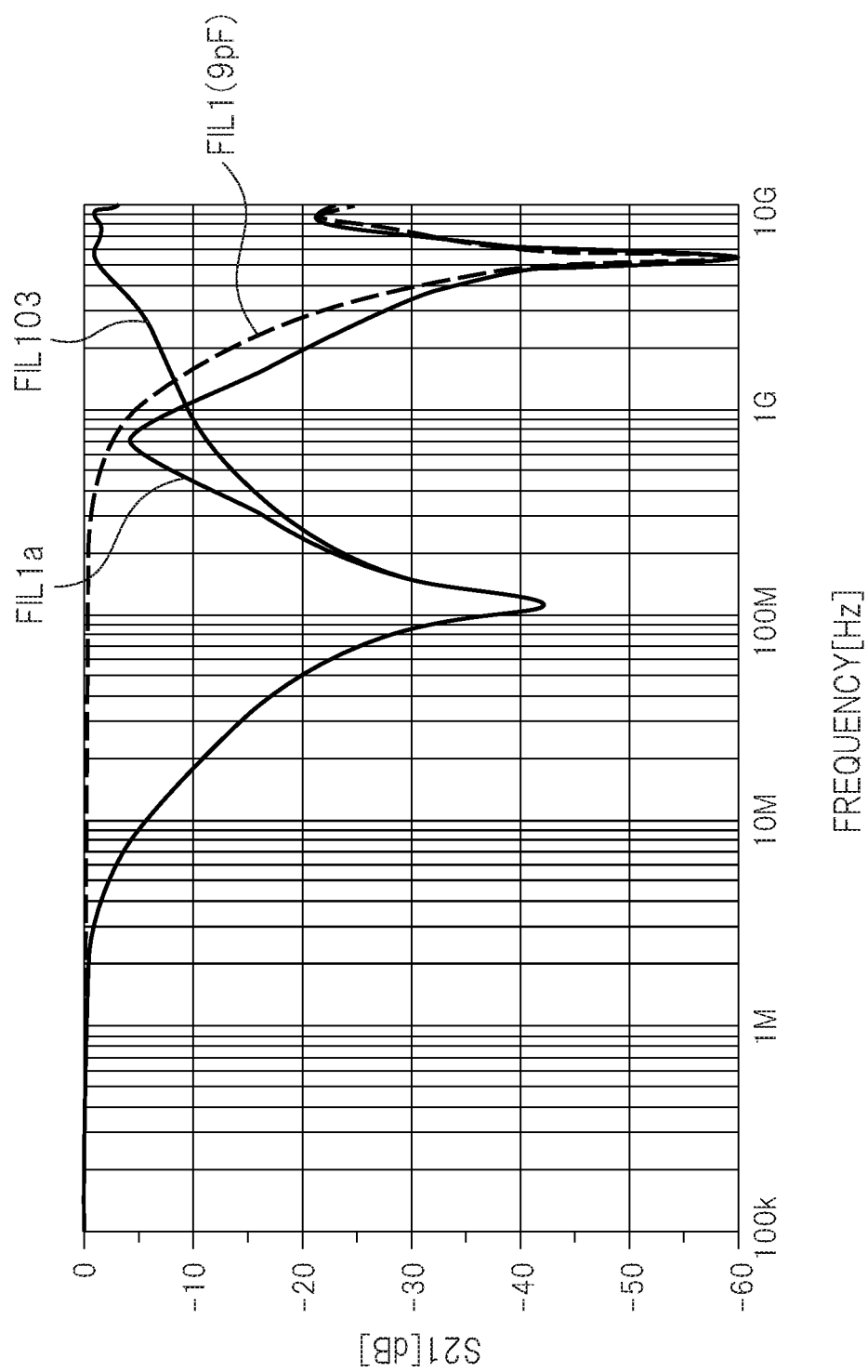
FIG. 16 is a graph showing attenuation factors with respect to input frequencies in the noise filters included in the electronic devices according to the third examination example, the embodiment and the first modified example.

Here, a relationship between an attenuation factor and an input frequency in the noise filter FIL1a according to the first modified example will be described. FIG. 16 is a graph showing the attenuation factors with respect to the input frequencies in the noise filters according to the first modified example, the first embodiment and the third examination example. For comparison, a case of the capacitor DC1 (capacitance of 9 pF) according to the above-described first embodiment and a case of the capacitor DC103 of the above-described third examination example will also be described.

As shown in FIG. 16, in the noise filter FIL1 including the capacitor DC1 (capacitance of 9 pF) according to the above-described first embodiment having a similar configuration to that of the capacitor DC1a according to the first modified example, when the input frequency becomes higher than 100 MHz in the capacitor DC1a according to the first modified example, S21 becomes smaller, that is, the attenuation factor becomes larger. At a point where the input frequency is approximately 5 GHz, S21 takes a minimum value. Further, when the input frequency becomes higher than 5 GHz, S21 becomes larger, that is, the attenuation factor becomes smaller. However, in a range where the input frequency is approximately 1.7 GHz to 10 GHz, S21 is smaller than −10 dB.

Moreover, in the noise filter FIL103 including the capacitor DC103 of the above-described third examination example having a similar configuration to that of the capacitor DC1b according to the first modified example, when the input frequency becomes higher than 1 MHz, S21 becomes smaller, that is, the attenuation factor becomes larger. However, at a point where the input frequency is approximately 100 MHz, S21 takes a minimum value, and when the input frequency becomes higher than 100 MHz, S21 becomes larger, that is, the attenuation factor becomes smaller.

Here, in the noise filter FIL1a including the capacitors DC1a and DC1b according to the first modified example, first, when the input frequency becomes higher than 1 MHz, S21 becomes smaller, that is, the attenuation factor becomes larger. Further, at a point where the input frequency is approximately 100 MHz, S21 takes a minimum value, and when the input frequency becomes higher than 100 MHz, S21 becomes larger, that is, the attenuation factor becomes smaller. Thereafter, at a point where the input frequency is approximately 700 Hz, S21 takes a maximum value, and S21 becomes smaller again, that is, the attenuation factor becomes larger again. Then, at a point where the input frequency is approximately 5 GHz, S21 takes a minimum value. Further, when the input frequency becomes higher than 5 GHz, S21 becomes larger, that is, the attenuation factor becomes smaller. From these results, it is seen that the noise in the range of 10 MHz to 1 GHz can be reduced by the capacitor DC1b and the noise in the range of 1 GHz to 10 GHz can be reduced by the capacitor DC1a in the first modified example.

Hence, the noise filter FIL1a according to the first modified example can increase the attenuation factor in both of the frequency domain where the attenuation factor is increased by the capacitor DC1 according to the above-described first embodiment and the frequency domain where the attenuation factor is increased by the capacitor DC103 of the above-described third examination example.

As mentioned above, in order to reduce the cut-off frequency of the noise filter as much as possible, it is necessary to increase the capacitance of the capacitor that composes the noise filter. In order to increase the capacitance of the capacitor, it is necessary to (1) increase the area S of the electrodes, (2) reduce the distance d between the electrodes, and (3) increase the relative dielectric constant $\varepsilon_r$ of the substance present between the electrodes. Here, it is not easy to change (1) the area S of the electrodes and (2) the distance d between the electrodes because it is necessary to increase the sizes of the semiconductor device and the wiring board and change the design thereof. Therefore, in the above-described first embodiment, in order to (3) increase the relative dielectric constant $\varepsilon_r$ of the substance present between the electrodes, the insulating material DE is disposed between the main surface PB1a of the wiring board PB1 and the back surface MRb of the sealing body MR of the semiconductor device PKG. However, as mentioned above, in order to dispose the insulating material DE, it is necessary to inject the insulating material after the semiconductor device PKG is mounted on the wiring board PB1.

In the first modified example, the capacitor DC1a whose capacitance (9 pF) is small and whose parasitic resistance (0.01 Ω) and parasitic inductance (0.09 nH) are small and the capacitor DC1b whose capacitance (1 nF) is large and whose parasitic resistance (0.2 Ω) and parasitic inductance (2 nH) are large are combined with each other. In this way, it becomes unnecessary to inject the insulating material later in the capacitor DC1a in order to increase the capacitance of the capacitor DC1a. As described above, the first modified example is more advantageous than the above-described first embodiment in that the attenuation factor can be increased in the wide frequency domain and a post injection step of the insulating material is unnecessary, so that the manufacturing cost can be reduced by that amount.

Meanwhile, the above-described first embodiment is more advantageous than the first modified example in that it is unnecessary to mount the capacitor DC1b on the wiring board, so that the manufacturing cost can be reduced by that amount.

Second Embodiment

Figure 17:
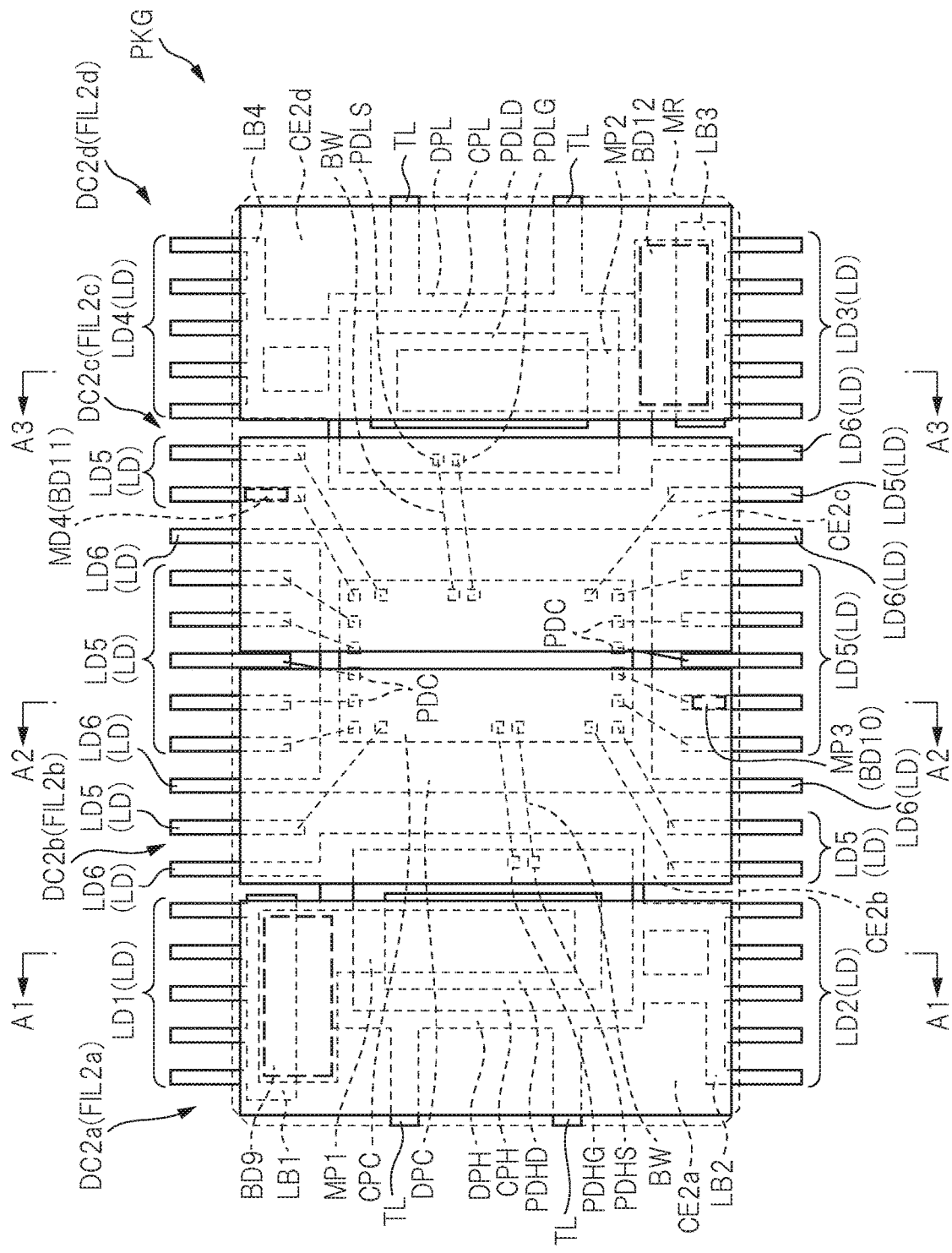
FIG. 17 is a plan perspective view in which a semiconductor device mounted on an electronic device according to a second embodiment is viewed from a lower surface thereof.
Figure 18:
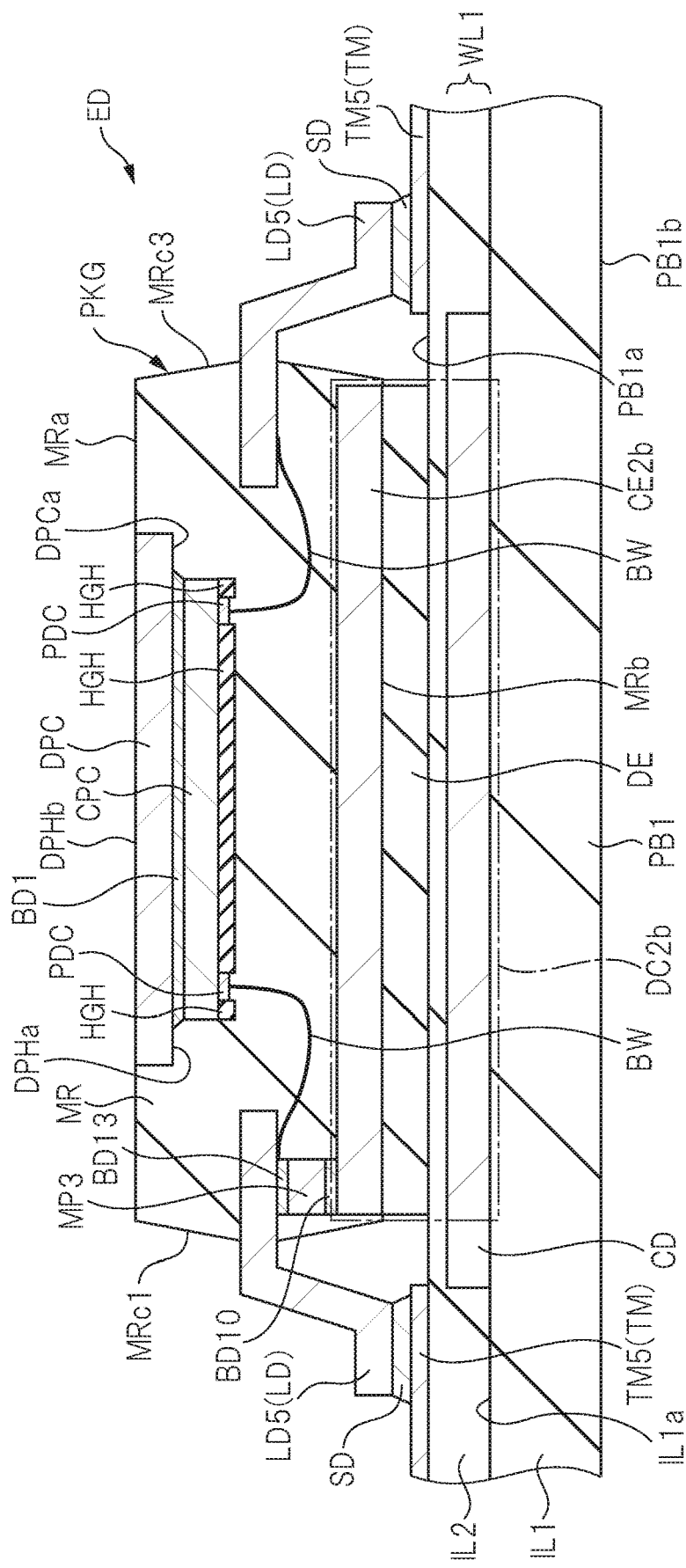
FIG. 18 is a cross-sectional view in which the electronic device according to the second embodiment is cut at a position corresponding to a line A2-A2 of FIG. 17.
Figure 19:
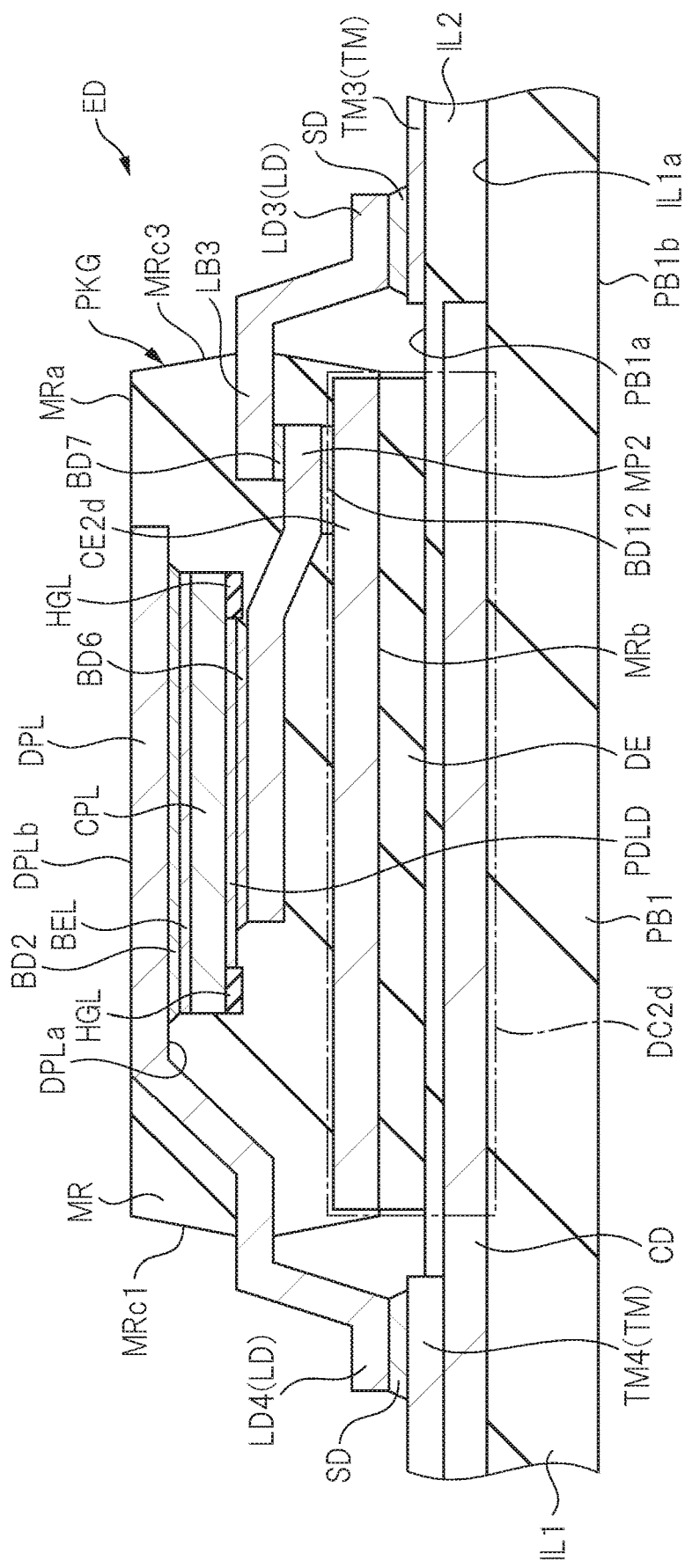
FIG. 19 is a cross-sectional view in which the electronic device according to the second embodiment is cut at a position corresponding to a line A3-A3 of FIG. 17.
Figure 20:
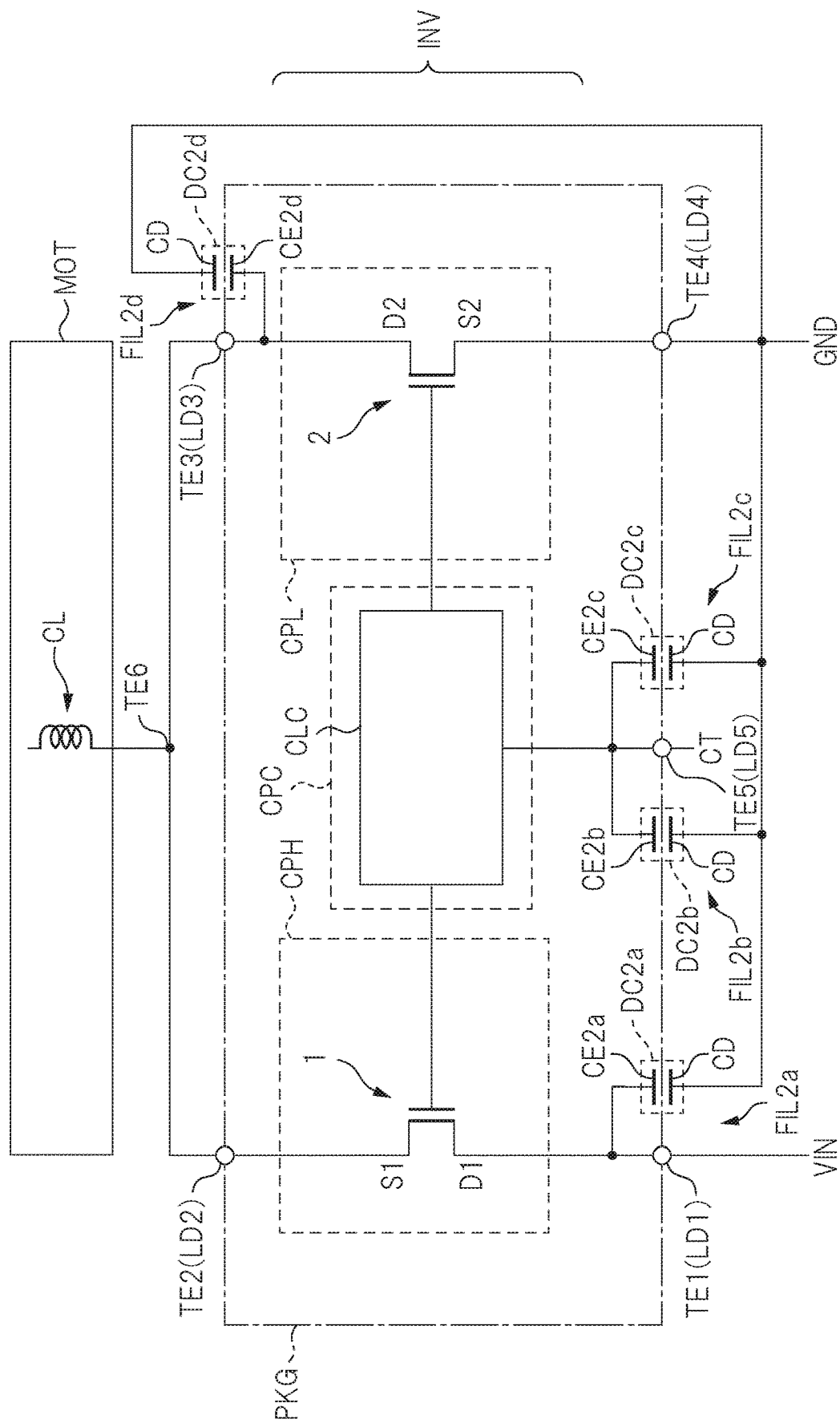
FIG. 20 is a circuit diagram showing an inverter circuit included in the electronic device according to the second embodiment.

Hereinafter, a configuration of an electronic device according to a second embodiment will be described with reference to FIG. 17 to FIG. 20. FIG. 17 is a plan perspective view in which a semiconductor device PKG according to the second embodiment is viewed from a lower surface thereof through the sealing body MR. FIG. 18 is a cross-sectional view in which the electronic device ED shown in FIG. 17 is cut at a position corresponding to a line A2-A2 of FIG. 17. FIG. 19 is a cross-sectional view in which the electronic device ED shown in FIG. 17 is cut at a position corresponding to a line A3-A3 of FIG. 17. FIG. 20 is a circuit diagram showing an inverter circuit included in the electronic device ED according to the second embodiment.

As shown in FIG. 20, the noise filter according to the second embodiment is composed of noise filters FIL2a, FIL2b, FIL2c and FIL2d. The noise filter FIL2a is connected between the semiconductor chip CPH and the power supply (input power supply) provided outside the semiconductor device PKG. The noise filters FIL2b and FIL2c are connected between the semiconductor chip CPC and the control circuit CT provided outside the semiconductor device PKG. The noise filter FIL2d is connected between the semiconductor chip CPL and the coil CL and the like included in the motor MOT.

Though not shown, the noise filter FIL2a includes the terminal TM1, the lead LD1 and the lead coupling portion LB1 (see FIG. 2) connected to the terminal TM1, the metal plate MP1 connected to the lead coupling portion LB1 with the adhesive layer BD5 interposed therebetween, and a capacitor DC2a. The capacitor DC2a is composed of an electrode (first conductor member) CE2a, the electrode CD disposed to face the electrode CE2a, and the insulating material DE disposed between the electrode CE2a and the electrode CD. Namely, as seen from comparison between FIG. 17 and FIG. 6, the electrode CE2a of the noise filter FIL2a is different from the electrode CE1 of the noise filter FIL1 according to the above-described first embodiment, but other configurations of the noise filter FIL2a are the same as those of the noise filter FIL1 (see FIG. 2).

Moreover, as shown in FIG. 18, the noise filter FIL2b includes the terminal TM5, the lead LD5 connected to the terminal TM5, the wire BW that connects the lead LD5 and the pad PDC of the semiconductor chip CPC to each other, and the capacitor DC2b. As shown in FIG. 18, the capacitor DC2b is composed of an electrode (second conductor member) CE2b, the electrode CD disposed to face the electrode CE2b, and the insulating material DE disposed between the electrode CE2b and the electrode CD.

Though not shown, the noise filter FIL2c includes the terminal TM5 (see FIG. 18), the lead LD5 (see FIG. 18) connected to the terminal TM5, the wire BW (see FIG. 18) that connects the lead LD5 and the pad PDC of the semiconductor chip CPC to each other, and the capacitor DC2c. The capacitor DC2c is composed of an electrode (third conductor member) CE2c, the electrode CD disposed to face the electrode CE2c, and the insulating material DE disposed between the electrode CE2c and the electrode CD.

As shown in FIG. 19, the noise filter FIL2d includes the terminal TM3, the lead LD3 and the lead coupling portion LB3 which are connected to the terminal TM3, the metal plate MP2 connected to the lead coupling portion LB3 with the adhesive layer BD7 interposed therebetween, and a capacitor DC2d. The capacitor DC2d is composed of an electrode (fourth conductor member) CE2d, the electrode CD disposed to face the electrode CE2d, and the insulating material DE disposed between the electrode CE2d and the electrode CD.

As shown in FIG. 17, the electrodes CE2a, CE2b, CE2c and CE2d are disposed inside the sealing body MR of the semiconductor device PKG. Note that the electrodes CE2a, CE2b, CE2c and CE2d may have portions which protrude to the outside of the sealing body MR of the semiconductor device PKG.

Moreover, the electrode CE2a is bonded and electrically connected to the metal plate MP1 with an adhesive layer BD9 interposed therebetween. The electrode CE2b is bonded and electrically connected to the metal plate MP3 with an adhesive layer BD10 interposed therebetween. The metal plate MP3 is bonded and electrically connected to the leads LD5 with an adhesive layer BD13 interposed therebetween.

The electrode CE2c is bonded and electrically connected to the metal plate MP4 with an adhesive layer BD11 interposed therebetween. The metal plate MP4 is bonded and electrically connected to the lead LD5 with an adhesive layer (not shown) interposed therebetween. The electrode CE2d is bonded and electrically connected to the metal plate MP2 with an adhesive layer BD12 interposed therebetween.

A distance between the electrode CE2a and the electrode CD is shorter than the distance between the metal plate MP1 and the electrode CD (the electrode CE2a is closer to the electrode CD than the metal plate MP1 is). A distance between the electrode CE2b and the electrode CD is shorter than a distance between the metal plate MP3 and the electrode CD (the electrode CE2b is closer to the electrode CD than the metal plate MP3 is). A distance between the electrode CE2c and the electrode CD is shorter than a distance between the metal plate MP4 and the electrode CD (the electrode CE2c is closer to the electrode CD than the metal plate MP4 is). A distance between the electrode CE2d and the electrode CD is shorter than a distance between the metal plate MP2 and the electrode CD (the electrode CE2d is closer to the electrode CD than the metal plate MP2 is).

As mentioned above, the electrode CD is disposed inside the insulating layer IL2 of the wiring board PB1, and is connected to the terminal TM4 of the wiring board PB1. Moreover, the potential (power supply potential) VIN is supplied to the terminal TM1 through the wiring and the like of the wiring board PB1. The ground potential GND is supplied to the terminal TM4 through the wiring and the like of the wiring board PB1. The terminal TM3 is electrically connected to the motor (coil CL in FIG. 4) through the wiring and the like of the wiring board PB1. The terminal TM5 is electrically connected to the control circuit CT, which is provided outside the semiconductor device PKG, through the wiring and the like of the wiring board PB1.

Moreover, the metal plate MP1 is connected to the drain pad PDHD of the semiconductor chip CPH with the adhesive layer BD4 interposed therebetween. The metal plate MP2 is connected to the drain pad PDLD of the semiconductor chip CPL with the adhesive layer BD6 interposed therebetween.

For example, a plane shape of each of the electrodes CE2a, CE2b, CE2c and CE2d is rectangular. The electrodes CE2a, CE2b, CE2c and CE2d are disposed inside the sealing body MR of the semiconductor device PKG, and it is preferable that the electrodes CE2a, CE2b, CE2c and CE2d are located close to the back surface MRb of the sealing body MR and the distances thereof to the electrode CD of the wiring board PB1 are set as short as possible. Note that the electrodes CE2a, CE2b, CE2c and CE2d may be exposed from the back surface MRb of the sealing body MR. For example, a thickness of each of the electrodes CE2a, CE2b, CE2c and CE2d is 50 μm. Moreover, it is preferable that an area of each of the electrodes CE2a, CE2b, CE2c and CE2d is, for example, 20.25 mm$^2$ or more.

The adhesive layers BD9, BD10, BD11, BD12 and BD13 are made of a conductive bonding material (adhesive), and a paste-type conductive adhesive material such as silver paste, solder or the like can be used.

The metal plates MP3 and MP4 are conductor plates made of a conductor, and are preferably formed of highly conductive and thermal conductive metal (metal material) such as copper (Cu), a copper (Cu) alloy, aluminum (Al) and an aluminum (Al) alloy. Dimensions (widths) of each of the metal plates MP3 and MP4 in the X direction and the Y direction are respectively larger than the diameter of the wire BW.

Here, capacitances of the capacitors DC2a, DC2b, DC2c and DC2d will be described by taking the capacitor DC2a as an example. The description will be given by taking a case where the electrode CE2a is exposed from the back surface MRb of the sealing body MR and the insulating layer IL2 and the insulating material DE are present between the electrode CD and the electrode CE2a as an example.

It is assumed that an area S of a portion where the electrode CE2a and the electrode CD overlap each other is 20.25 mm$^2$ in plan view. Further, it is assumed that a distance between the main surface PB1a of the wiring board PB1 and the back surface MRb of the sealing body MR of the semiconductor device PKG, that is, the thickness of the insulating material DE is 80 μm. Moreover, it is assumed that the thickness of the insulating layer IL2 present on the electrode CD is 20 μm in the wiring board PB1. Also, it is assumed that the relative dielectric constant of the insulating material DE is 7 and the relative dielectric constant of the insulating layer IL2 is 4.4. In this case, the capacitance C of the capacitor DC2a is 11 pF. Also, in a case where the distance between the main surface PB1a of the wiring board PB1 and the back surface MRb of the sealing body MR of the semiconductor device PKG, that is, the thickness of the insulating material DE is 45 μm, the capacitance C of the capacitor DC2a is 16 pF.

This is a difference between the noise filters FIL2a, FIL2b, FIL2c and FIL2d according to the second embodiment and the noise filter FIL1 according to the above-described first embodiment. Other configurations of the noise filters FIL2a, FIL2b, FIL2c and FIL2d according to the second embodiment are similar to those of the noise filter FIL1 according to the above-described first embodiment, and the repetitive description thereof will be omitted.

Since the configuration described above is adopted in the second embodiment, the reliability of the electronic device can be enhanced. Hereinafter, reasons therefor will be specifically described.

As mentioned above, in the electronic device having, for example, the inverter circuit for driving the motor, the inventor of the present invention has examined the suppression of unnecessary electromagnetic wave noise generated inside the electronic device and external noise that propagates from an outside and enters an inside of the electronic device. In this case, it is conceivable to dispose the noise filter circuit in the signal transmission path from the control circuit in the semiconductor device to the control circuit provided outside the semiconductor device, other than the case where the noise filter circuit is disposed in the power source path for supplying power from the basic power supply to the electronic components as in the first embodiment. Similarly, it is also conceivable to dispose the noise filter circuit in the power supply path for supplying AC power from the inverter circuit to the motor and the like connected to the inverter circuit.

Therefore, as shown in FIG. 20, the noise filter according to the second embodiment is composed of the noise filters FIL2a, FIL2b, FIL2c and FIL2d. Also, the noise filter FIL2a is connected between the semiconductor chip CPH and the power supply (input power supply) provided outside the semiconductor device PKG. The noise filters FIL2b and FIL2c are connected between the semiconductor chip CPC and the control circuit CT provided outside the semiconductor device PKG. The noise filter FIL2d is connected between the semiconductor chip CPL and the coil CL and the like included in the motor MOT. In this way, it is possible to prevent the noise from propagating in the power source path, the signal transmission path, and the power supply path.

Moreover, in the second embodiment, similarly to the above-described first embodiment, a package with a so-called reverse bending structure is adopted, and thus an empty space where no member other than the sealing body MR is present is ensured near the back surface MRb of the sealing body MR of the semiconductor device PKG. As a result, the electrodes CE2a, CE2b, CE2c and CE2d can be disposed on a side of the back surface MRb of the sealing body MR of the semiconductor device PKG.

In addition, the semiconductor device PKG is a so-called reverse bending package in which the sealing body MR is disposed on the main surface (upper surface) PB1a of the wiring board PB1 so that the back surface MRb of the sealing body MR faces the main surface PB1a of the wiring board PB1. Therefore, the electrode CE1 can be disposed in the empty space, in which no member other than the sealing body MR is present, near the back surface MRb of the sealing body MR of the semiconductor device PKG, and the distances between the electrodes CE2a, CE2b, CE2c and CE2d disposed on a side of the back surface MRb of the sealing body MR of the semiconductor device PKG and the electrode CD disposed inside the insulating layer IL2 of the wiring board PB1 can be minimized.

Moreover, the insulating material (dielectric) DE can be disposed between the electrodes CE2a, CE2b, CE2c and CE2d and the electrode CD, that is, between the main surface PB1a of the wiring board PB1 and the back surface MRb of the sealing body MR of the semiconductor device PKG.

From the above, in the second embodiment, three conditions such as (1) the increase of the area S of the electrodes, (2) the reduction of the distance d between the electrodes, and (3) the increase of the relative dielectric constant $\varepsilon_r$ of the substance present between the electrodes can be satisfied, and as a result, the capacitance C of the capacitors DC2a, DC2b, DC2c and DC2d can be increased.

In addition, in the second embodiment, the electrodes CE2a, CE2b, CE2c and CE2d are disposed in the empty space, in which no member other than the sealing body MR is present, near the back surface MRb of the sealing body MR of the semiconductor device PKG, and thus the size of the semiconductor device as well as the size of the semiconductor chip is not increased. Also, in the wiring board PB1, the electrode CD is disposed in the region that overlaps the semiconductor device PKG in plan view. Therefore, the size of the wiring board does not become large, either. As a result, it is possible to prevent the increase of the designing cost and the manufacturing cost of the semiconductor device and the wiring board.

Particularly, in the second embodiment, the electrode CD is used as one electrode that composes each of the capacitors DC2a, DC2b, DC2c and DC2d. Moreover, the insulating material DE is used as the insulating material (dielectric) disposed between the electrodes CE2a, CE2b, CE2c and CE2d and the electrode CD. In this way, it is possible to suppress the increase of the size and the manufacturing cost of the semiconductor device and the wiring board.

Further, in the second embodiment, at least one electrode (electrode CE2a, CE2b, CE2c or CE2d) of the pair of electrodes which face each other and compose each of the capacitors DC2a, DC2b, DC2c and DC2d is disposed in the sealing body MR of the semiconductor device PKG. In this way, the connection distance between the one electrode that composes the capacitor and the main circuit can be reduced, so that the parasitic resistance and the parasitic inductance of the capacitor can be reduced in comparison with the above-described third examination example.

From the above, in the second embodiment, it is possible to prevent the noise from propagating in the signal transmission path and the power supply path other than the power source path without increasing the sizes of the semiconductor chip, the semiconductor device and the wiring board.

Meanwhile, since the capacitor DC1 according to the above-described first embodiment includes the electrode CE1 having an area equivalent to the total area of the electrodes CE2a, CE2b, CE2c and CE2d, the capacitance of the capacitor DC1 can be increased in comparison with the capacitors DC2a, DC2b, DC2c and DC2d according to the second embodiment. The above-described first embodiment is more advantageous than the second embodiment in this point.

Note that, as in the above-described first modified example, the capacitance of the capacitor that composes the noise filter can be increased by disposing the decoupling capacitor separately in the second embodiment.

Third Embodiment

Figure 21:
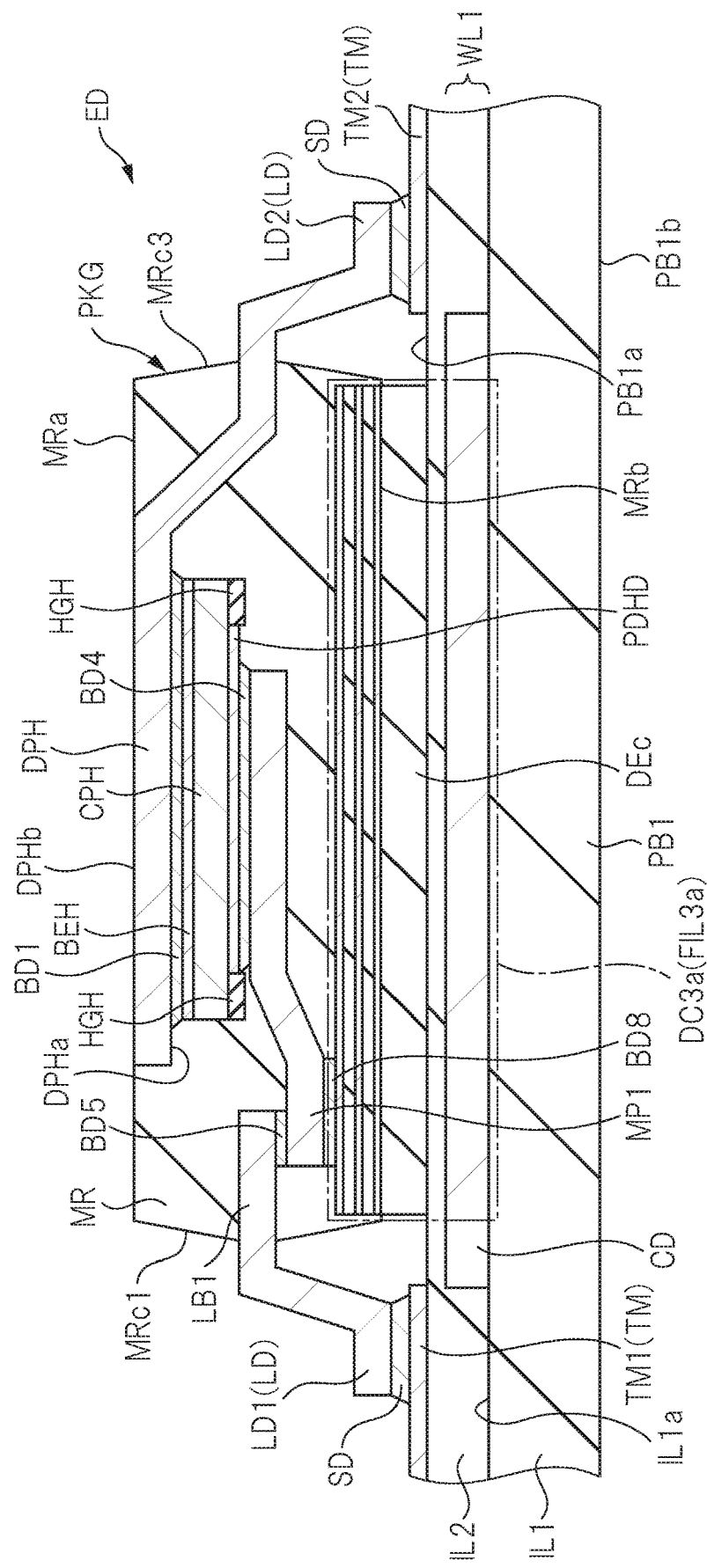
FIG. 21 is a cross-sectional view in which an electronic device according to a third embodiment is cut at a position corresponding to the line A1-A1 of FIG. 1.
Figure 22:
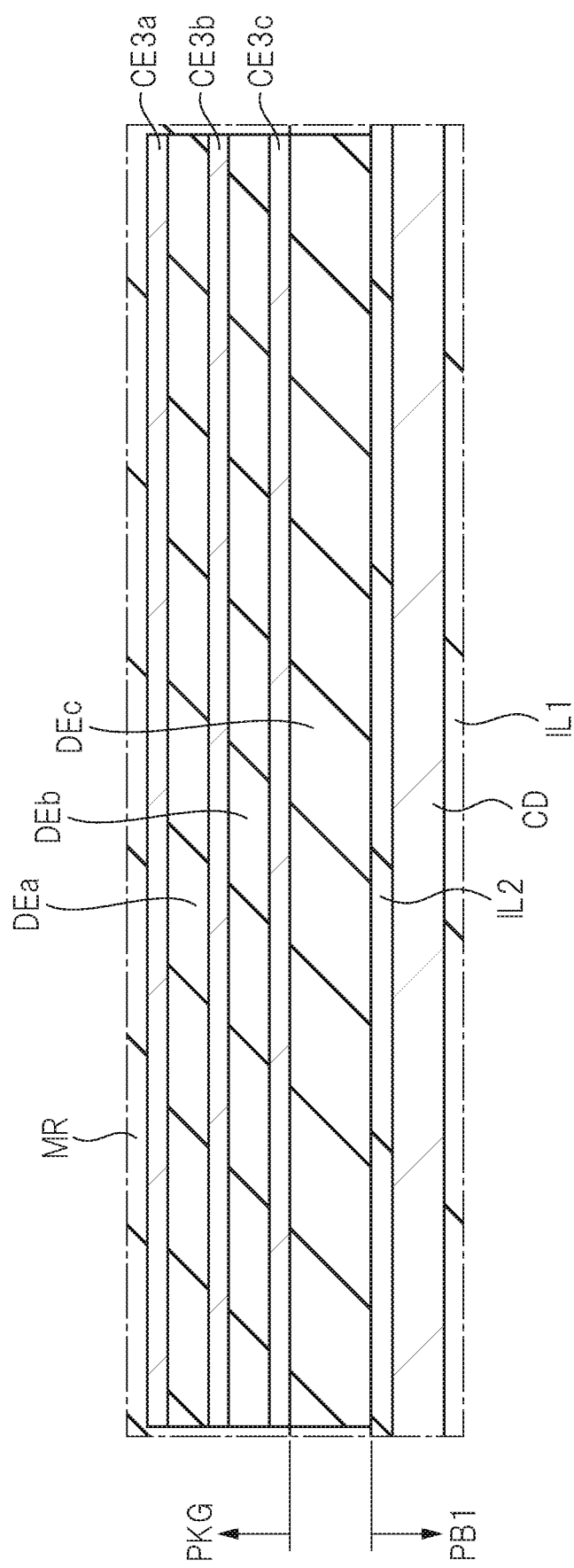
FIG. 22 is an enlarged cross-sectional view of a principal part of a capacitor according to the third embodiment shown in FIG. 21.

Hereinafter, a configuration of an electronic device according to a third embodiment will be described with reference to FIG. 21 and FIG. 22. FIG. 21 is a cross-sectional view in which the electronic device according to the third embodiment is cut at a position corresponding to the line A1-A1 of FIG. 1. FIG. 22 is a partially enlarged cross-sectional view showing a configuration of a capacitor DC3a according to the third embodiment.

As shown in FIG. 21 and FIG. 22, in the third embodiment, similarly to the above-described first embodiment, a noise filter FIL3a is connected between the semiconductor chip CPH and the power supply (input power supply) provided outside the semiconductor device PKG. The noise filter FIL3a includes the capacitor DC3a. The capacitor DC3a includes an electrode (sixth conductor member) CE3a, an electrode (fifth conductor member) CE3b disposed to face the electrode CE3a, an electrode (first conductor member) CE3c disposed to face the electrode CE3b, and the electrode CD disposed to face the electrode CE3c. Also, an insulating material (dielectric) DE3a is disposed between the electrode CE3a and the electrode CE3b, an insulating material (dielectric) DE3b is disposed between the electrode CE3b and the electrode CE3c, and an insulating material (dielectric) DE3c and the insulating layer IL2 are disposed between the electrode CE3c and the electrode CD.

A material that composes the insulating materials DE3a, DE3b and DE3c may be the same as the material that composes the insulating layer IL2 of the wiring board PB1; however, it is preferably a material having a higher relative dielectric constant than the material that composes the insulating layer IL2 of the wiring board PB1. In a case where the insulating layer IL2 is made of epoxy-based resin, a relative dielectric constant of the epoxy-based resin is approximately 4.4. Therefore, it is preferable that the material that composes the insulating materials DE3a, DE3b, and DE3c is, for example, urethane-based resin whose relative dielectric constant is approximately 7. In a case where the insulating material DE3c is not provided, air is present between the main surface PB1a of the wiring board PB1 and the back surface MRb of the sealing body MR of the semiconductor device PKG, but since air is also a kind of the insulating material, it can be regarded that an air layer is present in place of the insulating material DE3c.

The electrodes CE3a, CE3b and CE3c and the insulating materials DE3a and DE3b are disposed inside the sealing body MR of the semiconductor device PKG. Note that electrodes CE3a, CE3b and CE3c and the insulating materials DE3a and DE3b may have portions which protrude to the outside of the sealing body MR of the semiconductor device PKG.

The electrode CE3a is connected to the metal plate MP1 with the adhesive layer BD8 interposed therebetween. The potential (power supply potential) VIN is supplied to the electrode CE3c through the terminal TM1 and the like of the wiring board PB1. The ground potential GND is supplied to the electrode CE3b and the electrode CD through the terminal TM4 and the like of the wiring board PB1.

As a method for forming the electrodes CE3a, CE3b and CE3c and the insulating materials DE3a and DE3b, as mentioned above, the in-mold insert molding in which a flexible substrate having the electrodes CE3a, CE3b and CE3c and the insulating materials DE3a and DE3b is temporarily put in a molding die before the molding step and then the flexible substrate is sealed together with other members by the sealing body MR in the molding step is preferable. In this case, after the molding step, the electrode CE3a and the metal plate MP1 are electrically connected to each other by forming an opening (not shown) by laser or the like in a portion where the electrode CE3a and the metal plate MP1 are connected to each other and filling this opening with a conductor.

Here, a capacitance of the capacitor DC3a will be described. The description will be given by taking a case where the electrode CE3c is exposed from the back surface MRb of the sealing body MR and the insulating material DE3c and the insulating layer IL2 are present between the electrode CE3c and the electrode CD as an example.

It is assumed that an area of a portion where the electrode CE3a and the electrode CE3b overlap each other, an area of a portion where the electrode CE3b and the electrode CE3c overlap each other and an area of a portion where the electrode CE3c and the electrode CD overlap each other are respectively 85 mm$^2$ in plan view. Further, it is assumed that a distance between the main surface PB1a of the wiring board PB1 and the back surface MRb of the sealing body MR of the semiconductor device PKG, that is, a thickness of the insulating material DE3c is 80 µm and thicknesses of the insulating materials DE3a and DE3b are 50 µm. Moreover, it is assumed that thicknesses of the electrodes CE3a, CE3b and CE3c are respectively 25 µm. Also, it is assumed that the thickness of the electrode CD is 50 µm and the thickness of the insulating layer IL2 present on the electrode CD is 20 µm in the wiring board PB1. In addition, it is assumed that a relative dielectric constant of the insulating material DE3c is 7 and relative dielectric constants of the insulating layer IL2 and the insulating materials DE3a and DE3b are respectively 4.4. In this case, the capacitance C of the capacitor DC3a is 180 pF.

This is a difference between the noise filter FIL3a according to the third embodiment and the noise filter FIL1 according to the above-described first embodiment. Other configurations of the noise filter FIL3a according to the third embodiment are similar to those of the noise filter FIL1 according to the above-described first embodiment, and the repetitive description thereof will be omitted.

As mentioned above, in order to reduce the cut-off frequency as much as possible, it is necessary to increase the capacitance of the capacitor that composes the noise filter. Therefore, in the third embodiment, the electrodes CE3a, CE3b and CE3c are disposed in the semiconductor device PKG, and the capacitor DC3a is composed of the multilayered electrode. In this way, an effective area of the electrode that composes the capacitor DC3a can be made larger than that in the above-described first embodiment, so that the capacitance of the capacitor DC3a can be increased.

As described above, in the third embodiment, the capacitance of the capacitor that composes the noise filter can be increased without increasing the size of the semiconductor device PKG or separately disposing the decoupling capacitor. The third embodiment is more advantageous than the above-described first embodiment in this point.

Meanwhile, the above-described first embodiment is more advantageous than the third embodiment in that the configuration of the capacitor DC1 in the semiconductor device PKG is simpler than that in the third embodiment and it is thus possible to reduce the manufacturing cost.

<Modified Example of Third Embodiment>

Figure 23:
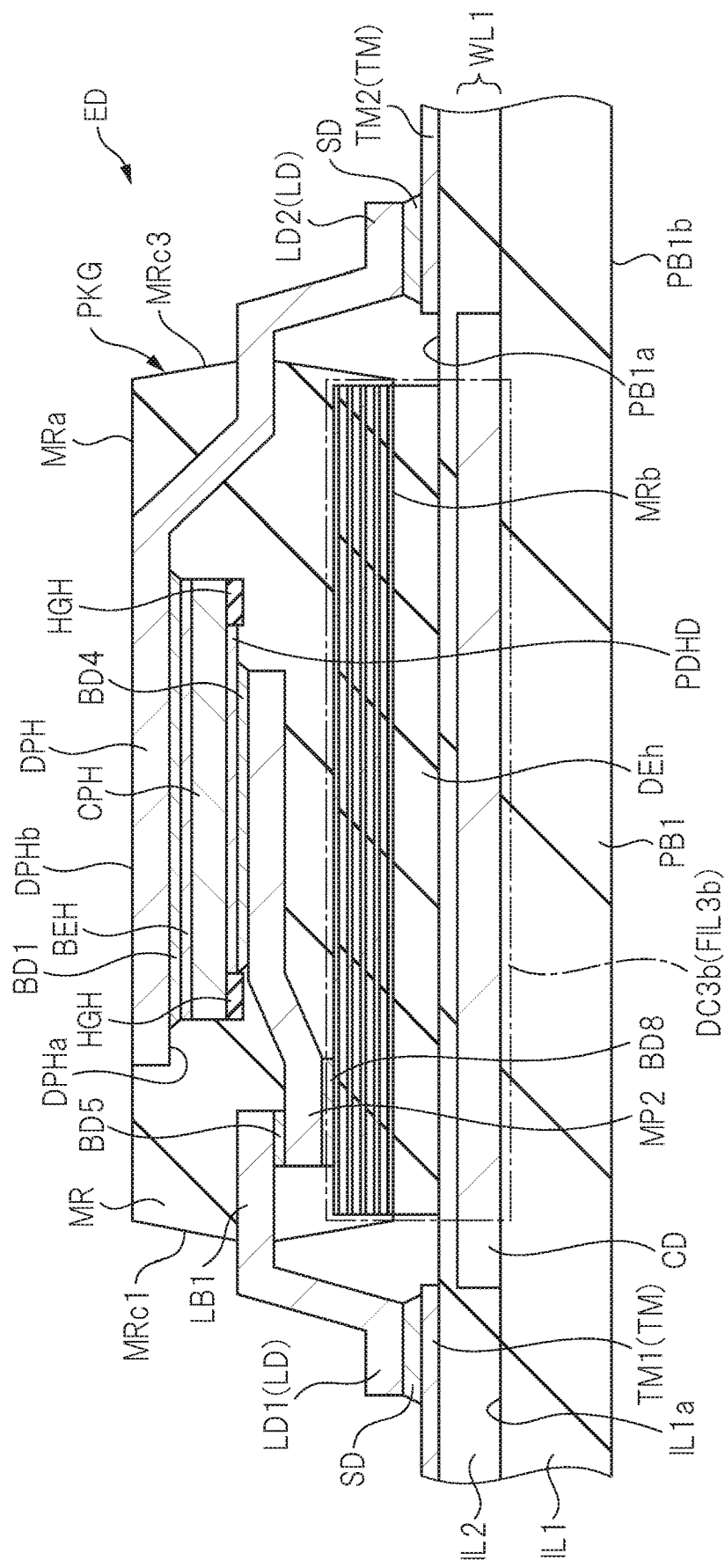
FIG. 23 is a cross-sectional view in which an electronic device according to a second modified example is cut at a position corresponding to the line A1-A1 of FIG. 1.
Figure 24:
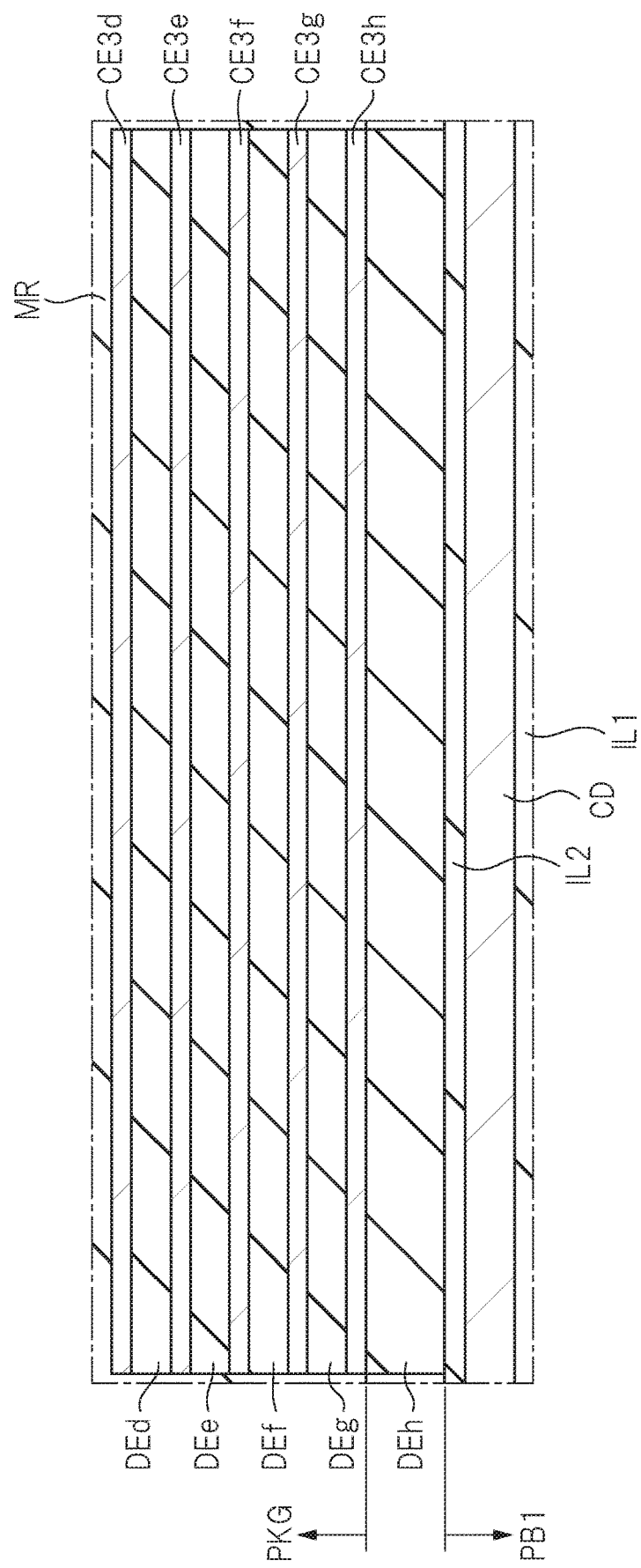
FIG. 24 is an enlarged cross-sectional view of a principal part of a capacitor according to the second modified example shown in FIG. 23.

Hereinafter, a configuration of an electronic device according to a modified example (hereinafter, a second modified example) of the third embodiment will be described with reference to FIG. 23 and FIG. 24. FIG. 23 is a cross-sectional view in which the electronic device according to the second modified example is cut at a position corresponding to the line A1-A1 of FIG. 1. FIG. 24 is a partially enlarged cross-sectional view showing a configuration of a capacitor DC3b according to the second modified example.

As shown in FIG. 23 and FIG. 24, in the second modified example, similarly to the above-described third embodiment, a noise filter FIL3b is connected between the semiconductor chip CPH and the power supply (input power supply) provided outside the semiconductor device PKG. The noise filter FIL3b includes the capacitor DC3b. The capacitor DC3b includes an electrode (eighth conductor member) CE3d, an electrode (seventh conductor member) CE3e disposed to face the electrode CE3d, and an electrode (sixth conductor member) CE3f disposed to face the electrode CE3e. Also, the capacitor DC3b further includes an electrode (fifth conductor member) CE3g disposed to face the electrode CE3f, an electrode (first conductor member) CE3h disposed to face the electrode CE3g, and the electrode CD disposed to face the electrode CE3h. In addition, an insulating material (dielectric) DE3d is disposed between the electrode CE3d and the electrode CE3e, an insulating material (dielectric) DE3e is disposed between the electrode CE3e and the electrode CE3f, an insulating material (dielectric) DE3f is disposed between the electrode CE3f and the electrode CE3g, and an insulating material (dielectric) DE3g is disposed between the electrode CE3g and the electrode CE3h. Moreover, an insulating material (dielectric) DE3h and the insulating layer IL2 are disposed between the electrode CE3h and the electrode CD.

A material that composes the insulating materials DE3d, DE3e, DE3f, DE3g and DE3h may be the same as the material that composes the insulating layer IL2 of the wiring board PB1; however, it is preferably a material having a higher relative dielectric constant than the material that composes the insulating layer IL1 of the wiring board PB1. In a case where the insulating layer IL2 is made of epoxy-based resin, a relative dielectric constant of the epoxy-based resin is approximately 4.4. Therefore, it is preferable that the material that composes the insulating materials DE3d, DE3e, DE3f, DE3g, and DE3h is, for example, urethane-based resin whose relative dielectric constant is approximately 7. In a case where the insulating material DE3h is not provided, air is present between the main surface PB1a of the wiring board PB1 and the back surface MRb of the sealing body MR of the semiconductor device PKG, but since air is also a kind of the insulating material, it can be regarded that an air layer is present in place of the insulating material DE3h.

The electrodes CE3d, CE3e, CE3f, CE3g and CE3h and the insulating materials DE3d, DE3e, DE3f and DE3g are disposed inside the sealing body MR of the semiconductor device PKG. Note that the electrodes CE3d, CE3e, CE3f, CE3g and CE3h and the insulating materials DE3d, DE3e, DE3f and DE3g may have portions which protrude to the outside of the sealing body MR of the semiconductor device PKG.

The electrode CE3d is connected to the metal plate MP1 with the adhesive layer BD8 interposed therebetween. The potential (power supply potential) VIN is supplied to the electrodes CE3f and CE3h through the terminal TM1 and the like of the wiring board PB1. The ground potential GND is supplied to the electrodes CE3e and CE3g and the electrode CD through the terminal TM4 and the like of the wiring board PB1.

Though not shown, the electrodes CE3c and CE3e are connected to the metal plate MP1 with the adhesive layer BD8 interposed therebetween. The electrodes CE3d and CE3f are connected to the lead LD4 with a metal plate (not shown) interposed therebetween.

As a method for forming the electrodes CE3d, CE3e, CE3f, CE3g and CE3h and the insulating materials DE3d, DE3e, DE3f, DE3g and DE3h, the in-mold insert molding is preferable. Namely, as mentioned above, in this forming method, a flexible substrate having the electrodes CE3d, CE3e, CE3f, CE3g and CE3h and the insulating materials DE3d, DE3e, DE3f and DE3g is temporarily put in a molding die before the molding step and then the flexible substrate is sealed together with other members by the sealing body MR in the molding step. In this case, after the molding step, the electrode CE3d and the metal plate MP1 are electrically connected to each other by forming an opening (not shown) by laser or the like in a portion where the electrode CE3d and the metal plate MP1 are connected to each other and filling this opening with a conductor.

Here, a capacitance of the capacitor DC3b will be described. The description will be given by taking a case where the electrode CE3h is exposed from the back surface MRb of the sealing body MR and the insulating material DE3h and the insulating layer IL2 are present between the electrode CE3h and the electrode CD as an example.

It is assumed that an area of a portion where the electrode CE3d and the electrode CE3e overlap each other, an area of a portion where the electrode CE3e and the electrode CE3f overlap each other, an area of a portion where the electrode CE3f and the electrode CE3g overlap each other, an area of a portion where the electrode CE3g and the electrode CE3h overlap each other and an area of a portion where the electrode CE3h and the electrode CD overlap each other are respectively 85 mm$^2$ in plan view. Further, it is assumed that a distance between the main surface PB1a of the wiring board PB1 and the back surface MRb of the sealing body MR of the semiconductor device PKG, that is, a thickness of the insulating material DE3h is 80 μm. Also, it is assumed that thicknesses of the insulating materials DE3d, DE3e, DE3f and DE3g are respectively 30 μm. Moreover, it is assumed that thicknesses of the electrodes CE3d, CE3e, CE3f, CE3g and CE3h are respectively 15 μm. In addition, it is assumed that the thickness of the electrode CD is 50 μm and the thickness of the insulating layer IL2 present on the electrode CD is 20 μm in the wiring board PB1. Moreover, it is assumed that a relative dielectric constant of the insulating material DE3h is 7 and relative dielectric constants of the insulating layer IL2 and the insulating materials DE3d, DE3e, DE3f and DE3g are respectively 4.4. In this case, the capacitance C of the capacitor DC3a is 489 pF.

This is a difference between the noise filter FIL3b according to the second modified example and the noise filter FIL3a according to the above-described third embodiment. Other configurations of the noise filter FIL3b according to the second modified example are similar to those of the noise filter FIL3a according to the above-described third embodiment, and the repetitive description thereof will be omitted.

As mentioned above, in order to reduce the cut-off frequency as much as possible, it is necessary to increase the capacitance of the capacitor that composes the noise filter. Therefore, in the second modified example, the electrodes CE3d, CE3e, CE3f, CE3g and CE3h are disposed in the semiconductor device PKG, and the capacitor DC3b is composed of the multilayered electrode. In this way, an effective area of the electrode that composes the capacitor DC3b can be made larger than that in the above-described third embodiment, so that the capacitance of the capacitor DC3b can be increased.

As described above, in the second modified example, similarly to the third embodiment, the capacitance of the capacitor that composes the noise filter can be increased without increasing the size of the semiconductor device PKG or separately disposing the decoupling capacitor. The second modified example is more advantageous than the above-described first embodiment in this point. Further, the second modified example is more advantageous than the above-described third embodiment in that the capacitance of the capacitor that composes the noise filter can be increased.

Meanwhile, for example, in the above-described first embodiment, the configuration of the capacitor DC1 in the semiconductor device PKG is simpler and the manufacturing cost can be reduced in comparison with the second modified example. The above-described first embodiment is more advantageous than the second modified example in this point.

Fourth Embodiment

Figure 25:
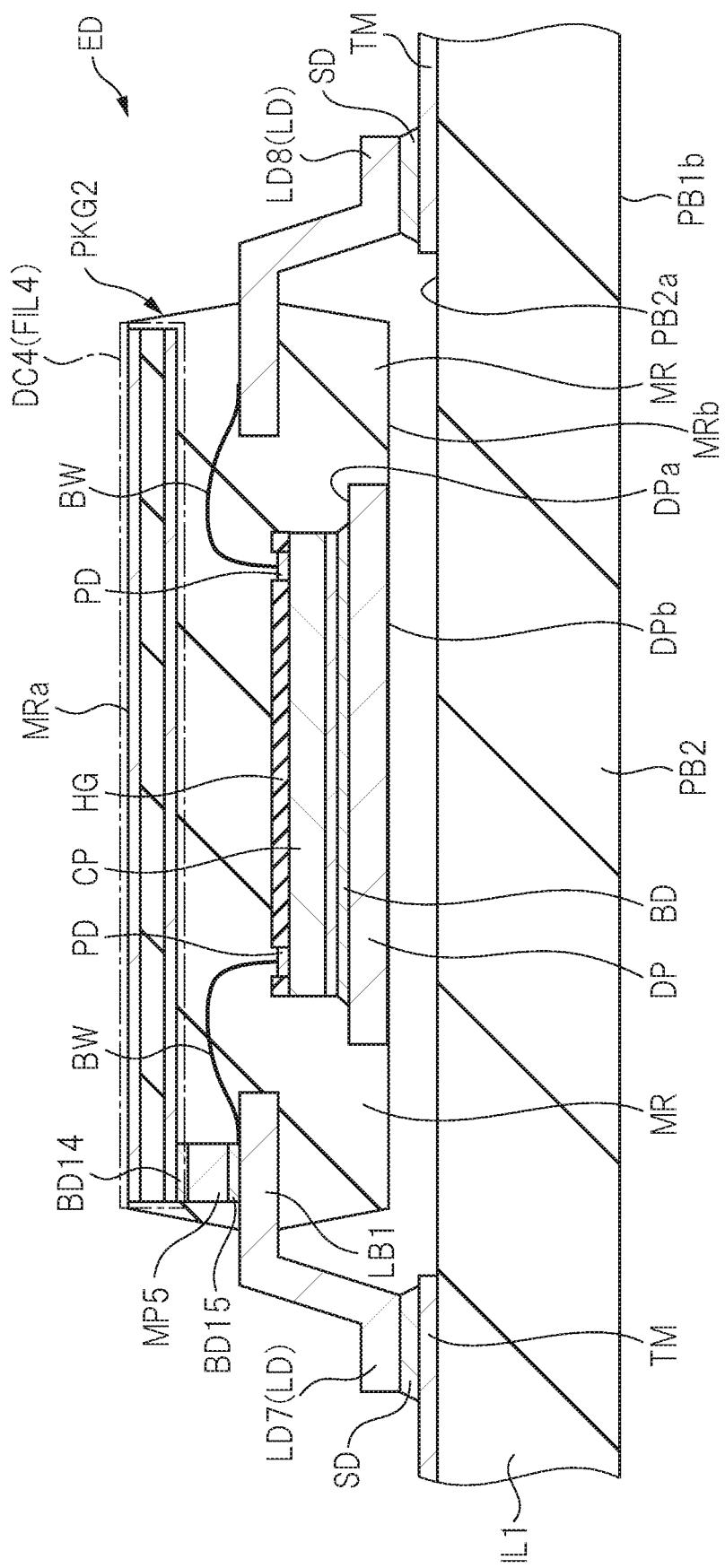
FIG. 25 is a cross-sectional view in which an electronic device according to a fourth embodiment is cut at a position corresponding to the line A1-A1 of FIG. 1.
Figure 26:
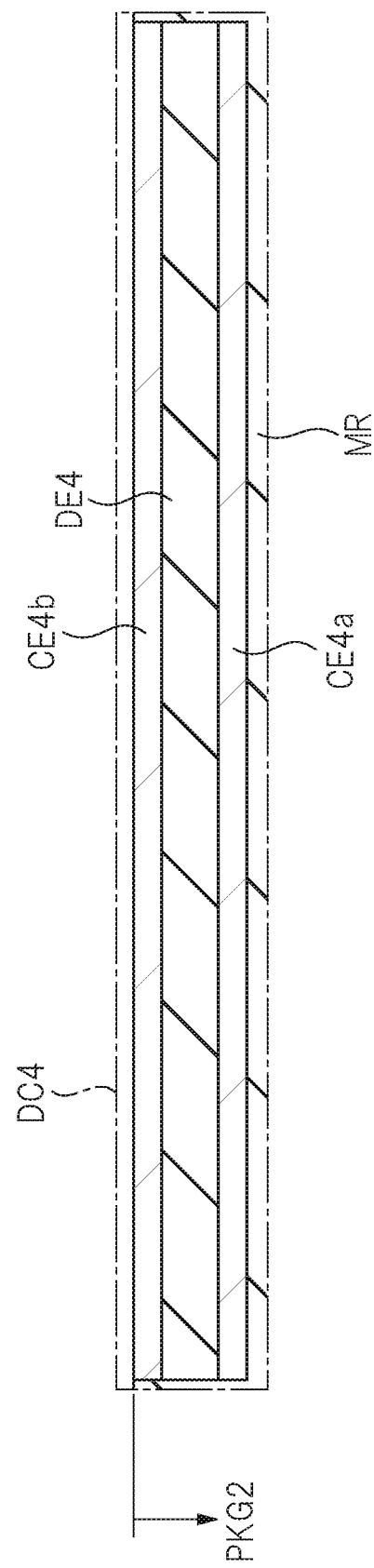
FIG. 26 is an enlarged cross-sectional view of a principal part of a capacitor according to the fourth embodiment shown in FIG. 25.

Hereinafter, a configuration of an electronic device according to a fourth embodiment will be described with reference to FIG. 25 and FIG. 26. FIG. 25 is a cross-sectional view in which the electronic device according to the fourth embodiment is cut at a position corresponding to the line A1-A1 of FIG. 1. FIG. 26 is a partially enlarged cross-sectional view showing a configuration of a capacitor DC4 according to the fourth embodiment.

As shown in FIG. 25, the electronic device according to the fourth embodiment is composed of a wiring board PB2 and a semiconductor device PKG2 mounted on the wiring board PB2.

As shown in FIG. 25, the wiring board PB2 has a main surface (upper surface) PB2a, a back surface PB2b opposite to the main surface PB2a, and a wiring layer disposed between the main surface PB2a and the back surface PB2b. For example, the wiring board PB2 includes an insulating layer IL. Here, it is not necessary that an electrode corresponding to the electrode CD according to the above-described first embodiment is formed in the wiring layer present in the wiring board PB2 according to the fourth embodiment. However, no problem occurs even if a power supply pattern or a ground pattern corresponding to the electrode CD is present.

The semiconductor device PKG2 is mounted on the main surface (upper surface) PB2a of the wiring board PB2 so that the back surface MRb of the sealing body MR faces the main surface PB2a of the wiring board PB2. Further, the plurality of leads LD of the semiconductor device PKG2 are bonded and fixed to the plurality of terminals (electrodes) TM, which are formed on the main surface PB2a of the wiring board PB2, with the conductive bonding material SD such as solder interposed therebetween. Namely, the plurality of leads LD of the semiconductor device PKG2 are electrically connected to the plurality of terminals TM, which are formed on the main surface PB2a of the wiring board PB2, via the conductive bonding material SD.

The semiconductor device PKG2 according to the fourth embodiment includes the die pad (chip mounting portion) DP, the semiconductor chip CP mounted on the main surface of the die pad DP, a capacitor DC4, the plurality of wires (bonding wires) BW, the plurality of leads LD, and the sealing body MR that seals these. Moreover, though not shown, a semiconductor chip and a die pad that mounts the semiconductor chip thereon may be provided other than the semiconductor chip CP and the die pad DP, and the number of semiconductor chips and the number of die pads are not limited.

The die pad DP is a chip mounting portion that mounts the semiconductor chip CP thereon. For example, a plane shape of the die pad DP is rectangular. The die pad DP is composed of a conductor, and is preferably made of a metal material such as copper (Cu) and a copper alloy.

The die pad DP has a main surface DPa on which the semiconductor chip CP is mounted and a back surface DPb opposite thereto. Note that, in the semiconductor device PKG2, the back surface DPb of the die pad DP is exposed from the back surface MRb of the sealing body MR. Namely, the main surface DPa of the die pad DP is disposed so as to be directed to the main surface MRa of the sealing body MR.

The semiconductor chip CP has a front surface (front surface of the semiconductor chip) and a back surface (back surface of the semiconductor chip), which are main surfaces located opposite to each other. Namely, the semiconductor chip CP has the front surface (front surface of the semiconductor chip) that is one main surface and the back surface (back surface of the semiconductor chip) that is the other main surface opposite thereto.

In the semiconductor chip CP, an uppermost layer protective film HG is composed of an insulating film, and is formed on an uppermost layer (outermost layer) of the semiconductor chip. In the semiconductor chip CP, the uppermost layer protective film HG has an opening that exposes the pad (bonding pad) PD, and the pad PD is exposed from the opening of the uppermost layer protective film HG. The pad PD of the semiconductor chip CP is electrically connected to the plurality of leads LD (for example, leads LD7 and LD8 shown in FIG. 25) of the semiconductor device PKG through the respective wires BW.

On the main surface DPa of the die pad DP, the semiconductor chip CP is mounted in a state of directing the back surface thereof to the die pad DP. The semiconductor chip CP is mounted on the main surface DPa of the die pad DP with an adhesive layer BD interposed therebetween, and this adhesive layer BD may be conductive or insulative.

In the fourth embodiment, the main surface DPa of the die pad DP is disposed so as to be directed to the main surface MRa of the sealing body MR. Therefore, the front surface of the semiconductor chip CPC is disposed so as to be directed to the main surface MRa of the sealing body MR. As described above, unlike the semiconductor devices PKG according to the above-described first to third embodiments, the semiconductor device PKG2 according to the fourth embodiment is a package with a general structure instead of the reverse bending structure.

Though not shown, in the fourth embodiment, a noise filter FIL4 is connected between the semiconductor chip CP and the power supply (input power supply) provided outside the semiconductor device PKG2. The noise filter FIL4 includes the capacitor DC4. As shown in FIG. 25 and FIG. 26, the capacitor DC4 includes an electrode (first conductor member) CE4a and an electrode (ninth conductor member) CE4b disposed to face the electrode CE4a. Further, an insulating material (dielectric) DE4 is disposed between the electrode CE4a and the electrode CE4b.

In plan view, an area of each of the electrodes CE4a and CE4b is larger than an area of any of the leads LD, and is preferably larger than an area of the semiconductor chip CP, more preferably, is equal to or larger than an area of the sealing body MR.

It is preferable that the insulating material DE is composed of the same epoxy-based resin as that of the insulating layer IL of the wiring board PB2. In a case where the insulating material DE is made of epoxy-based resin, a relative dielectric constant of the epoxy-based resin is approximately 4.4.

The electrodes CE4a and CE4b and the insulating material DE are disposed inside the sealing body MR of the semiconductor device PKG. Note that the electrodes CE4a and CE4b and the insulating material DE may have portions which protrude to the outside of the sealing body MR of the semiconductor device PKG.

The electrode CE4a is connected to a metal plate MP5 with an adhesive layer BD14 interposed therebetween, and the metal plate MP5 is connected to the lead LD7 with an adhesive layer BD15 interposed therebetween. The potential (power supply potential) VIN is supplied to the electrode CE4a through the terminal TM of the wiring board PB1, the lead LD7, the metal plate MP5 and the like of the semiconductor device PKG. The ground potential GND is supplied to the electrode CE4b through a terminal (not shown) and the like of the wiring board PB1.

As a method for forming the electrodes CE4a and CE4b and the insulating material DE, as mentioned above, the in-mold insert molding in which a flexible substrate having the electrodes CE4a and CE4b and the insulating material DE is temporarily put in a molding die before the molding step and then the flexible substrate is sealed together with other members by the sealing body MR in the molding step is preferable. In this case, after the molding step, the electrode CE4a and the metal plate MP5 are electrically connected to each other by forming an opening (not shown) by laser or the like in a portion where the electrode CE4a and the metal plate MP5 are connected to each other and filling this opening with a conductor.

Here, a capacitance of the capacitor DC4 will be described. The description will be given by taking a case where the insulating material DE is present between the electrode CE4a and the electrode CE4b as an example.

It is assumed that an area of a portion where the electrode CE4a and the electrode CE4b overlap each other is 85 mm$^2$ in plan view. Further, it is assumed that a distance between the electrode CE4a and the electrode CE4b, that is, the thickness of the insulating material DE is 100 µm. Moreover, it is assumed that thicknesses of the electrodes CE4a and CE4b are respectively 50 µm. In addition, it is assumed that the relative dielectric constant of the insulating material DE is 4.4. In this case, the capacitance C of the capacitor DC4 is 33 pF.

This is a difference between the noise filter FIL4 according to the fourth embodiment and the noise filters FIL1 to FIL3 according to the above-described first to third embodiments. Other configurations of the noise filter FIL4 according to the fourth embodiment are similar to those of the noise filters FIL1 to FIL3 according to the above-described first to third embodiments, and the repetitive description thereof will be omitted.

In the fourth embodiment, the connection distance between the main circuit and one electrode that composes the capacitor is reduced by disposing a pair of the electrodes CE4a and CE4b which face each other and compose the capacitor DC4 in the sealing body MR of the semiconductor device PKG2 and connecting this electrode CE4a to the lead LD7 with the metal plate MP5 interposed therebetween, so that the parasitic resistance and the parasitic inductance of the capacitor can be reduced in comparison with, for example, the above-described third examination example.

Moreover, in the fourth embodiment, the capacitor DC4 can be disposed in an empty space, in which no member other than the sealing body MR is present, near the main surface MRa of the sealing body MR of the semiconductor device PKG2. Particularly, in the fourth embodiment, by providing the electrodes CE4a and CE4b separately from the leads LD and the like, an area of each of the electrodes CE4a and CE4b can be made larger than an area of the leads LD and the like, more preferably, made equal to or larger than the area of the sealing body MR in plan view. In this way, the area of each of the electrodes which compose the capacitor DC4 can be ensured without increasing the sizes of the semiconductor chip CP and the semiconductor device PKG2. As a result, the capacitance of the capacitor DC4 can be ensured, and the cut-off frequency of the noise filter including the capacitor DC4 can be increased as much as possible.

Moreover, in the fourth embodiment, it is not necessary to provide the electrode equivalent to the electrode CD according to each of the above-described first to third embodiments in the wiring board PB2, and accordingly, not only the size of the wiring board is not increased, but also the wiring board is not limited. As a result, it is possible to prevent the increase of the designing cost and the manufacturing cost of the wiring board in comparison with the above-described first to third embodiments.

Meanwhile, for example, in the above-described first embodiment, the configuration of the capacitor DC1 in the semiconductor device PKG is simpler and the manufacturing cost can be reduced in comparison with the fourth embodiment. The above-described first embodiment is more advantageous than the fourth embodiment in this point.

Moreover, for example, in the above-described first embodiment, the electrode CE1 that composes the capacitor DC1 is connected to the drain pad PDHD of the semiconductor chip CPH with only the metal plate MP1 interposed therebetween, the metal plate MP1 having a wider wiring width than the lead LD1 and the lead coupling portion LB1. Meanwhile, in the fourth embodiment, the electrode CE4a that composes the capacitor DC4 is connected to the pad PD of the semiconductor chip CP with the metal plate MP5, the lead LD7 and the wire BW interposed therebetween. Therefore, the above-described first embodiment is more advantageous than the fourth embodiment from a viewpoint of reducing the parasitic resistance and the parasitic inductance.

Note that, even in the case of the package with a general structure in the fourth embodiment, if the metal plate MP1 and the like having a wider wiring width than the wire BW are adopted as in the above-described first embodiment, the parasitic resistance and the parasitic inductance can be reduced even in the capacitor DC4 in the fourth embodiment.

Moreover, a case where the semiconductor device PKG2 is a package with a general structure instead of a reverse bending structure has been described as an example in the fourth embodiment; however, the fourth embodiment is limited to this, and can be applied also to the package with the reverse bending structure as in the above-described first to third embodiments.

Fifth Embodiment

Figure 27:
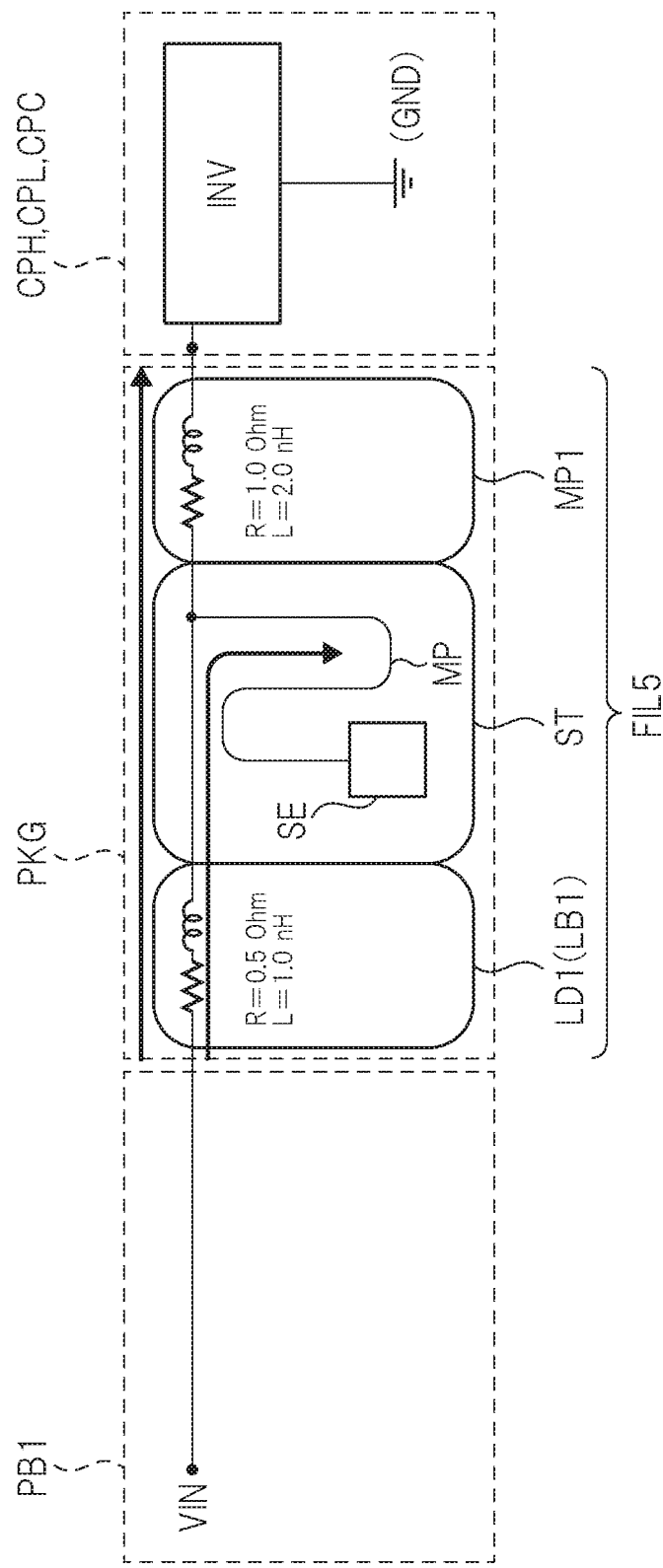
FIG. 27 is a circuit diagram showing a noise filter included in an electronic device according to a fifth embodiment.

Hereinafter, a configuration of an electronic device according to a fifth embodiment will be described with reference to FIG. 27. FIG. 27 is a circuit diagram showing a noise filter according to the fifth embodiment.

As shown in FIG. 27, the noise filter according to the fifth embodiment is composed of a noise filter FIL5 connected between the semiconductor chip CPH and the power supply (input power supply) provided outside the semiconductor device PKG.

The noise filter FIL5 includes the lead LD1 and the lead coupling portion LB1 (see FIG. 2), an open stub (tenth conductor member) ST connected to the lead coupling portion LB1, and the metal plate MP1 connected to the lead coupling portion LB1. Though not shown, the open stub ST is connected to the metal plate MP1 with an adhesive layer interposed therebetween. The open stub ST is disposed inside the sealing body MR of the semiconductor device PKG (preferably, near the back surface MRb of the sealing body MR).

The open stub ST is composed of a meander wiring MP and a terminating resistor SE. The meander wiring MP is a zigzag wiring formed by being folded a plurality of times. The terminating resistor SE is connected only to the lead coupling portion LB1 through the meander wiring MP, and is not electrically connected to any member and wiring which are present in the semiconductor device PKG and the wiring board PB1 (see FIG. 2). Note that, though not shown, it is not necessary that an electrode corresponding to the electrode CD according to the above-described first embodiment is formed in the wiring layer present in the wiring board according to the fifth embodiment. However, no problem occurs even if a power supply pattern or a ground pattern corresponding to the electrode CD is present.

This is a difference between the noise filter FIL5 according to the fifth embodiment and the noise filters FIL1 to FIL4 according to the above-described first to fourth embodiments. Other configurations of the noise filter FIL5 according to the fifth embodiment are similar to those of the noise filters FIL1 to FIL4 according to the above-described first to fourth embodiments, and the repetitive description thereof will be omitted.

For example, the open stub refers to a distributed constant line which is connected in parallel to a transmission line in a high-frequency circuit and whose tip end is open. Namely, a signal that has traveled from the transmission line to the open stub reflects on a terminal end portion of the open stub, and attempts to return to the transmission line from which the signal has traveled. For example, if a length of the wiring of the open stub is set to a length equivalent to $\lambda/4$ of an electromagnetic wave desired to be removed, since a round trip to the terminal end portion of the open stub becomes a length equivalent to $\lambda/2$ when an incident wave reflects on the terminal end portion of the open stub and returns, a phase difference between the incident wave and a reflected wave becomes $\pi(180°)$, so that the incident wave and the reflected wave are completely canceled with each other. As described above, the open stub acts as a noise filter by appropriately adjusting the length of the wiring of the open stub.

Here, as mentioned above, with regard to the wavelength of the electromagnetic wave of 6 GHz, $\lambda/2$ is 12.5 mm and $\lambda/4$ is 6.25 mm. Therefore, by setting the length of the meander wiring MP included in the open stub ST to, for example, 6.25 mm, the open stub ST can be used as a $\lambda/4$ stub resonator for 6 GHz.

From the above, in the fifth embodiment, similarly to the noise filters according to the above-described first to fourth embodiments, the unnecessary electromagnetic wave noise that occurs inside the electronic device and the external noise that propagates from the outside and enters the inside of the electronic device can be suppressed. Particularly, since the open stub ST is disposed inside the sealing body MR of the semiconductor device PKG, the open stub ST is spatially shielded from the die pads DPC, DPH and DPL of the semiconductor device PKG by the power supply pattern or the ground pattern (not shown) of the wiring board PB1. Therefore, only the noise exchanged between the semiconductor chip CPH and the power supply (input power supply) provided outside the semiconductor device PKG can be surely attenuated.

Note that the open stub according to the fifth embodiment and the capacitor according to each of the above-described first to fourth embodiments can be used in combination with each other. Moreover, in place of the meander wiring MP, a linear wiring having the same length may be formed.

Moreover, as a modified example of the fifth embodiment, though not shown, a conductor pattern (eleventh conductor member, conductor plane) having a length of 12.5 mm can be installed inside the semiconductor device PKG in a state of not being electrically connected to any member and wiring which are present in the semiconductor device PKG and the wiring board PB1 (see FIG. 2). This conductor pattern acts as a $\lambda/2$ stub resonator for 6 GHz.

In the foregoing, the invention made by the inventor of the present invention has been concretely described based on the embodiments. However, it is needless to say that the present invention is not limited to the foregoing embodiments and various modifications can be made within the scope of the present invention.

In addition, those corresponding to the contents described in the embodiments and a part thereof will be described below.

[Appendix 1]

An electronic device including:

a wiring board having a first main surface; and a semiconductor device mounted on the first main surface of the wiring board, wherein the wiring board has a first wiring layer in which a conductor pattern that supplies a ground potential or a power supply potential is formed, the semiconductor device includes:

a first semiconductor chip having a second main surface on which a plurality of pads are formed and a second back surface opposite to the second main surface;

a first chip mounting portion having a third main surface on which the first semiconductor chip is mounted and a third back surface opposite to the third main surface, the third main surface facing the second back surface of the first semiconductor chip;

a plurality of leads electrically connected to the plurality of pads through a plurality of conductive connection members; and a sealing body configured to seal the first semiconductor chip, at least a part of the first chip mounting portion, the plurality of conductive connection members and a part of the plurality of leads, the sealing body having a fourth main surface and a fourth back surface opposite to the fourth main surface, the third back surface of the first chip mounting portion is directed to the fourth main surface of the sealing body, the fourth back surface of the sealing body faces the first main surface of the wiring board, a tenth conductor member is formed on a side of the fourth back surface of the sealing body, the tenth conductor member is bonded to a first conductive connection member among the plurality of conductive connection members, the first conductive connection member connecting a first pad among the plurality of pads and a first lead among the plurality of leads to each other, the tenth conductor member composes an open stub circuit, and a length of the tenth conductor member is one-fourth of a first wavelength at a first frequency.

[Appendix 2]

An electronic device including:

a wiring board having a first main surface; and one or more components including a semiconductor device mounted on the first main surface of the wiring board, wherein the wiring board has a first wiring layer in which a conductor pattern that supplies a ground potential or a power supply potential is formed, the semiconductor device includes:
- a first semiconductor chip having a second main surface on which a plurality of pads are formed and a second back surface opposite to the second main surface;
- a first chip mounting portion having a third main surface on which the first semiconductor chip is mounted and a third back surface opposite to the third main surface, the third main surface facing the second back surface of the first semiconductor chip;
- a plurality of leads electrically connected to the plurality of pads through a plurality of conductive connection members; and
- a sealing body configured to seal the first semiconductor chip, at least a part of the first chip mounting portion, the plurality of conductive connection members and a part of the plurality of leads, the sealing body having a fourth main surface and a fourth back surface opposite to the fourth main surface, the third back surface of the first chip mounting portion is directed to the fourth main surface of the sealing body, the fourth back surface of the sealing body faces the first main surface of the wiring board, an eleventh conductor member is formed on a side of the fourth back surface of the sealing body, the eleventh conductor member is not electrically connected to any of the one or more components, the eleventh conductor member composes an open stub circuit, and a length of the eleventh conductor member is half of a first wavelength at a first frequency.

What is claimed is:

1. An electronic device comprising:

a wiring board having a first main surface; and a semiconductor device mounted on the first main surface of the wiring board, wherein the wiring board has a first wiring layer in which a conductor pattern is formed, a plurality of terminals are disposed on the first main surface of the wiring board, the semiconductor device includes:
- a first semiconductor chip having a second main surface on which a plurality of pads are formed and a second back surface opposite to the second main surface;
- a first chip mounting portion having a third main surface on which the first semiconductor chip is mounted and a third back surface opposite to the third main surface, the third main surface facing the second back surface of the first semiconductor chip;
- a plurality of leads electrically connected to the plurality of pads through a plurality of conductive connection members; and
- a sealing body configured to seal the first semiconductor chip, at least a part of the first chip mounting portion, the plurality of conductive connection members and a part of the plurality of leads, the sealing body having a fourth main surface and a fourth back surface opposite to the fourth main surface, the third back surface of the first chip mounting portion is directed to the fourth main surface of the sealing body, the fourth back surface of the sealing body faces the first main surface of the wiring board, a first conductor member is formed in the sealing body, the plurality of leads are electrically connected to the plurality of terminals of the wiring board, a first conductive connection member among the plurality of conductive connection members connects a first pad among the plurality of pads and a first lead among the plurality of leads to each other, the first conductor member is bonded to the first conductive connection member, a distance between the first conductor member and the conductor pattern is shorter than a distance between the first conductive connection member and the conductor pattern, the first conductor member and the conductor pattern overlap each other in plan view, a potential supplied to the first conductor member and a potential supplied to the conductor pattern are different from each other, and a first capacitor is composed of the first conductor member and the conductor pattern.

2. The electronic device according to claim 1, wherein a first insulating material is formed between the fourth back surface of the sealing body and the first main surface of the wiring board, and a relative dielectric constant of a material that composes the first insulating material is larger than a relative dielectric constant of a material that composes the sealing body.

3. The electronic device according to claim 1, wherein the first conductive connection member is made of a metal plate wider than any of the plurality of leads.

4. The electronic device according to claim 1, wherein a fifth conductor member that faces the first conductor member with a second insulating material interposed therebetween and a sixth conductor member that faces the fifth conductor member with a third insulating material interposed therebetween are further formed on a side of the fourth back surface in the sealing body, a potential supplied to the fifth conductor member is the same as a potential supplied to the conductor pattern, a potential supplied to the sixth conductor member is the same as a potential supplied to the first conductor member, and a fifth capacitor is composed of the first conductor member, the fifth conductor member, the sixth conductor member and the conductor pattern.

5. The electronic device according to claim 4, wherein a seventh conductor member that faces the sixth conductor member with a fourth insulating material interposed therebetween and an eighth conductor member that faces the seventh conductor member with a fifth insulating material interposed therebetween are further formed on a side of the fourth back surface in the sealing body, a potential supplied to the seventh conductor member is the same as a potential supplied to the conductor pattern, a potential supplied to the eighth conductor member is the same as a potential supplied to the first conductor member, and a sixth capacitor is composed of the first conductor member, the fifth conductor member, the sixth conductor member, the seventh conductor member, the eighth conductor member and the conductor pattern.

6. The electronic device according to claim 1, wherein an area of the first conductor member is larger than an area of the first conductive connection member in plan view.

7. The electronic device according to claim 6, wherein an area of the conductor pattern is larger than an area of the first conductor member in plan view, and the conductor pattern includes the first conductor member.

8. The electronic device according to claim 1, wherein a power supply potential is supplied to a first terminal among the plurality of terminals of the wiring board, a reference potential lower than the power supply potential is supplied to a second terminal among the plurality of terminals of the wiring board, the first lead of the semiconductor device is electrically connected to the first terminal of the wiring board, and the conductor pattern is electrically connected to the second terminal of the wiring board.

9. The electronic device according to claim 8, wherein the first terminal, the first lead, the first conductive connection member and the first capacitor compose a noise filter circuit.

10. The electronic device according to claim 8, wherein the first semiconductor chip includes a first field effect transistor for a high-side switch, the first pad is a first drain electrode electrically connected to a first drain of the first field effect transistor, the first semiconductor chip further includes a first source electrode formed on the second back surface and electrically connected to a first source of the first field effect transistor, the semiconductor device includes:
- a second semiconductor chip including a second field effect transistor for a low-side switch and having a fifth main surface and a fifth back surface opposite to the fifth main surface,
- the second semiconductor chip further including a second drain electrode formed on the fifth main surface and electrically connected to a second drain of the second field effect transistor and a second source electrode formed on the fifth back surface and electrically connected to a second source of the second field effect transistor;
- a third semiconductor chip including a circuit that controls the first semiconductor chip and the second semiconductor chip and having a sixth main surface and a sixth back surface opposite to the sixth main surface;
- a second chip mounting portion having a seventh main surface on which the second semiconductor chip is mounted and a seventh back surface opposite to the seventh main surface, the seventh main surface facing the fifth back surface of the second semiconductor chip;
- a third chip mounting portion having an eighth main surface on which the third semiconductor chip is mounted and an eighth back surface opposite to the eighth main surface, the eighth main surface facing the sixth back surface of the third semiconductor chip;
- a second lead electrically connected to the first source electrode of the first semiconductor chip;
- a third lead electrically connected to the second drain electrode of the second semiconductor chip through the second conductive connection member; and
- a fourth lead electrically connected to the second source electrode of the second semiconductor chip, the sealing body further seals the second semiconductor chip, the third semiconductor chip, at least apart of the second chip mounting portion, at least a part of the third chip mounting portion, a part of the second lead, a part of the third lead, and a part of the fourth lead, the seventh back surface of the second chip mounting portion is directed to the fourth main surface of the sealing body, and the eighth back surface of the third chip mounting portion is directed to the fourth main surface of the sealing body.

11. The electronic device according to claim 10, wherein the first semiconductor chip, the semiconductor chip and the third second are used for forming an inverter circuit.

12. The electronic device according to claim 10, wherein a decoupling capacitor is connected between the first terminal and the second terminal.

13. The electronic device according to claim 10, wherein the sealing body has a first side extending along a first direction and a second side extending along the first direction and located opposite to the first side in plan view, a second conductor member, a third conductor member and a fourth conductor member are further formed on a side of the fourth back surface in the sealing body, the first conductor member, the second conductor member, the third conductor member and the fourth conductor member do not overlap one another, and are arrayed along the first direction in plan view, potentials supplied to the second conductor member, the third conductor member and the fourth conductor member and a potential supplied to the conductor pattern are different from each other, the second capacitor is composed of the second conductor member and the conductor pattern, a third capacitor is composed of the third conductor member and the conductor pattern, and a fourth capacitor is composed of the fourth conductor member and the conductor pattern.

14. The electronic device according to claim 13, wherein the third semiconductor chip is disposed between the first side and the second side and between the first semiconductor chip and the semiconductor chip in plan view, and the first semiconductor chip, the third semiconductor chip and the second semiconductor chip are arrayed along the first direction in plan view.

15. The electronic device according to claim 14, wherein the fourth conductor member is bonded to the second conductive connection member, and a distance between the fourth conductor member and the conductor pattern is shorter than a distance between the second conductive connection member and the conductor pattern.

16. The electronic device according to claim 15, wherein the second conductive connection member is made of a metal plate wider than any of the plurality of leads.

* * * * *